(12) United States Patent
Song et al.

(10) Patent No.: US 9,966,551 B2
(45) Date of Patent: *May 8, 2018

(54) WHITE ORGANIC LIGHT EMITTING DEVICE

(71) Applicant: LG Display Co., Ltd., Seoul (KR)

(72) Inventors: Ki-Woog Song, Goyang-si (KR); Sung Hoon Pieh, Seoul (KR); Youn Seok Kam, Seoul (KR); Tae Shick Kim, Yongin-si (KR); Se Ung Kim, Seoul (KR); Hyung June Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/601,912

(22) Filed: May 22, 2017

(65) Prior Publication Data

US 2017/0263877 A1    Sep. 14, 2017

Related U.S. Application Data

(63) Continuation of application No. 14/673,057, filed on Mar. 30, 2015, now Pat. No. 9,685,622.

(30) Foreign Application Priority Data

Mar. 31, 2014 (KR) .......................... 10-2014-0037728
May 12, 2014 (KR) .......................... 10-2014-0056607

(Continued)

(51) Int. Cl.
*H01L 51/50*    (2006.01)
*H01L 51/52*    (2006.01)

(52) U.S. Cl.
CPC ........ H01L 51/504 (2013.01); H01L 51/5044 (2013.01); *H01L 51/5265* (2013.01)

(58) Field of Classification Search
CPC .............. H01L 27/3209; H01L 51/504; H01L 51/5044; H01L 27/3206; H01L 51/5012; H01L 51/5036; H01L 27/3204
See application file for complete search history.

(56) References Cited

U.S. PATENT DOCUMENTS 5,707,745 A * 1/1998 Forrest ................... C09K 11/06
                                                            257/440
6,337,492 B1 * 1/2002 Jones ................. H01L 27/3204
                                                            257/40
(Continued)

FOREIGN PATENT DOCUMENTS

CN        102034934 A     4/2011
CN        102163694 A     8/2011
(Continued)

*Primary Examiner* — Jaehwan Oh
(74) *Attorney, Agent, or Firm* — Birch, Stewart, Kolasch & Birch, LLP

(57) ABSTRACT

Discussed is a white organic light emitting device for enhancing emission efficiency and panel efficiency. The white organic light emitting device can include a first emission part between a first electrode and a second electrode and configured to include a first emission layer (EML), a second emission part on the first emission part and configured to include a second EML, and a third emission part on the second emission part and configured to include a third EML. The first to third emission parts have an emission position of emitting layers (EPEL) structure in which the first to third emission parts have a maximum emission range in respective emission areas of the first to third EMLs.

25 Claims, 41 Drawing Sheets

(30) Foreign Application Priority Data

Jul. 2, 2014 (KR) ........................ 10-2014-0082617
Mar. 4, 2015 (KR) ........................ 10-2015-0030633

(56) References Cited

U.S. PATENT DOCUMENTS

| | | | | |
|---|---|---|---|---|
| 8,952,362 | B2* | 2/2015 | Forrest | H01L 51/5012 257/144 |
| 9,287,519 | B2* | 3/2016 | Jaeger | H01L 51/0078 |
| 2006/0188745 | A1* | 8/2006 | Liao | H01L 51/5278 428/690 |
| 2006/0232194 | A1* | 10/2006 | Tung | C09K 11/06 313/504 |
| 2008/0284317 | A1* | 11/2008 | Liao | H01L 51/5036 313/504 |
| 2009/0146552 | A1* | 6/2009 | Spindler | H01L 51/5036 313/504 |
| 2011/0073844 | A1* | 3/2011 | Pieh | H01L 51/5036 257/40 |
| 2011/0187261 | A1 | 8/2011 | Fukuda et al. | |
| 2012/0241794 | A1 | 9/2012 | Seo et al. | |
| 2012/0248971 | A1 | 10/2012 | Okuyama | |
| 2012/0292547 | A1 | 11/2012 | Lee et al. | |
| 2012/0292647 | A1* | 11/2012 | Lee | H01L 27/3206 257/89 |
| 2014/0361286 | A1* | 12/2014 | Jaeger | H01L 51/0078 257/40 |
| 2015/0014674 | A1 | 1/2015 | Wehlus et al. | |
| 2015/0200378 | A1* | 7/2015 | Reusch | H01L 51/5278 257/40 |
| 2016/0141538 | A1* | 5/2016 | Lee | H01L 51/5044 257/40 |

FOREIGN PATENT DOCUMENTS

| | | |
|---|---|---|
| CN | 102280594 A | 12/2011 |
| JP | 2007-12369 A | 1/2007 |
| KR | 10-2011-0035048 A | 4/2011 |

\* cited by examiner

WHITE ORGANIC LIGHT EMITTING DEVICE

CROSS-REFERENCE TO RELATED APPLICATIONS

This application is a Continuation of U.S. application Ser. No. 14/673,057 filed Mar. 30, 2015, which claims the priority benefit of the Korean Patent Application Nos. 10-2014-0037728 filed on Mar. 31, 2014, 10-2014-0056607 filed on May 12, 2014, 10-2014-0082617 filed on Jul. 2, 2014, and 10-2015-0030633 filed on Mar. 4, 2015, which are all hereby incorporated by reference as if fully set forth herein.

BACKGROUND OF THE INVENTION

Field of the Invention

The present invention relates to an organic light emitting device, and more particularly, to a white organic light emitting device for enhancing emission efficiency.

Discussion of the Related Art

Recently, as society advances to the information-oriented society, the field of display devices which visually express an electrical information signal is rapidly advancing. Flat panel display (FPD) devices, having excellent performance in terms of thinning, lightening, and low power consumption, have been developed.

Examples of the FPD devices include LCD devices, plasma display panel (PDP) devices, field emission display (FED) devices, organic light emitting display devices, etc.

In particular, the organic light emitting display devices are self-illuminating devices. In comparison with other FPD devices, the organic light emitting display devices have a fast response time, high emission efficiency, high luminance, and a wide viewing angle.

An organic light emitting device includes an organic emission layer which is formed between two electrodes. An electron and a hole are injected from the two electrodes into the organic emission layer, and an exciton is generated by combining the electron with the hole. The organic light emitting device is a device using the principle that light is emitted when the generated exciton is dropped from an excited state to a ground state.

A related art organic light emitting display device includes a blue emission layer formed of a fluorescence material, for realizing white color. However, a quantum efficiency of an emission layer formed of a fluorescence material theoretically is about 25% of a quantum efficiency of an emission layer formed of a phosphorescence material. For this reason, the blue emission layer formed of a fluorescence material cannot show sufficient luminance in comparison with a phosphorescence material.

SUMMARY OF THE INVENTION

In a related art organic light emitting device, emission characteristic and a lifetime are limited due to an emission structure and a material of an organic emission layer. Therefore, various methods for enhancing emission efficiency and a lifetime are proposed.

As one method, there is a method that uses an emission layer as a single layer. The method may manufacture a white organic light emitting device by using a single material or by doping two or more kinds of materials. For example, there is a method where a red dopant and a green dopant are applied to a blue host, or a red dopant, a green dopant, and a blue dopant are added to a host material having high bandgap energy. However, it is incomplete to transfer energy to a dopant, and it is difficult to adjust a balance of white color.

Moreover, a component of a dopant included in a corresponding emission layer is limited due to a characteristic of a dopant itself. Also, mixing of emission layers focuses on realizing white light, and thus, wavelength characteristic having an emission peak value is shown in a wavelength instead of red, green, and blue. Therefore, a color reproduction rate is reduced when a color filter is provided. Also, lifetimes of dopant materials differ, and for this reason, color shift occurs due to continuous use.

In another method, a structure may be provided where white light is emitted by stacking two emission layers having a complementary color relationship. However, in the structure, a difference between a peak wavelength range of each emission layer and a transmissive area of a color filter occurs when white light passes through the color filter. For this reason, a color range capable of expression is narrowed, and consequently, it is difficult to realize a desired color reproduction rate.

For example, when a blue emission layer and a yellow emission layer are stacked, a peak wavelength is provided in a blue wavelength range and a yellow wavelength range, and thus, white light is emitted. When the white light passes through red, green, and blue color filters, a transmittance of the blue wavelength range is lowered compared to a red or green wavelength range, and for this reason, light emission efficiency and a color reproduction rate are lowered.

Moreover, an emission efficiency of a yellow phosphorescence emission layer is relatively higher than that of a blue phosphorescence emission layer, and thus, panel efficiency and a color reproduction rate are reduced due to an efficiency difference between a phosphorescence emission layer and a fluorescence emission layer. Also, a luminance of blue is relatively lower than that of yellow.

In addition to such a structure, in a structure where a blue fluorescence emission layer and a green-red phosphorescence emission layer are stacked, a luminance of blue is relatively lower than that of green-red.

In order to solve the above-described problems, various methods for enhancing emission efficiency have been proposed. However, there is a limitation in adjusting a component or an amount of a dopant included in each of emission layers for improving characteristics of the emission layers.

Moreover, thicknesses of emission layers or the number of the emission layers and thicknesses of organic layers or the number of the organic layers may be adjusted for enhancing emission efficiencies of the emission layers in a desired emission peak. However, when the emission layers or the organic layers are thickly formed, the number of processes increases, and a lifetime is shortened. For this reason, it is difficult to apply an organic light emitting device to an organic light emitting device having a large area.

Therefore, the inventors recognize the above-described problems, and have experimented on various methods where emission layers emit light in a desired emission area irrespective of at least one among the thicknesses or number of emission layers and the thicknesses or number of organic layers, thereby improving emission efficiency.

As described above, two or more emission layers may be provided for realizing desired white color so as to enhance emission efficiency, but in this case, a thickness of a device is thickened, causing an increase in a driving voltage of the device. Also, organic layers configuring an emission part may include a plurality of layers having a movement characteristic of an electron or a hole, but in this case, the thickness of the device is thickened, causing an increase in the driving voltage of the device. Also, since the thicknesses or number of the organic emission layers affect emission efficiency or emission intensity, the inventors have recognized that it is very difficult to set a desired number or thickness. Therefore, the inventors have recognized that it is very difficult to configure a device with an organic layer having a desired characteristic and a desired number or thickness without any increase in a thickness and manufacture a device for realizing desired white color.

Therefore, the inventors propose a structure, where an emission layer is additionally stacked on a structure where a blue emission layer and a yellow-green emission layer are stacked, for an efficiency of the blue emission layer through various experiments. Also, the inventors have invented a bottom emission type white organic light emitting device having a new structure for enhancing panel efficiency and an emission efficiency of an emission layer.

Moreover, the inventors have invented a top emission type white organic light emitting device having a new structure, where panel efficiency and an emission efficiency of an emission layer are enhanced and luminance is enhanced because a polarizer is not used, through various experiments.

Accordingly, the present invention is directed to provide an organic light emitting device that substantially obviates one or more problems due to limitations and disadvantages of the related art.

An aspect of the present invention is directed to provide a bottom emission type white organic light emitting device in which emission layers show maximum efficiency in an emission area by applying an emission position of emission layers (EPEL: Emission Position of Emission layers) structure where an emission position of an emission layer corresponding to an emission area of the emission layer is set, thereby enhancing emission efficiency and panel efficiency.

Another aspect of the present invention is directed to provide a top emission type white organic light emitting device which can enhance emission efficiency, panel efficiency, and luminance by applying an EPEL structure where an emission position is set.

Another aspect of the present invention is directed to provide a white organic light emitting device which has an EPEL structure irrespective of at least one among the specific number of organic layers, the specific thicknesses of the organic layers, the specific number of emission layers, and the specific thicknesses of the emission layers.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a white organic light emitting device including: a first emission part between a first electrode and a second electrode, and configured to include a first emission layer (EML); a second emission part on the first emission part, and configured to include a second EML; and a third emission part on the second emission part, and configured to include a third EML, wherein the first to third emission parts have an emission position of emitting layers (EPEL) structure in which the first to third emission parts have a maximum emission range in respective emission areas of the first to third EMLs.

The white organic light emitting device may be a bottom emission type.

A position of the first electrode may be within a range of 4,500 Å to 6,000 Å from the second electrode.

An emission position of the third EML may be within a range of 200 Å to 800 Å from the second electrode.

An emission position of the second EML may be within a range of 1,800 Å to 2,550 Å from the second electrode.

An emission position of the first EML may be within a range of 2,650 Å to 3,300 Å from the second electrode.

The first EML may be configured with one among a blue emission layer, a blue emission layer and a yellow-green emission layer, a blue emission layer and a red emission layer, and a blue emission layer and a green emission layer, or configured by a combination thereof.

The second EML may be configured with one among a yellow-green emission layer, a yellow emission layer and a red emission layer, a red emission layer and a green emission layer, and a yellow-green emission layer and a red emission layer, or configured by a combination thereof.

The third EML may be configured with one among a blue emission layer, a blue emission layer and a yellow-green emission layer, a blue emission layer and a red emission layer, and a blue emission layer and a green emission layer, or configured by a combination thereof.

An emission area of the first EML may be a range of 440 nm to 650 nm, an emission area of the second EML may be a range of 510 nm to 650 nm, and an emission area of the third EML may be a range of 440 nm to 650 nm.

A maximum emission range of the first EML may be a range of 440 mil to 650 nm, a maximum emission range of the second EML may be a range of 530 nm to 570 nm, and a maximum emission range of the third EML may be a range of 440 nm to 470 nm.

The second EML and the third EML may respectively include emission layers that emit light having the same color.

A position of the first electrode may be within a range of 3,500 Å to 4,500 Å from the second electrode.

An emission position of the third EML may be within a range of 250 Å to 800 Å from the second electrode.

An emission position of the second EML may be within a range of 1,450 Å to 1,950 Å from the second electrode.

An emission position of the first EML may be within a range of 2,050 Å to 2,600 Å from the second electrode.

The first EML may be configured with one among a yellow-green emission layer, a yellow emission layer and a red emission layer, a red emission layer and a green emission layer, and a yellow-green emission layer and a red emission layer, or configured by a combination thereof.

Each of the second EML and the third EML may be configured with one among a blue emission layer, a blue emission layer and a yellow-green emission layer, a blue emission layer and a red emission layer, and a blue emission layer and a green emission layer, or configured by a combination thereof.

An emission area of the first EML may be a range of 510 nm to 650 nm, an emission area of the second EML may be a range of 440 nm to 650 nm, and an emission area of the third EML may be a range of 440 nm to 650 nm.

A maximum emission range of the first EML may be a range of 530 nm to 570 nm, a maximum emission range of the second EML may be a range of 440 nm to 470 nm, and a maximum emission range of the third EML may be a range of 440 nm to 470 nm.

The white organic light emitting device may be a top emission type.

A position of the second electrode may be within a range of 4,700 Å to 5,400 Å from the first electrode.

An emission position of the first EML may be within a range of 150 Å to 700 Å from the first electrode.

An emission position of the second EML may be within a range of 1,600 Å to 2,300 Å from the first electrode.

An emission position of the third EML may be within a range of 2,400 Å to 3,100 Å from the first electrode.

The second EML and the third EML may respectively include emission layers that emit light having the same color.

A position of the second electrode may be within a range of 4,700 Å to 5,400 Å from the first electrode.

An emission position of the first EML may be within a range of 200 Å to 700 Å from the first electrode.

An emission position of the second EML may be within a range of 1,200 Å to 1,800 Å from the first electrode.

An emission position of the third EML may be within a range of 2,400 Å to 3,100 Å from the first electrode.

The first EML may be configured with one among a yellow-green emission layer, a yellow emission layer and a red emission layer, a red emission layer and a green emission layer, a yellow-green emission layer and a red emission layer, or configured by a combination thereof.

Each of the second EML and the third EML may be configured with one among a blue emission layer, a blue emission layer and a yellow-green emission layer, a blue emission layer and a red emission layer, and a blue emission layer and a green emission layer, or configured by a combination thereof.

An emission area of the first EML may be a range of 510 nm to 650 nm, an emission area of the second EML may be a range of 440 nm to 650 nm, and an emission area of the third EML may be a range of 440 nm to 650 nm.

A maximum emission range of the first EML may be a range of 530 nm to 570 nm, a maximum emission range of the second EML may be a range of 440 nm to 470 nm, and a maximum emission range of the third EML may be a range of 440 nm to 470 nm.

In another aspect of the present invention, there is provided a white organic light emitting device including: a first organic layer and a first emission layer (EML) on a substrate; a second organic layer and a second EML on the first EML; a third organic layer and a third EML on the second EML; and a fourth organic layer on the third EML, wherein the first to third EMLs have an emission position of emitting layers (EPEL) structure in which the first to third EMLs have a maximum emission range in respective emission areas of the first to third EMLs irrespective of the specific thickness of at least one among the first organic layer, the second organic layer, and the third organic layer.

The EPEL structure may be provided for the first to third EMLs to have the maximum emission range irrespective of the specific number of layers within at least one among the first organic layers, the second organic layers, the third organic layers, and the fourth organic layers.

The EPEL structure may be provided for the first to third EMLs to have the maximum emission range irrespective of the specific thickness of at least one among the first EML, the second EML, and the third EML.

The EPEL structure may be provided for the first to third EMLs to have the maximum emission range irrespective of the specific number of layers within at least one among the first EMLs, the second EMLs, and the third EMLs.

Details of embodiments are included in a detailed description and the drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
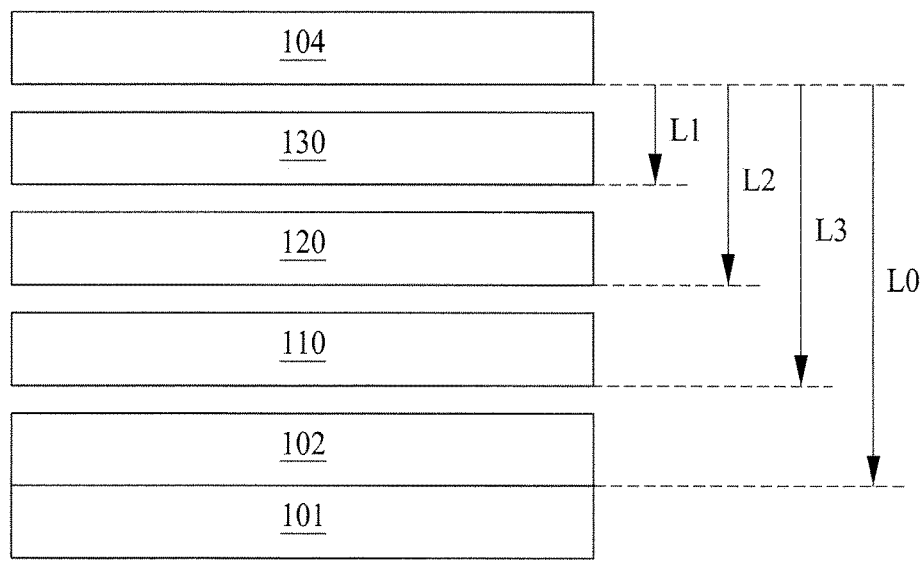
FIG. 1 is a schematic diagram illustrating a white organic light emitting device according to first and second embodiments of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used. Further, the term "position" in the present specification can refer to a position, a distance, a thickness, and/or a location.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

FIG. 1 is a schematic diagram illustrating a white organic light emitting device according to first and second embodiments of the present invention.

An organic light emitting device is classified into a bottom emission type and a top emission type depending on a transmission direction of emitted light. In first to third embodiments of the present invention, the bottom emission type will be described as an example.

Herein, an electroluminescence (EL) peak of an emission peak of an organic light emitting display apparatus using an organic light emitting device including first to third emission parts is determined by a multiplication of a photoluminescence (PL) peak, representing a unique color of an emission layer, and an emission (EM) peak of an organic layer configuring the organic light emitting device.

A white organic light emitting device 100 illustrated in FIG. 1 includes first and second electrodes 102 and 104 and first to third emission parts 110, 120 and 130 disposed between the first and second electrodes 102 and 104.

The first electrode 102 is an anode that supplies a hole, and may be formed of indium tin oxide (ITO) or indium zinc oxide (IZO) which is a transparent conductive material such as transparent conductive oxide (TCO). However, the present embodiment is not limited thereto.

The second electrode 104 is a cathode that supplies an electron, and may be formed of gold (Au), silver (Ag), aluminum (Al), molybdenum (Mo), or magnesium (Mg) which is a metal material, or may be formed of an alloy thereof. However, the present embodiment is not limited thereto.

Each of the first electrode 102 and the second electrode 104 may be referred to as an anode or a cathode.

The first electrode 102 may be formed of a transmissive electrode, and the second electrode 104 may be formed of a reflective electrode.

In the present embodiment, the first emission part 110, the second emission part 120, and the third emission part 130 which includes a blue emission layer may be disposed between the first electrode 102 and the second electrode 104, thereby improving an emission efficiency of an emission layer. Also, a position of the first electrode 102, an emission position of a first emission layer of the first emission part 110, an emission position of a second emission layer of the second emission part 120, and an emission position of a third emission layer of the third emission part 130 may be set from the second electrode 104, thereby improving emission efficiency and panel efficiency. That is, an emission position of emitting layers (EPEL) structure may be applied to the first to third emission layers.

A position L0 of the first electrode 102 is within a range of 4,500 Å to 6,000 Å from the second electrode 104. Alternatively, the position L0 of the first electrode 102 may be within a range of 4,500 Å to 6,000 Å from a reflective surface of the second electrode 104. Also, emission peaks of emission layers configuring the first to third emission parts 110, 120 and 130 are located at a specific wavelength, and light having the specific wavelength is emitted, thereby improving emission efficiency. The emission peak may be referred to as an emission peak of an organic layer configuring the emission parts. The position of an electrode (e.g., 102) such as L0 in this embodiment and other embodiments can preferably represent a distance at which that electrode (e.g., 102) is located away from another electrode (e.g., 104).

The position L0 of the first electrode 102 may be from the second electrode 104, and an emission position L1 of the third emission part 130 closest to the second electrode 104 may be within a range of 200 Å to 800 Å. Alternatively, the emission position L1 of the third emission part 130 may be within a range of 200 Å to 800 Å from the reflective surface of the second electrode 104. The third emission part 130 may be configured with a blue emission layer, or a blue emission layer and a yellow-green emission layer, or a blue emission layer and a red emission layer, or a blue emission layer and a green emission layer, or may be configured by a combination thereof. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance. The emission position of an emission part/layer such as L1, L2, or L3 in this embodiment and other embodiments can preferably represent a distance at which the emission part/layer is located away from an electrode (e.g., second electrode 104).

The emission position L1 of the third emission part 130 may be within a range of 200 Å to 800 Å from the second electrode 104 irrespective of at least one among the specific thickness of the emission layer, the specific number of emission layers, the specific thickness of the organic layer, and the specific number of organic layers. Alternatively, the emission position L1 of the third emission part 130 may be within a range of 200 Å to 800 Å from the reflective surface of the second electrode 104. Therefore, the emission peak is located in a blue emission area, or a blue and yellow-green emission area, or a blue and red emission area, or a blue and green emission layer, and light having a wavelength corresponding to the emission peak is emitted, thereby enabling the third emission part 130 to realize the maximum luminance. A peak wavelength range of the blue emission layer may be 440 nm to 480 nm.

Moreover, a peak wavelength range of the blue emission layer and the yellow-green emission layer may be 440 nm to 580 nm. Also, a peak wavelength range of the blue emission layer and the red emission layer may be 440 nm to 650 nm. Also, a peak wavelength range of the blue emission layer and the green emission layer may be 440 nm to 560 nm. Here, a peak wavelength may be an emission area.

An emission position L2 of the second emission part 120 may be within a range of 1,800 Å to 2,550 Å from the second electrode 104. Alternatively, the emission position L2 of the second emission part 120 may be within a range of 1,800 Å to 2,550 Å from the reflective surface of the second electrode 104. The second emission part 120 may be configured with a yellow-green emission layer, or a red emission layer and a green emission layer, or a yellow emission layer and a red emission layer, or the yellow-green emission layer and a red emission layer, or may be configured by a combination thereof.

The emission position L2 of the second emission part 120 may be within a range of 1,800 Å to 2,550 Å from the second electrode 104 irrespective of at least one among the specific thickness of the emission layer, the specific number of emission layers, the specific thickness of the organic layer, and the specific number of organic layers. Alternatively, the emission position L2 of the second emission part 120 may be within a range of 1,800 Å to 2,550 Å from the reflective surface of the second electrode 104. Therefore, the emission peak is located in a yellow-green emission area, or a yellow and red emission area, or a red and green emission area, or a yellow-green and red emission area, and light having a wavelength corresponding to the emission peak is emitted, thereby enabling the second emission part 120 to realize the maximum luminance. A peak wavelength range of the yellow-green emission layer may be 510 nm to 580 nm. Also, a peak wavelength range of the yellow emission layer and the red emission layer may be 540 nm to 650 nm. Also, a peak wavelength range of the red emission layer and the green emission layer may be 510 nm to 650 nm. Also, a peak wavelength range of the yellow-green emission layer and the red emission layer may be 510 nm to 650 nm. Here, a peak wavelength may be an emission area.

An emission position L3 of the first emission part 110 may be within a range of 2,650 Å to 3,300 Å from the second electrode 104. Alternatively, the emission position L3 of the first emission part 110 may be within a range of 2,650 Å to 3,300 Å from the reflective surface of the second electrode 104. The first emission part 110 may be configured with a blue emission layer, or a blue emission layer and a yellow-green emission layer, or a blue emission layer and a red emission layer, or a blue emission layer and a green emission layer, or may be configured by a combination thereof. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The emission position L3 of the first emission part 110 may be within a range of 2,650 Å to 3,300 Å from the second electrode 104 irrespective of at least one among the specific thickness of the emission layer, the specific number of emission layers, the specific thickness of the organic layer, and the specific number of organic layers. Alternatively, the emission position L3 of the first emission part 110 may be within a range of 2,650 Å to 3,300 Å from the reflective surface of the second electrode 104. Therefore, the emission peak of the first emission part 110 is located in a blue emission area, thereby enabling the first emission part 110 to realize the maximum luminance. A peak wavelength range of the blue emission layer may be 440 nm to 480 nm. Also, a peak wavelength range of the blue emission layer and the yellow-green emission layer may be 440 nm to 580 nm. Also, a peak wavelength range of the blue emission layer and the red emission layer may be 440 nm to 650 nm. Also, a peak wavelength range of the blue emission layer and the green emission layer may be 440 nm to 560 nm. Here, a peak wavelength may be an emission area.

The present invention sets a position of the first electrode 102 from the second electrode 104 irrespective of at least one among the specific thickness of the emission layer, the specific number of emission layers, the specific thickness of the organic layer, and the specific number of organic layers, and applies the EPEL structure where emission positions of the emission layers are set from the second electrode 104.

Figure 2:
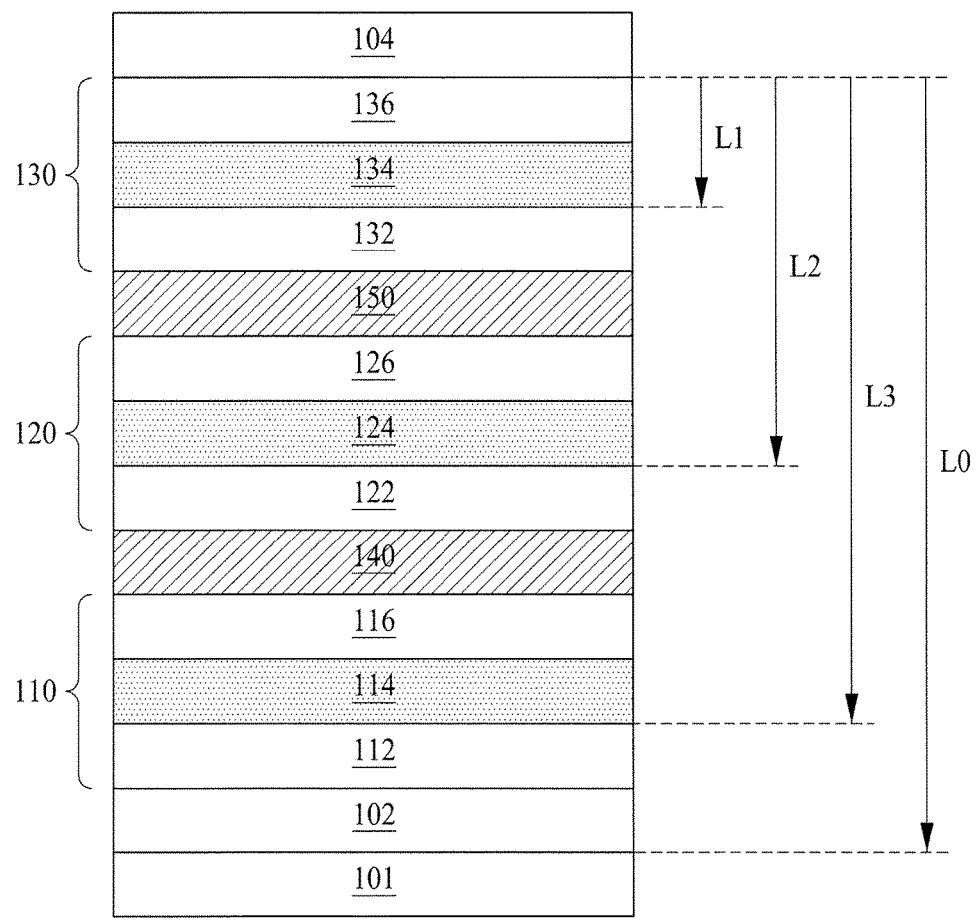
FIG. 2 is a diagram illustrating a white organic light emitting device according to the first embodiment of the present invention.

FIG. 2 is a diagram illustrating a white organic light emitting device according to the first embodiment of the present invention.

A white organic light emitting device 100 illustrated in FIG. 2 includes first and second electrodes 102 and 104 and first to third emission parts 110, 120 and 130 between the first and second electrodes 102 and 104.

Each of the first electrode 102 and the second electrode 104 may be referred to as an anode or a cathode.

A position L0 of the first electrode 102 is set to 4,500 Å to 6,000 Å from the second electrode 104. Since the position L0 of the first electrode 102 is set, emission peaks of emission layers configuring the first to third emission parts 110, 120 and 130 are located at a specific wavelength, and light having the specific wavelength is emitted, thereby improving an emission efficiency of the emission layers. The first to third emission parts 110, 120 and 130 have the EPEL structure that has a maximum emission range in emission areas of the first to third emission layers.

The third emission part 130 may include a third electron transport layer (ETL) 136, a third emission layer (EML) 134, and a third hole transport layer (HTL) 132 which are disposed under the second electrode 104. Although not shown, an electron injection layer (EIL) may be further formed on the third ETL 136. The EIL may inject an electron, supplied from the second electrode 104, into the third ETL 136.

The third ETL 136 may be formed of oxadiazole, triazole, phenanthroline, benzoxazole, or benzthiazole, but is not limited thereto.

The third ETL 136 may be formed of two or more layers or two or more materials.

The third HTL 132 may be formed of N,N'-bis(3-methylphenyl)-N,N'-bis(phenyl)-benzidine (TPD) or N,N'-di(naphthalen-1-yl)-N,N'-diphenyl-benzidine (NPB), but is not limited thereto.

The third HTL 132 may be formed of two or more layers or two or more materials.

A hole injection layer (HIL) may be further formed under the third HTL 132. The HIL may inject a hole, supplied from a second charge generation layer (CGL) 150, into the third HTL 132.

A hole blocking layer (HBL) may be further formed on the third EML 134. The HBL prevents a hole, generated by the third EML 134, from being transferred to the third ETL 136 and thus enhances a combination of an electron and a hole in the third EML 134, thereby enhancing an emission efficiency of the third EML 134. The third ETL 136 and the HBL may be provided as one layer or single layer.

An electron blocking layer (EBL) may be further formed under the third EML 134. The EBL prevents an electron, generated by the third EML 134, from being transferred to the third HTL 132 and thus enhances a combination of an electron and a hole in the third EML 134, thereby enhancing an emission efficiency of the third EML 134. The third HTL 132 and the EBL may be provided as one layer or single layer.

The third EML 134 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer may be further improved. When the third EML 134 is provided along with the auxiliary emission layer, the yellow-green emission layer, the red emission layer, or the green emission layer may be disposed on or under the third EML 134.

Moreover, the yellow-green emission layer, the red emission layer, or the green emission layer may be identically or differently provided as the auxiliary emission layer on and under the third EML 134. The positions or number of emission layers may be selectively determined depending on a structure and a characteristic of an organic light emitting device, but the present embodiment is not limited thereto.

When the auxiliary emission layer is provided in the third EML 134, a peak wavelength of an emission area of the third EML 134 may be within a range of 440 nm to 650 nm. Here, the peak wavelength may be an emission area.

Each of the third ETL 136, the third EML 134, the EIL, and the HBL may be referred to as an organic layer. All organic layers between the second electrode 104 and the third EML 134, and the third EML 134 may be referred to as an organic layer. Therefore, all organic layers d between the second electrode 104 and the third EML 134 may be referred to as a fourth organic layer.

An emission position L1 of the third EML 134 may be within a range of 200 Å to 800 Å from the second electrode 104 irrespective of at least one among the number or thickness of the third ETL 136, the number or thickness of the third EML 134, the number or thickness of the EIL, the number or thickness of the HBL, or the number or thickness of the organic layers between the second electrode 104 and the third EML 134. Alternatively, the emission position L1 of the third EML 134 may be within a range of 200 Å to 800 Å from a reflective surface of the second electrode 104. Therefore, the emission position L1 of the third EML 134 may be within a range of 200 Å to 800 Å from the second electrode 104 irrespective of at least one among the number of fourth organic layers, a thickness of the fourth organic layer, the number of third EMLs, and a thickness of the third EML. Alternatively, the emission position L1 of the third EML 134 may be within a range of 200 Å to 800 Å from the reflective surface of the second electrode 104 irrespective of at least one among the number of the fourth organic layers, a thickness of the fourth organic layer, the number of the third EMLs, and a thickness of the third EML.

The second emission part 120 may include a second HTL 122, a second EML 124, and a second ETL 126.

The second ETL 126 may be formed of the same material as that of the third ETL 136, but is not limited thereto.

The second ETL 126 may be formed of two or more layers or two or more materials.

The second HTL 122 may be formed of the same material as that of the third HTL 132, but is not limited thereto.

The second HTL 122 may be formed of two or more layers or two or more materials.

An HIL may be further formed under the second HTL 122. The HIL may inject a hole, supplied from a first CGL 140, into the second HTL 122.

An HBL may be further formed on the second EML 124. The HBL prevents a hole, generated by the second EML 124, from being transferred to the second ETL 126 and thus enhances a combination of an electron and a hole in the second EML 124, thereby enhancing an emission efficiency of the second EML 124. The second ETL 126 and the HBL may be provided as one layer or single layer.

An EBL may be further formed under the second EML 124. The EBL prevents an electron, generated by the second EML 124, from being transferred to the second HTL 122 and thus enhances a combination of an electron and a hole in the second EML 124, thereby enhancing an emission efficiency of the second EML 124. The second HTL 122 and the EBL may be provided as one layer or single layer.

The second EML 124 may be configured with one among a yellow-green emission layer, a yellow emission layer and a red emission layer, a red emission layer and a green emission layer, and a yellow-green emission layer and a red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the second EML 124. Also, the yellow emission layer and the red emission layer, the red emission layer and the green emission layer, or the yellow-green emission layer and the red emission layer may be identically or differently provided as the auxiliary emission layer on and under the second EML 124.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the second EML 124 is configured with two layers (for example, the yellow emission layer and the red emission layer), an emission efficiency of the red emission layer can increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the second EML 124 is configured with two layers (for example, the red emission layer and the green emission layer), a color reproduction rate may be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the second EML 124 is configured with two layers (for example, the yellow emission layer and the red emission layer), an emission efficiency of the red emission layer may increase.

Moreover, the second EML 124 of the second emission part 120 may be configured with two layers (for example, the red emission layer and the yellow-green emission layer) depending on a characteristic or a structure of an organic light emitting device. A peak wavelength of an emission area of the red emission layer may be within a range of 600 nm to 650 nm. A peak wavelength of an emission area of the yellow-green emission layer may be within a range of 510 nm to 580 nm. When the second EML 124 is configured with two layers (for example, the red emission layer and the yellow-green emission layer), an emission efficiency of the red emission layer can increase. In this case, a peak wavelength of an emission area of the second EML 124 may be within a range of 510 nm to 650 nm. Here, the peak wavelength may be an emission area.

When the second EML 124 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the second EML 124 may be within a range of 510 nm to 650 nm. Here, the peak wavelength may be an emission area.

A second CGL 150 may be further formed between the second emission part 120 and the third emission part 130. The second CGL 150 adjusts a balance of electrical charges between the second emission part 120 and the third emission part 130. The second CGL 150 may include an N-type CGL and a P-type CGL.

The N-type CGL may inject an electron into the second emission part 120, and the P-type CGL may inject a hole into the third emission part 130.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The P-type CGL may be formed as an organic layer including a P-type dopant, but is not limited thereto.

The second CGL 150 may be formed of a single layer.

Each of the second EML 124, the second ETL 126, the second CGL 150, the third HTL 132, the HBL, the EBL, and the HTL may be referred to as an organic layer. All organic layers, between the third EML 134 and the second EML 124, and the second EML 124 may be referred to as an organic layer. Therefore, all organic layers between the third EML 134 and the second EML 124 may be referred to as a third organic layer.

An emission position L2 of the second EML 124 may be within a range of 1,800 Å to 2,550 Å from the second electrode 104 irrespective of at least one among the number or thickness of the third HTL 132, the number or thickness of the second CGL 150, the number or thickness of the second ETL 126, the number or thickness of the HBL, the number or thickness of the EBL, the number or thickness of the HIL, the number or thickness of the second EML 124, the number or thickness of the third EML 134, the number or thickness of the organic layers between the second electrode 104 and the third EML 134, or the number or thickness of the organic layers between the third EML 134 and the second EML 124. Alternatively, the emission position L2 of the second EML 124 may be within a range of 1,800 Å to 2,550 Å from a reflective surface of the second electrode 104.

Therefore, the emission position L2 of the second EML 124 may be within a range of 1,800 Å to 2,550 Å from the second electrode 104 irrespective of at least on among the number of the fourth organic layers, a thickness of the fourth organic layer, the number of the third organic layers, a thickness of the third organic layer, the number of the third EMLs, a thickness of the third EML, the number of the second EMLs, and a thickness of the second EML. Alternatively, the emission position L2 of the second EML 124 may be within a range of 1,800 Å to 2,550 Å from the reflective surface of the second electrode 104 irrespective of at least one among the number of the fourth organic layers, a thickness of the fourth organic layer, the number of the third organic layers, a thickness of the third organic layer, the number of the third EMLs, a thickness of the third EML, the number of the second EMLs, and a thickness of the second EML.

The first emission part 110 may include a first HTL 112, a first EML 114, and a first ETL 116 which are disposed on the first electrode 102.

Although not shown, an HIL may be further formed. The HIL may be formed on the first electrode 102 and enables a hole, supplied from the first electrode 102, to be smoothly injected. The first HTL 112 may supply a hole, supplied from the HIL, to the first EML 114. The first ETL 116 may supply an electron, supplied from the second electrode 104, to the first EML 114.

The HIL may be formed of 4,4',4"-tris(3-methylphenylphenylamino) triphenylamine (MTDATA), copper phthalocyanine (CuPc), poly(3,4-ethylenedioxythiphene, polystyrene sulfonate) (PEDOT/PSS), but is not limited thereto.

A hole supplied through the first HTL 112 and an electron supplied through the first ETL 116 may be recombined in the first EML 114 to emit light.

The first ETL 116 may be formed of the same material as that of the third ETL 136, but is not limited thereto.

The first ETL 116 may be formed of two or more layers or two or more materials.

The first HTL 112 may be formed of the same material as that of the third HTL 132, but is not limited thereto.

The first HTL 112 may be formed of two or more layers or two or more materials.

An HBL may be further formed on the first EML 114. The HBL prevents a hole, generated by the first EML 114, from being transferred to the first ETL 116 and thus enhances a combination of an electron and a hole in the first EML 114, thereby enhancing an emission efficiency of the first EML 114. The first ETL 116 and the HBL may be provided as one layer or single layer.

An EBL may be further formed on the first EML 114. The EBL prevents an electron, generated by the first EML 114, from being transferred to the first HTL 112 and thus enhances a combination of an electron and a hole in the first EML 114, thereby enhancing an emission efficiency of the first EML 114. The first HTL 112 and the EBL may be provided as one layer or single layer.

The first EML 114 may include a blue emission layer or a blue emission layer that includes an auxiliary emission layer that emit a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer may be further improved. When the first EML 114 is provided along with the auxiliary emission layer, the yellow-green emission layer, the red emission layer, or the green emission layer may be disposed on or under the first EML 114. Also, the yellow-green emission layer, the red emission layer, or the green emission layer may be identically or differently provided as the auxiliary emission layer on and under the first EML 114. The positions or number of emission layers may be selectively determined depending on a structure and a characteristic of an organic light emitting device, but the present embodiment is not limited thereto.

When the auxiliary emission layer is provided in the first EML 114, a peak wavelength of an emission area of the first EML 114 may be within a range of 440 nm to 650 nm. Here, the peak wavelength may be an emission area.

A first CGL 140 may be further formed between the first emission part 110 and the second emission part 120. The first CGL 140 adjusts a balance of electrical charges between the first emission part 110 and the second emission part 120. The first CGL 140 may include an N-type CGL and a P-type CGL.

The N-type CGL may inject an electron into the first emission part 110, and the P-type CGL may inject a hole into the second emission part 120.

The first CGL 140 may be formed of the same material as that of the N-type CGL and the P-type CGL of the second CGL 150, but is not limited thereto.

The first CGL 140 may be formed of a single layer.

Each of the first EML 114, the first ETL 116, the first CGL 140, the second HTL 122, the HBL, the EBL, and the HTL may be referred to as an organic layer. All organic layers between the second EML 124 and the first EML 114, and the first EML 114 may be referred to as an organic layer. Therefore, all organic layers between the second EML 124 and the first EML 114 may be referred to as a second organic layer.

The emission position L3 of the first EML 114 may be within a range of 2,650 Å to 3,300 Å from the second electrode 104 irrespective of at least one among the number or thickness of the second HTL 122, the number or thickness of the first CGL 140, the number or thickness of the EBL, the number or thickness of the HIL, the number or thickness of the HBL, the number or thickness of the first ETL 116, the number or thickness of the first EML 114, the number or thickness of the second EML 124, the number or thickness of the third EML 134, the number or thickness of the organic layers disposed between the second electrode 104 and the third EML 134, the number or thickness of the organic layers disposed between the third EML 134 and the second EML 124, or the number or thickness of the organic layers disposed between the second EML 124 and the first EML 114. Alternatively, the emission position L3 of the first EML 114 may be within a range of 2,650 Å to 3,300 Å from the reflective surface of the second electrode 104.

Therefore, the emission position L3 of the first EML 114 may be within a range of 2,650 Å to 3,300 Å from the second electrode 104 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, and a thickness of the first EML. Alternatively, the emission position L3 of the first EML 114 may be within a range of 2,650 Å to 3,300 Å from the reflective surface of the second electrode 104 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, and a thickness of the first EML.

Moreover, the first HTL 112, the EBL, and the HIL which are disposed between the first EML 114 and the substrate 101 may be referred to as an organic layer. Therefore, all layers which are disposed between the first EML 114 and the substrate 101 and include the first electrode 102 may be referred to as an organic layer. All the layers disposed between the first EML 114 and the substrate 101 and the first electrode 102 may be referred to as a first organic layer.

The position L0 of the first electrode 102 may be within a range of 4,500 Å to 6,000 Å from the second electrode 104 irrespective of at least one among the number or thickness of the first HTL 112, the number or thickness of the HIL, the number or thickness of the EBL, the number or thickness of the first electrode 102, the number or thickness of the first EML 114, the number or thickness of the second EML 124, the number or thickness of the third EML 134, the number or thickness of the organic layers between the second electrode 104 and the third EML 134, the number or thickness of the organic layers between the third EML 134 and the second EML 124, the number or thickness of the organic layers between the second EML 124 and the first EML 114, or the number or thickness of the organic layers between the first EML 114 and the substrate 101. Alternatively, the position L0 of the first electrode 102 may be within a range of 4,500 Å to 6,000 Å from the reflective surface of the second electrode 104.

Therefore, the position L0 of the first electrode 102 may be within a range of 4,500 Å to 6,000 Å from the second electrode 104 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, a thickness of the first EML, the number of the first organic layers, and a thickness of the first organic layer. Alternatively, the position L0 of the first electrode 102 may be within a range of 4,500 Å to 6,000 Å from the reflective surface of the second electrode 104 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, a thickness of the first EML, the number of the first organic layers, and a thickness of the first organic layer.

FIG. 2 is a diagram illustrating, as an example, organic layers between the first emission part 110, the second emission part 120, and the third emission part 130 irrespective of at least one of the numbers and thicknesses of the emission layers and the organic layers configuring the first to third emission parts 110, 120 and 130. However, the present embodiment is not limited thereto, and the organic layers may be selectively disposed depending on a structure and a characteristic of an organic light emitting device.

The structure illustrated in FIG. 2 is an example of the present invention, and may be selectively changed depending on a structure or a characteristic of an organic light emitting device. However, the present embodiment is not limited thereto.

Figure 3:
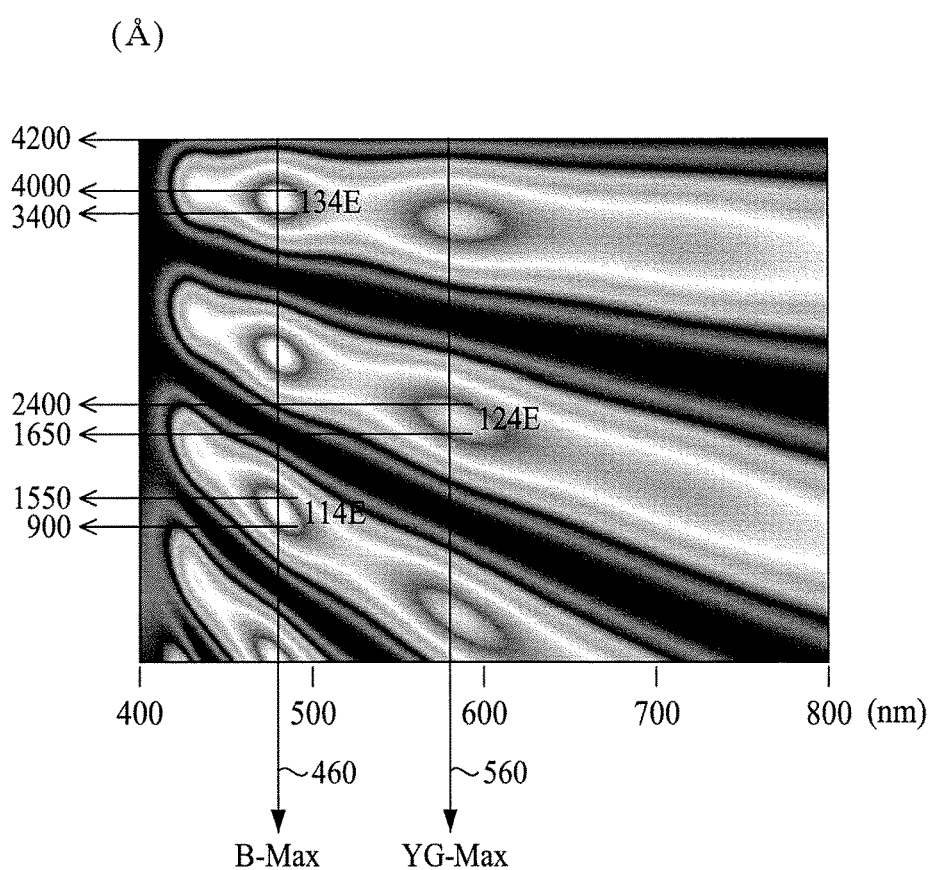
FIG. 3 is a diagram illustrating an emission position of an organic light emitting device according to the first embodiment of the present invention.

FIG. 3 is a diagram illustrating an emission position of an organic light emitting device according to the first embodiment of the present invention.

In FIG. 3, the abscissa axis indicates a wavelength range of light, and the ordinate axis indicates emission positions of emission layers configuring the emission part from the second electrode 104 and may be referred to as a contour map. Here, when the EPEL structure according to an embodiment of the present invention is applied except the first electrode 102 and the second electrode 104, FIG. 3 shows the emission positions of the emission layers at an emission peak. Also, FIG. 3 shows emission positions of emission layers having a maximum emission range in emission areas of the emission layers. FIG. 3 shows emission positions of the emission layers with a thickness of all organic layers being 4,200 Å except the first electrode 102 and the second electrode 104. The thickness of all the organic layers does not limit details of the present invention.

Since the third EML 134 configuring the third emission part 130 is the blue emission layer, a peak wavelength range of the emission area of the third EML 134 may be 440 nm to 480 nm. When light is emitted at 460 nm that is a maximum wavelength "B-Max" of the blue emission layer, maximum efficiency is obtained in a white color area of the contour map.

Therefore, an emission position of the third EML 134 is within a range of 200 Å to 800 Å from the second electrode 104, and thus, an emission peak 134E of the third EML 134 is located at 460 nm that is the maximum wavelength "B-Max". Thus, the third EML 134 emits light at 460 nm that is the maximum wavelength "B-Max", thereby obtaining maximum efficiency. As described above, in FIG. 3, the emission position of the third EML 134 is illustrated as 3,400 Å to 4,000 Å, which is a value that is obtained by subtracting 3,400 Å to 4,000 Å from 4,200 Å that is a thickness of all organic layers. Accordingly, the emission position of the third EML 134 may be a range of 200 Å to 800 Å. This may be identically applied to an emission position of the second EML 124 and an emission position of the first EML 114.

Moreover, when the third EML 134 is configured with one among the blue emission layer and the yellow-green emission layer, the blue emission layer and the red emission layer, and the blue emission layer and the green emission layer, or is configured by a combination thereof, a peak wavelength range of the emission area of the third EML 134 may be 440 nm to 650 nm. The blue emission layer may include one among a blue emission layer, a deep blue emission layer, and a sky blue emission layer.

Since the second EML 124 configuring the second emission part 120 is the yellow-green emission layer, a peak wavelength range of the emission area of the second EML 124 may be a range of 510 nm to 580 nm. When light is emitted at 560 nm that is a maximum wavelength "YG-Max" of the blue emission layer, maximum efficiency is obtained in the white color area of the contour map.

Therefore, an emission position of the second EML 124 is set to a range of 1,800 Å to 2,550 Å from the second electrode 104, and thus, an emission peak 124E of the second EML 124 is located at 560 nm that is the maximum wavelength "YG-Max". Thus, the second EML 124 emits light at 560 nm that is the maximum wavelength "YG-Max", thereby obtaining maximum efficiency.

The second EML 124 of the second emission part 120 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the second EML 124, maximum efficiency is obtained in the white color area of the contour map.

Moreover, the second EML 124 of the second emission part 120 may be configured with two layers (for example, a red emission layer and a green emission layer) depending on a characteristic or a structure of an organic light emitting device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the second EML 124, maximum efficiency is obtained in the white color area of the contour map.

Moreover, the second EML 124 of the second emission part 120 may be configured with two layers (for example, a red emission layer and a yellow-green emission layer) depending on a characteristic or a structure of a device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the second EML 124, maximum efficiency is obtained in the white color area of the contour map.

Therefore, when the second EML 124 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the second EML 124 may be 510 nm to 650 nm. In this case, when light is emitted at 510 nm to 650 nm that is the emission area of the second EML 124, maximum efficiency is obtained in the white color area of the contour map.

Since the first EML 114 configuring the first emission part 110 is the blue emission layer, a peak wavelength range of the emission area of the first EML 114 may be a range of 440 nm to 480 nm. When light is emitted at 460 nm that is the maximum wavelength "B-Max" of the blue emission layer, maximum efficiency is obtained in the white color area of the contour map.

Therefore, an emission position of the first EML 114 is set to a range of 2,650 Å to 3,300 Å from the second electrode 104, and thus, an emission peak 114E of the first EML 114 is located at 460 nm that is the maximum wavelength "B-Max". Thus, the first EML 114 emits light at 460 nm that is the maximum wavelength "B-Max", thereby obtaining maximum efficiency.

Moreover, when the first EML 114 is configured with one among the blue emission layer and the yellow-green emission layer, the blue emission layer and the red emission layer, and the blue emission layer and a green emission layer, or is configured by a combination thereof, a peak wavelength range of the emission area of the first EML 114 may be 440 nm to 650 nm. The blue emission layer may include one among a blue emission layer, a deep blue emission layer, and a sky blue emission layer. In this case, therefore, when light is emitted at 440 nm to 650 nm that is the emission area of the first EML 114, maximum efficiency is obtained in the white color area of the contour map.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

In other words, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. That is, a peak wavelength may be an emission area.

Therefore, a maximum emission range of the first EML may be 440 nm to 470 nm, a maximum emission range of the second EML may be 530 nm to 570 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 4:
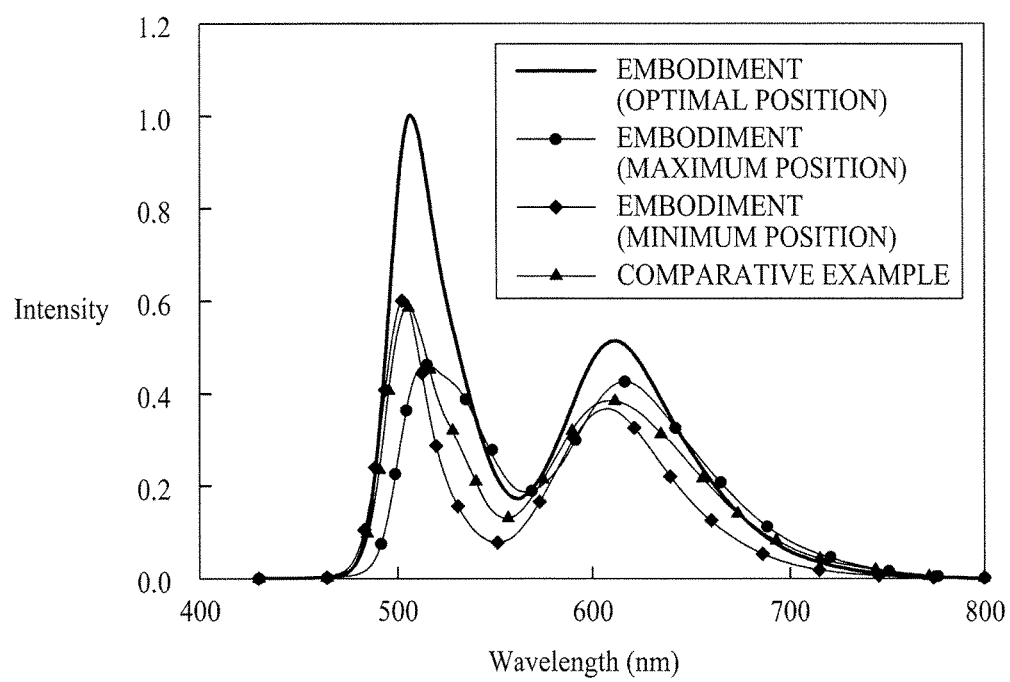
FIG. 4 is a diagram illustrating an electroluminescence (EL) spectrum according to the first embodiment of the present invention and a comparative example.

FIG. 4 is a diagram illustrating an electroluminescence (EL) spectrum according to the first embodiment of the present invention and a comparative example.

That is, FIG. 4 shows an emission intensity of a bottom emission type having a structure, where a blue emission layer and a yellow-green emission layer are formed, by comparing a comparative example and a case where the EPEL structure according to an embodiment of the present invention is applied.

In FIG. 4, the abscissa axis indicates a wavelength range of light, and the ordinate axis indicates emission intensity. The emission intensity is a numerical value that is expressed as a relative value with respect to a maximum value of an EL spectrum.

In FIG. 4, a minimum position according to an embodiment is a portion which is set as a minimum position when emission positions of emission layers are set. For example, when the emission position L1 of the third EML 134 is within a range of 200 Å to 800 Å from the second electrode 104, the minimum position is set to 200 Å.

A maximum position according to an embodiment is a portion which is set as a maximum position when emission positions of emission layers are set. For example, when the emission position L1 of the third EML 134 is within a range of 200 Å to 800 Å from the second electrode 104, the maximum position is set to 800 Å.

An optimal position according to an embodiment is a portion which is set as an emission position according to a first embodiment of the present invention. For example, when the emission position L1 of the third EML 134 is within a range of 200 Å to 800 Å from the second electrode 104, an emission position according to an embodiment is set to 200 Å to 800 Å.

As shown in FIG. 4, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light. Also, it can be seen that emission intensity is reduced at 510 nm to 580 nm that is a peak wavelength range of yellow-green light. Also, it can be seen that emission intensity is considerably reduced at 600 nm to 650 nm that is a peak wavelength range of red light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light, and is out of a peak wavelength range of the blue light. Therefore, blue light emission efficiency is reduced. Also, it can be seen that emission intensity is reduced at 510 nm to 580 nm that is the peak wavelength range of the yellow-green light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 1. When it is assumed that efficiency of a comparative example is 100%, the following Table 1 shows efficiency of the first embodiment of the present invention.

In the following Table 1, the comparative example relates to a bottom emission type white light emitting device having a structure where a blue emission layer and a yellow-green emission layer are formed. Also, an embodiment relates to a bottom emission type white light emitting device when an optimal position of the EPEL structure according to an embodiment of the present invention is applied.

TABLE 1

| Division | Red (R) Efficiency | Green (G) Efficiency | Blue (B) Efficiency | White (W) Efficiency | Average |
|---|---|---|---|---|---|
| Comparative Example | 100% | 100% | 100% | 100% | 100% |
| Embodiment (Optimal Position) | 91% | 125% | 147% | 119% | 120% |

As shown in Table 1, in comparison with the comparative example, when it is assumed that efficiency of the comparative example is 100% in a case where the EPEL structure is applied, it can be seen that green efficiency increases by about 25%. Also, it can be seen that blue efficiency increases by about 47%, and white efficiency increases by about 19%. Also, it can be seen that average efficiency increases by about 20% in comparison with the comparative example.

A panel efficiency of a white light emitting device having the EPEL structure and a panel efficiency of a comparative example are as listed in the following Table 2.

When it is assumed that an efficiency of an optimal position according to an embodiment is 100%, the following Table 2 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 2

| Division | Red (R) Efficiency | Green (G) Efficiency | Blue (B) Efficiency | White (W) Efficiency | Average |
|---|---|---|---|---|---|
| Embodiment (Minimum Position) | 22% | 52% | 46% | 45% | 41% |
| Embodiment (Optimal Position) | 100% | 100% | 100% | 100% | 100% |
| Embodiment (Maximum Position) | 155% | 69% | 66% | 83% | 93% |

As shown in Table 2, it can be seen that efficiencies of red, green, blue, and white are all reduced in a boundary between the embodiment (the minimum position) and the embodiment (the maximum position). Also, it can be seen that efficiencies of red, green, blue, and white are more reduced in the embodiment (the minimum position) than the embodiment (the maximum position). Therefore, when an emission position of the EPEL structure is out of an optimal position, it can be seen that panel efficiency is reduced.

As described above in the first embodiment of the present invention, the organic light emitting device may be a bottom emission type organic light emitting device.

A position of the first electrode may be within a range of 4,500 Å to 6,000 Å from the second electrode.

An emission position of the third EML may be within a range of 200 Å to 800 Å from the second electrode.

An emission position of the second EML may be set to a range of 1,800 Å to 2,550 Å from the second electrode.

An emission position of the first EML may be within a range of 2,650 Å to 3,300 Å from the second electrode.

The first EML may be configured with one among a blue emission layer, a blue emission layer and a yellow-green emission layer, a blue emission layer and a red emission layer, and a blue emission layer and a green emission layer, or may be configured by a combination thereof.

The second EML may be configured with one among a yellow-green emission layer, a yellow emission layer and a red emission layer, a red emission layer and a green emission layer, and a yellow-green emission layer and a red emission layer, or may be configured by a combination thereof.

The third EML may be configured with one among a blue emission layer, a blue emission layer and a yellow-green emission layer, a blue emission layer and a red emission layer, or a blue emission layer and a green emission layer, or may be configured by a combination thereof.

An emission area of the first EML may be a range of 440 nm to 650 nm, an emission area of the second EML may be a range of 510 nm to 650 nm, and an emission area of the third EML may be a range of 440 nm to 650 nm.

A maximum emission range of the first EML may be a range of 440 nm to 470 nm, a maximum emission range of the second EML may be a range of 530 nm to 570 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 5:
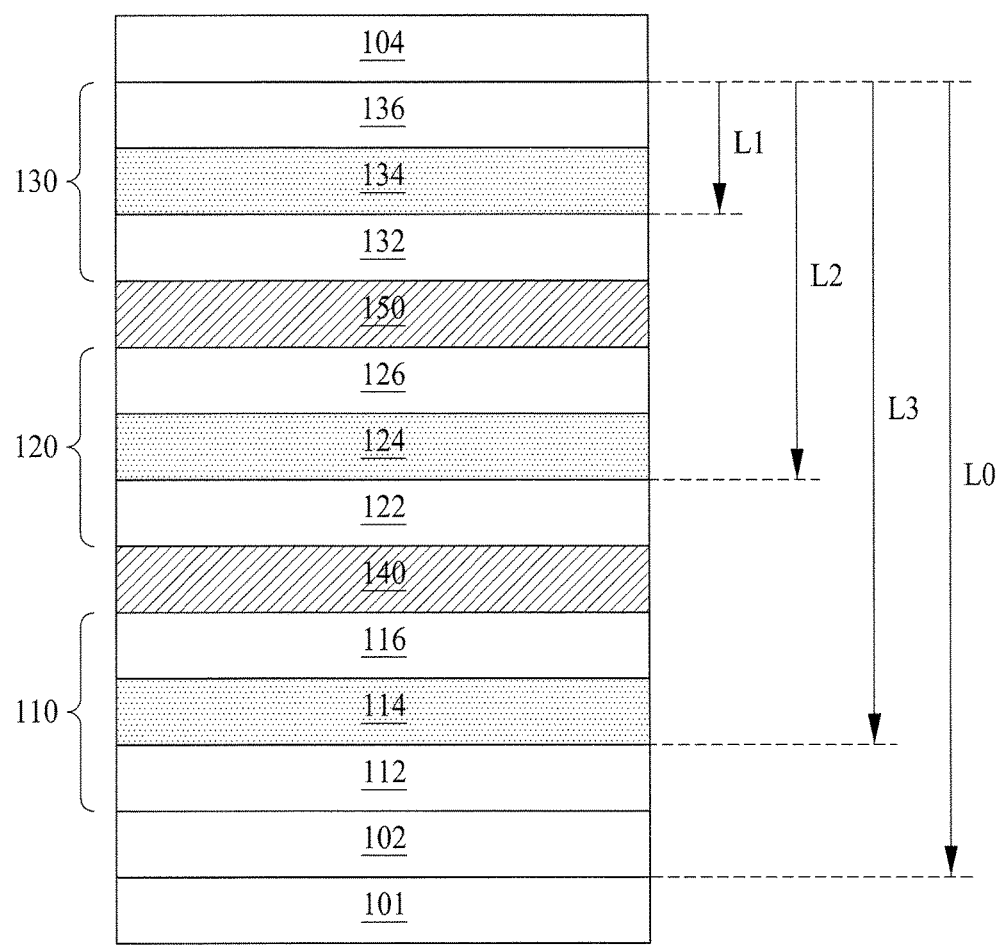
FIG. 5 is a diagram illustrating a white organic light emitting device according to the second embodiment of the present invention.

FIG. 5 is a diagram illustrating a white organic light emitting device according to the second embodiment of the present invention.

A white organic light emitting device 100 illustrated in FIG. 5 includes first and second electrodes 102 and 104 and first to third emission parts 110, 120 and 130 between the first and second electrodes 102 and 104. In describing the present embodiment, descriptions on elements which are the same as or correspond to the elements according to the preceding embodiment are not repeated. A position of the first electrode 102 is set to 4,500 Å to 6,000 Å from the second electrode 104. Also, emission peaks of emission layers configuring the first to third emission parts 110, 120 and 130 are located at a specific wavelength, and light having the specific wavelength is emitted, thereby improving an emission efficiency of the emission layers. The first to third emission parts 110, 120 and 130 have the EPEL structure that has a maximum emission range in emission areas of the first to third emission layers.

The third emission part 130 may include a third ETL 136, a third EML 134, and a third HTL 132 which are disposed under the second electrode 104.

Although not shown, an electron injection layer (EIL) may be further formed on the third ETL 136. The EIL may inject an electron, supplied from the second electrode 104, into the third ETL 136.

An HIL may be further formed under the third HTL 132.

An HBL may be further formed on the third EML 134. The third ETL 136 and the HBL may be provided as one layer or single layer.

An EBL may be further formed under the third EML 134. The third HTL 132 and the EBL may be provided as one layer or single layer.

The third EML 134 may include a blue emission layer or a blue emission layer that includes an auxiliary emission layer emitting a different color. The blue emission layer may include one among a blue emission layer, a deep blue emission layer, and a sky blue emission layer.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer may be further improved. When the third EML 134 is provided along with the auxiliary emission layer, the yellow-green emission layer, the red emission layer, or the green emission layer may be disposed on or under the third EML 134.

Moreover, the yellow-green emission layer, the red emission layer, or the green emission layer may be identically or differently provided as the auxiliary emission layer on and under the third EML 134. The positions or number of emission layers may be selectively determined depending on a structure and a characteristic of an organic light emitting device, but the present embodiment is not limited thereto.

When the auxiliary emission layer is provided in the third EML 134, a peak wavelength of an emission area of the third EML 134 may be within a range of 440 nm to 650 nm. Here, the peak wavelength may be an emission area.

Each of the third ETL 136, the third EML 134, the EIL, and the HBL may be referred to as an organic layer. All organic layers between the second electrode 104 and the third EML 134, and the third EML 134 may be referred to as an organic layer. Therefore, all organic layers between the second electrode 104 and the third EML 134 may be referred to as a fourth organic layer.

An emission position L1 of the third EML 134 may be within a range of 300 Å to 700 Å from the second electrode 104 irrespective of at least one among the number or thickness of the third ETL 136, the number or thickness of the third EML 134, the number or thickness of the EIL, the number or thickness of the HBL, or the number or thickness of the organic layers disposed between the second electrode 104 and the third EML 134. Alternatively, the emission position L1 of the third EML 134 may be within a range of 300 Å to 700 Å from the reflective surface of the second electrode 104. Therefore, the emission position L1 of the third EML 134 may be within a range of 300 Å to 700 Å from the second electrode 104 irrespective of at least one among the number of fourth organic layers, a thickness of the fourth organic layer, the number of third EMLs, and a thickness of the third EML. Alternatively, the emission position L1 of the third EML 134 may be set to be located within a range of 300 Å to 700 Å from the reflective surface of the second electrode 104 irrespective of at least one among the number of the fourth organic layers, a thickness of the fourth organic layer, the number of the third EMLs, and a thickness of the third EML.

The second emission part 120 may include a second HTL 122, a second EML 124, and a second ETL 126.

An HIL may be further formed under the second HTL 122.

An HBL may be further formed on the second EML 124. The second ETL 126 and the HBL may be provided as one layer or single layer.

An EBL may be further formed under the second EML 124. The second HTL 122 and the EBL may be provided as one layer or single layer.

The second EML 124 may be configured with one among a yellow-green emission layer, a yellow emission layer and a red emission layer, the red emission layer and a green emission layer, and the yellow-green emission layer and the red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the second EML 124. Also, the yellow emission layer and the red emission layer, the red emission layer and the green emission layer, or the yellow-green emission layer and the red emission layer may be identically or differently provided as the auxiliary emission layer on and under the second EML 124.

Moreover, a peak wavelength of an emission area of the yellow emission layer may be within a range of 540 mil to 580 nm. A peak wavelength of an emission area of the red emission layer may be within a range of 600 hill to 650 nm. Therefore, a peak wavelength of an emission area of the yellow emission layer and the red emission layer may be within a range of 540 nm to 650 nm. Here, the peak wavelength may be an emission area. When the second EML 124 is configured with two layers (for example, the yellow emission layer and the red emission layer), an emission efficiency of the red emission layer may increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the second EML 124 is configured with two layers (for example, the red emission layer and the green emission layer), a color reproduction rate can be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer of the second EML 124 may be within a range of 540 nm to 650 nm. Here, the peak wavelength may be an emission area. When the second EML 124 is configured with two layers (for example, the yellow emission layer and the red emission layer), an emission efficiency of the red emission layer can increase.

Moreover, the second EML 124 of the second emission part 120 may be configured with two layers (for example, the red emission layer and the yellow-green emission layer) depending on a characteristic or a structure of a device. A peak wavelength of an emission area of the red emission layer may be within a range of 600 nm to 650 nm. A peak wavelength of an emission area of the yellow-green emission layer may be within a range of 510 nm to 580 nm. When the second EML 124 is configured with two layers (for example, the red emission layer and the yellow-green emission layer), an emission efficiency of the red emission layer can increase. In this case, a peak wavelength of an emission area of the second EML 124 may be within a range of 510 nm to 650 nm. Here, the peak wavelength may be an emission area.

When the second EML 124 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the second EML 124 may be within a range of 510 nm to 650 nm. Here, the peak wavelength may be an emission area.

A second CGL 150 may be further formed between the second emission part 120 and the third emission part 130. The second CGL 150 may include an N-type CGL and a P-type CGL.

Each of the second EML 124, the second ETL 126, the second CGL 150, the third HTL 132, the HBL, the EBL, and the HTL may be referred to as an organic layer. All organic layers between the third EML 134 and the second EML 124, and the second EML 124 may be referred to as an organic layer. Therefore, all organic layers between the third EML 134 and the second EML 124 may be referred to as a third organic layer.

An emission position L2 of the second EML 124 may be within a range of 1,900 Å to 2,400 Å from the second electrode 104 irrespective of at least one among the number or thickness of the third HTL 132, the number or thickness of the second CGL 150, the number or thickness of the second ETL 126, the number or thickness of the HBL, the number or thickness of the EBL, the number or thickness of the HIL, the number or thickness of the second EML 124, the number or thickness of the third EML 134, the number or thickness of the organic layers disposed between the second electrode 104 and the third EML 134, or the number or thickness of the organic layers disposed between the third EML 134 and the second EML 124. Alternatively, the emission position L2 of the second EML 124 may be within a range of 1,900 Å to 2,400 Å from the reflective surface of the second electrode 104.

Therefore, the emission position L2 of the second EML 124 may be within a range of 1,900 Å to 2,400 Å from the second electrode 104 irrespective of at least one among the number of the fourth organic layers, a thickness of the fourth organic layer, the number of the third organic layers, a thickness of the third organic layer, the number of the third EMLs, a thickness of the third EML, the number of the second EMLs, and a thickness of the second EML. Alternatively, the emission position L2 of the second EML 124 may be within a range of 1,900 Å to 2,400 Å from the reflective surface of the second electrode 104 irrespective of at least one among the number of the fourth organic layers, a thickness of the fourth organic layer, the number of the third organic layers, a thickness of the third organic layer, the number of the third EMLs, a thickness of the third EML, the number of the second EMLs, and a thickness of the second EML.

The first emission part 110 may include a first HTL 112, a first EML 114, and a first ETL 116 which are disposed on the first electrode 102.

Although not shown, an HIL may be further formed. The HIL may be disposed on the first electrode 102 and enables a hole, supplied from the first electrode 102, to be smoothly injected. An HBL may be further formed on the first ETL 116. The first ETL 116 and the HBL may be provided as one layer or single layer.

An HBL may be further formed on the first EML 114. The first EML 114 and the HBL may be provided as one layer or single layer.

An EBL may be further formed under the first EML 114. The first HTL 112 and the EBL may be provided as one layer or single layer.

The first EML 114 may include a blue emission layer or a blue emission layer that includes an auxiliary emission layer emitting a different color. The blue emission layer may include one among a blue emission layer, a deep blue emission layer, and a sky blue emission layer.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer may be further improved. When the first EML 114 is provided along with the auxiliary emission layer, the yellow-green emission layer, the red emission layer, or the green emission layer may be disposed on or under the first EML 114. Also, the yellow-green emission layer, the red emission layer, or the green emission layer may be identically or differently provided as the auxiliary emission layer on and under the first EML 114. The positions or number of emission layers may be selectively determined depending on a structure and a characteristic of an organic light emitting device, but the present embodiment is not limited thereto.

When the auxiliary emission layer is provided in the first EML 114, a peak wavelength of an emission area of the first EML 114 may be within a range of 440 nm to 650 nm. Here, the peak wavelength may be an emission area.

A first CGL 140 may be further formed between the first emission part 110 and the second emission part 120. The first CGL 140 may include an N-type CGL and a P-type CGL.

Each of the first EML 114, the first ETL 116, the first CGL 140, the second HTL 122, the HBL, the EBL, and the HTL may be referred to as an organic layer. All organic layers between the second EML 124 and the first EML 114, and the first EML 114 may be referred to as an organic layer. Therefore, all organic layers between the second EML 124 and the first EML 114 may be referred to as a second organic layer.

The emission position L3 of the first EML 114 may be within a range of 2,800 Å to 3,200 Å from the second electrode 104 irrespective of at least one among the number or thickness of the second HTL 122, the number or thickness of the first CGL 140, the number or thickness of the EBL, the number or thickness of the HIL, the number or thickness of the HBL, the number or thickness of the first ETL 116, the number or thickness of the first EML 114, the number or thickness of the second EML 124, the number or thickness of the third EML 134, the number or thickness of the organic layers disposed between the second electrode 104 and the third EML 134, the number or thickness of the organic layers disposed between the third EML 134 and the second EML 124, or the number or thickness of the organic layers disposed between the second EML 124 and the first EML 114. Alternatively, the emission position L3 of the first EML 114 may be within a range of 2,800 Å to 3,200 Å from the reflective surface of the second electrode 104.

Therefore, the emission position L3 of the first EML 114 may be within a range of 2,800 Å to 3,200 Å from the second electrode 104 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, and a thickness of the first EML. Alternatively, the emission position L3 of the first EML 114 may be within a range of 2,800 Å to 3,200 Å from the reflective surface of the second electrode 104 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, and a thickness of the first EML.

Moreover, the first HTL 112, the EBL, and the HIL which are disposed between the first EML 114 and the substrate 101 may be referred to as an organic layer. Therefore, all layers which are disposed between the first EML 114 and the substrate 101 and include the first electrode 102 may be referred to as an organic layer. All the layers between the first EML 114 and the substrate 101 may be referred to as a first organic layer.

The position L0 of the first electrode 102 may be within a range of 4,500 Å to 6,000 Å from the second electrode 104 irrespective of at least one among the number or thickness of the first HTL 112, the number or thickness of the HIL, the number or thickness of the EBL, the number or thickness of the first electrode 102, the number or thickness of the first EML 114, the number or thickness of the second EML 124, the number or thickness of the third EML 134, the number or thickness of the organic layers between the second electrode 104 and the third EML 134, the number or thickness of the organic layers between the third EML 134 and the second EML 124, the number or thickness of the organic layers between the second EML 124 and the first EML 114, or the number or thickness of the organic layers between the first EML 114 and the substrate 101. Alternatively, the position L0 of the first electrode 102 may be within a range of 4,500 Å to 6,000 Å from the reflective surface of the second electrode 104.

Therefore, the position L0 of the first electrode 102 may be within a range of 4,500 Å to 6,000 Å from the second electrode 104 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, a thickness of the first EML, the number of the first organic layers, and a thickness of the first organic layer. Alternatively, the position L0 of the first electrode 102 may be within a range of 4,500 Å to 6,000 Å from the reflective surface of the second electrode 104 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, a thickness of the first EML, the number of the first organic layers, and a thickness of the first organic layer.

The structure illustrated in FIG. 5 is an example of the present invention, and may be selectively changed depending on a structure or a characteristic of an organic light emitting device. However, the present embodiment is not limited thereto.

Figure 6:
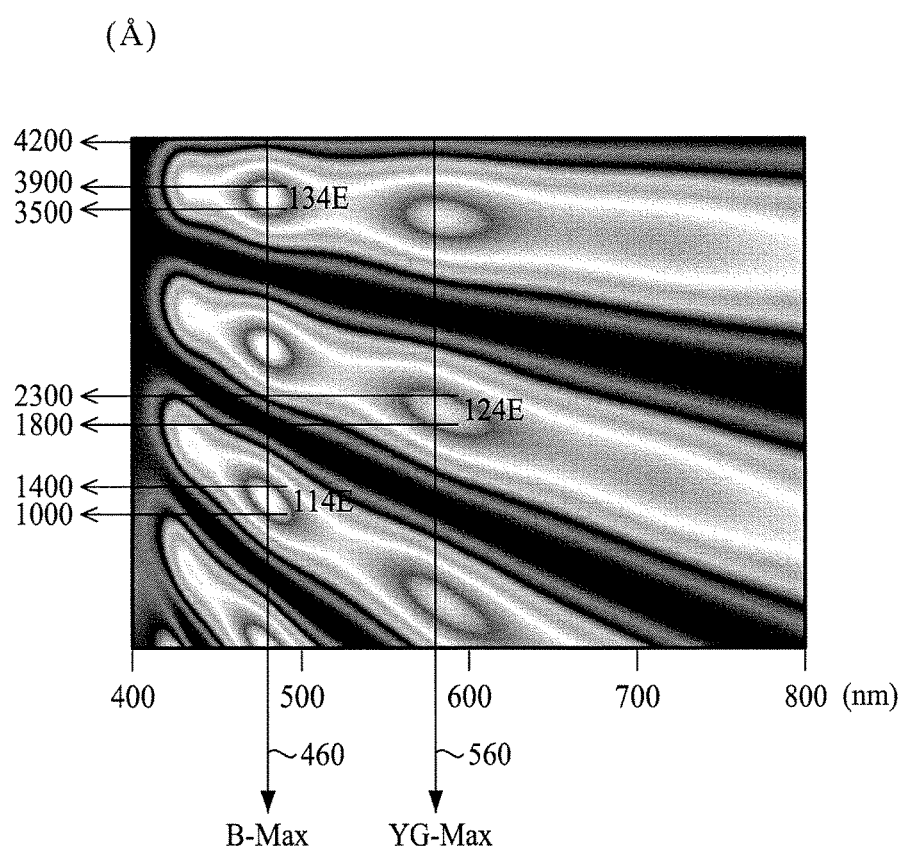
FIG. 6 is a diagram illustrating an emission position of an organic light emitting device according to the second embodiment of the present invention.

FIG. 6 is a diagram illustrating an emission position of an organic light emitting device according to the second embodiment of the present invention.

In FIG. 6, the abscissa axis indicates a wavelength range of light, and the ordinate axis indicates emission positions of emission layers configuring the emission part from the second electrode 104 and may be referred to as a contour map. Here, when the EPEL structure according to an embodiment of the present invention is applied except the first electrode 102 and the second electrode 104, FIG. 6 shows the emission positions of the emission layers at an emission peak. Also, FIG. 6 shows emission positions of emission layers having a maximum emission range in emission areas of the emission layers. FIG. 6 shows emission positions of the emission layers with a thickness of all organic layers being 4,200 Å except the first electrode 102 and the second electrode 104. The thickness of all the organic layers does not limit details of the present invention.

Since the third EML 134 configuring the third emission part 130 is the blue emission layer, a peak wavelength range of the emission area of the third EML 134 may be 440 nm to 480 nm. When light is emitted at 460 nm that is a maximum wavelength "B-Max" of the blue emission layer, maximum efficiency is obtained in a white color area of the contour map.

Therefore, an emission position of the third EML 134 is set to a range of 300 Å to 700 Å, and thus, an emission peak 134E of the third EML 134 is located at 460 nm that is the maximum wavelength "B-Max". Thus, the third EML 134 emits light at 460 nm that is the maximum wavelength "B-Max", thereby obtaining maximum efficiency. In FIG. 6, the emission position 134E of the third EML 134 is illustrated as 3,500 Å to 3,900 Å, which is a value that is obtained by subtracting 3,500 Å to 3,900 Å from 4,200 Å that is a thickness of all organic layers. Accordingly, the emission position 134E of the third EML 134 may be within a range of 300 Å to 700 Å. This may be identically applied to an emission position of the second EML 124 and an emission position of the first EML 114.

Moreover, when the third EML 134 is configured with one among the blue emission layer and the yellow-green emission layer, the blue emission layer and the red emission layer, and the blue emission layer and the green emission layer, or is configured by a combination thereof, a peak wavelength range of the emission area of the third EML 134 may be 440 nm to 650 nm. The blue emission layer may include one among a blue emission layer, a deep blue emission layer, and a sky blue emission layer.

Since the second EML 124 configuring the second emission part 120 is the yellow-green emission layer, a peak wavelength range of the emission area of the second EML 124 may be a range of 510 nm to 580 nm. When light is emitted at 560 nm that is a maximum wavelength "YG-Max" of the blue emission layer, maximum efficiency is obtained in the white color area of the contour map.

Therefore, an emission position of the second EML 124 is within a range of 1,900 Å to 2,400 Å from the second electrode 104, and thus, an emission peak 124E of the second EML 124 is located at 560 nm that is the maximum wavelength "YG-Max". Thus, the second EML 124 emits light at 560 nm that is the maximum wavelength "YG-Max", thereby obtaining maximum efficiency.

The second EML 124 of the second emission part 120 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the second EML 124, maximum efficiency is obtained in the white color area of the contour map.

Moreover, the second EML 124 of the second emission part 120 may be configured with two layers (for example, a red emission layer and a green emission layer) depending on a characteristic or a structure of an organic light emitting device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the second EML 124, maximum efficiency is obtained in the white color area of the contour map.

Moreover, the second EML 124 of the second emission part 120 may be configured with two layers (for example, a red emission layer and a yellow-green emission layer) depending on a characteristic or a structure of an organic light emitting device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the second EML 124, maximum efficiency is obtained in the white color area of the contour map.

Therefore, when the second EML 124 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the second EML 124 may be 510 nm to 650 nm. In this case, when light is emitted at 510 nm to 650 nm that is the emission area of the second EML 124, maximum efficiency is obtained in the white color area of the contour map.

Since the first EML 114 configuring the first emission part 110 is the blue emission layer, a peak wavelength range of the emission area of the first EML 114 may be a range of 440 nm to 480 nm. When light is emitted at 460 nm that is the maximum wavelength "B-Max" of the blue emission layer, maximum efficiency is obtained in the white color area of the contour map.

Therefore, an emission position of the first EML 114 is within a range of 2,800 Å to 3,200 Å, and thus, an emission peak 114E of the first EML 114 is located at 460 nm that is the maximum wavelength "B-Max". Thus, the first EML 114 emits light at 460 nm that is the maximum wavelength "B-Max", thereby obtaining maximum efficiency.

Moreover, when the first EML 114 is configured with one among the blue emission layer and the yellow-green emission layer, the blue emission layer and the red emission layer, and the blue emission layer and a green emission layer, or is configured by a combination thereof, a peak wavelength range of the emission area of the first EML 114 may be 440 nm to 650 nm. The blue emission layer may include one among a blue emission layer, a deep blue emission layer, and a sky blue emission layer.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

In other words, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. That is, a peak wavelength may be an emission area. Therefore, a maximum emission range of the first EML may be 440 nm to 470 nm, a maximum emission range of the second EML may be 530 nm to 570 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 7:
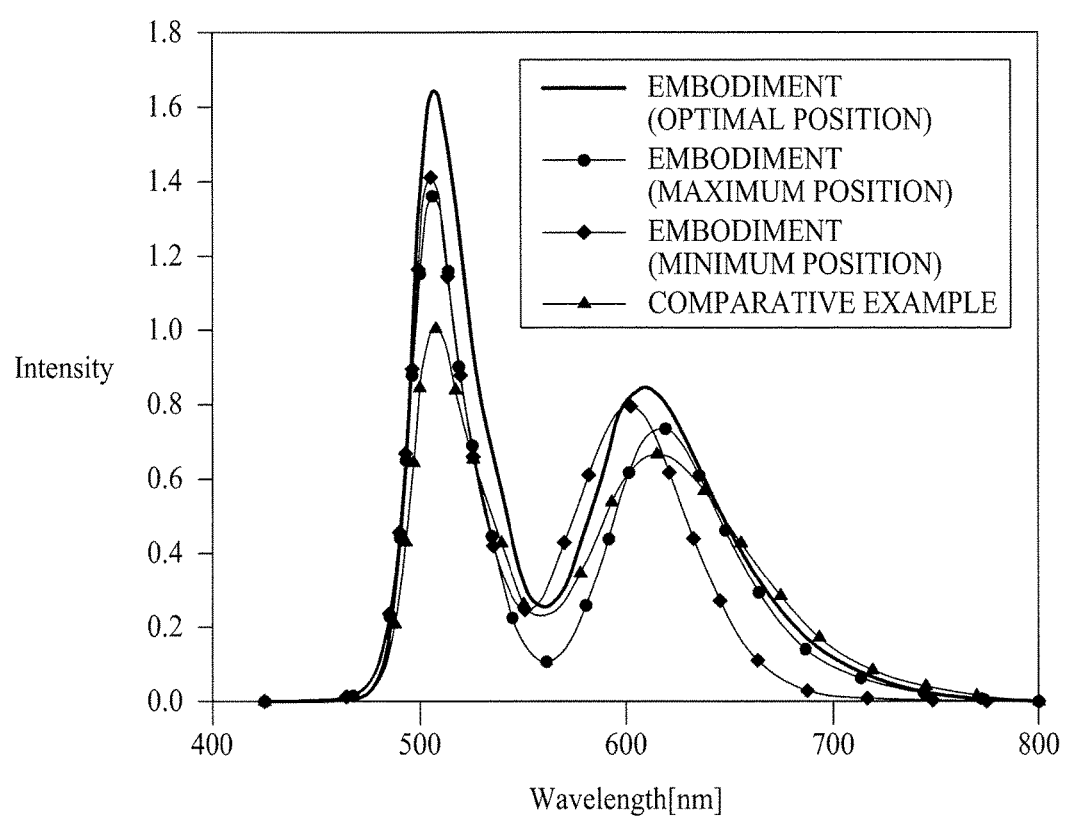
FIG. 7 is a diagram illustrating an EL spectrum according to the second embodiment of the present invention and a comparative example.

FIG. 7 is a diagram illustrating an EL spectrum according to the second embodiment of the present invention and a comparative example.

That is, FIG. 7 shows an emission intensity of a bottom emission type having a structure, where a blue emission layer and a yellow-green emission layer are stacked, by comparing a comparative example and a case where the EPEL structure according to an embodiment of the present invention is applied.

In FIG. 7, the abscissa axis indicates a wavelength range of light, and the ordinate axis indicates emission intensity. The emission intensity is a numerical value that is expressed as a relative value with respect to a maximum value of an EL spectrum.

In FIG. 7, a minimum position according to an embodiment is a portion which is set as a minimum position when emission positions of emission layers are set. For example, when the emission position L1 of the third EML 134 is within a range of 300 Å to 700 Å from the second electrode 104, the minimum position is set to 300 Å.

A maximum position according to an embodiment is a portion which is set as a maximum position when emission positions of emission layers are set. For example, when the emission position L1 of the third EML 134 is within a range of 300 Å to 700 Å from the second electrode 104, the maximum position is set to 700 Å.

An optimal position according to an embodiment is a portion which is set as an emission position according to a first embodiment of the present invention. For example, when the emission position L1 of the third EML 134 is within a range of 300 Å to 700 Å from the second electrode 104, an emission position according to an embodiment is set to 300 Å to 700 Å.

As shown in FIG. 7, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light. Also, it can be seen that emission intensity is reduced at 510 nm to 580 nm that is a peak wavelength range of yellow-green light, and is out of a peak wavelength range of the yellow-green light. Also, it can be seen that emission intensity is considerably reduced at 600 nm to 650 nm that is a peak wavelength range of red light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light. Therefore, blue light emission efficiency is reduced. Also, it can be seen that emission intensity is reduced at 510 nm to 580 nm that is the peak wavelength range of the yellow-green light, and is out of a peak wavelength range of the yellow-green light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 3. When it is assumed that efficiency of a comparative example is 100%, the following Table 2 shows efficiency of a second embodiment of the present invention.

In the following Table 3, the comparative example relates to a bottom emission type white light emitting device having a structure where a blue emission layer and a yellow-green emission layer are stacked. Also, an embodiment relates to a bottom emission type white light emitting device when an optimal position of the EPEL structure according to an embodiment of the present invention is applied.

TABLE 3

| Division | Red (R) Efficiency | Green (G) Efficiency | Blue (B) Efficiency | White (W) Efficiency | Average |
|---|---|---|---|---|---|
| Comparative Example | 100% | 100% | 100% | 100% | 100% |
| Embodiment (Optimal Position) | 91% | 125% | 147% | 119% | 120% |

As shown in Table 3, in comparison with the comparative example, when it is assumed that efficiency of the comparative example is 100% in a case where the EPEL structure is applied, it can be seen that green efficiency increases by about 25%. Also, it can be seen that blue efficiency increases by about 47%, and white efficiency increases by about 19%. Also, it can be seen that average efficiency increases by about 20% in comparison with the comparative example.

A panel efficiency of a white light emitting device having the EPEL structure and a panel efficiency of a comparative example are as listed in the following Table 4.

When it is assumed that an efficiency of an optimal position according to an embodiment is 100%, the following Table 4 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 4

| Division | Red (R) Efficiency | Green (G) Efficiency | Blue (B) Efficiency | White (W) Efficiency | Average |
|---|---|---|---|---|---|
| Embodiment (Minimum Position) | 44% | 71% | 74% | 66% | 64% |
| Embodiment (Optimal Position) | 100% | 100% | 100% | 100% | 100% |
| Embodiment (Maximum Position) | 157% | 91% | 85% | 103% | 109% |

As shown in Table 4, it can be seen that efficiencies of red, green, blue, and white are all reduced in a boundary between the embodiment (the minimum position) and the embodiment (the maximum position). To provide a description on comparison of Table 2 according to the first embodiment of the present invention and Table 4 according to the second embodiment of the present invention, it can be seen that efficiencies of red, green, blue, and white are more enhanced in a boundary of the embodiment (the minimum position) and the embodiment (the maximum position). Therefore, according to the second embodiment of the present invention, an organic light emitting display apparatus with more enhanced efficiency is provided. Also, it can be seen that efficiencies of red, green, blue, and white are more reduced in the embodiment (the minimum position) than the embodiment (the maximum position). Accordingly, when an emission position of the EPEL structure is out of an optimal position, it can be seen that panel efficiency is reduced.

As described above in the second embodiment of the present invention, the organic light emitting device may be a bottom emission type organic light emitting device.

A position of the first electrode may be within a range of 4,500 Å to 6,000 Å from the second electrode.

An emission position of the third EML may be within a range of 300 Å to 700 Å from the second electrode.

An emission position of the second EML may be within a range of 1,900 Å to 2,400 Å from the second electrode.

An emission position of the first EML may be within a range of 2,800 Å to 3,200 Å from the second electrode.

The first EML may be configured with one among a blue emission layer, a blue emission layer and a yellow-green emission layer, a blue emission layer and a red emission layer, and a blue emission layer and a green emission layer, or may be configured by a combination thereof.

The second EML may be configured with one among a yellow-green emission layer, a yellow emission layer and a red emission layer, a red emission layer and a green emission layer, and a yellow-green emission layer and a red emission layer, or may be configured by a combination thereof.

The third EML may be configured with one among a blue emission layer, a blue emission layer and a yellow-green emission layer, a blue emission layer and a red emission layer, or a blue emission layer and a green emission layer, or may be configured by a combination thereof.

An emission area of the first EML may be a range of 440 nm to 650 nm, an emission area of the second EML may be a range of 510 nm to 650 nm, and an emission area of the third EML may be a range of 440 nm to 650 nm.

A maximum emission range of the first EML may be a range of 440 nm to 470 nm, a maximum emission range of the second EML may be a range of 530 nm to 570 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 8:
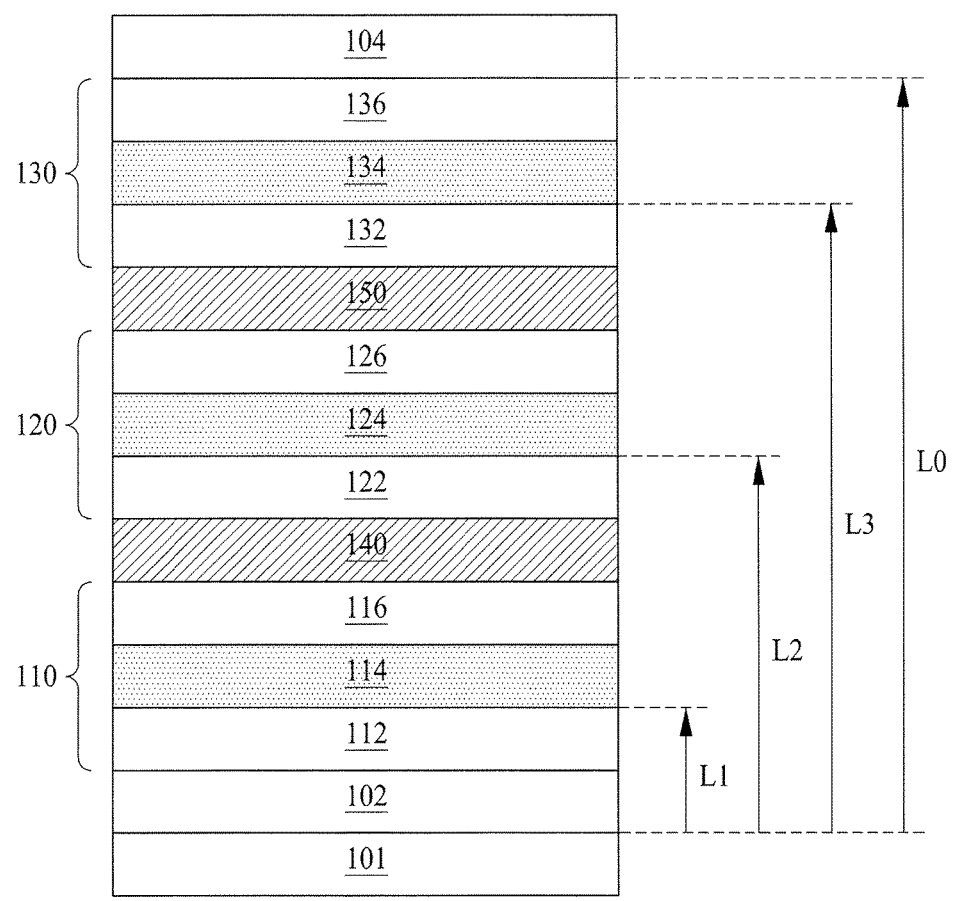
FIG. 8 is a diagram illustrating a white organic light emitting device according to a third embodiment of the present invention.

FIG. 8 is a diagram illustrating a white organic light emitting device according to a third embodiment of the present invention.

In the present embodiment, emission positions of emission layers are set from a first electrode, and may be set from the first electrode depending on a device design.

The position of the second electrode 104 is set to within 4,500 Å to 6,000 Å from the second electrode 104. Also, emission peaks of the emission layers configuring the first to third emission parts 110, 120 and 130 are located at a specific wavelength, and light having the specific wavelength is emitted, thereby improving emission efficiency. Also, the first to third emission parts 110, 120 and 130 have the EPEL structure that has a maximum emission range in emission areas of the first to third emission layers.

The first emission part 110 may include a first HTL 112, a first EML 114, and a first ETL 116, and which are disposed on the second electrode 104.

Although not shown, an HIL may be further formed. The HIL may be disposed on the first electrode 102 and enables a hole, supplied from the first electrode 102, to be smoothly injected. An HBL may be further formed on the first EML 114. The first ETL 116 and the HBL may be provided as one layer or single layer.

An EBL may be further formed under the first EML 114. The first HTL 112 and the EBL may be provided as one layer or single layer.

The first EML 114 may include a blue emission layer or a blue emission layer that includes an auxiliary emission layer emitting a different color. The blue emission layer may include one among a blue emission layer, a deep blue emission layer, and a sky blue emission layer.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer may be further improved. When the first EML 114 is provided along with the auxiliary emission layer, the yellow-green emission layer, the red emission layer, or the green emission layer may be disposed on or under the first EML 114. Moreover, the yellow-green emission layer, the red emission layer, or the green emission layer may be identically or differently provided as the auxiliary emission layer on and under the first EML 114. The positions or number of emission layers may be selectively determined depending on a structure and a characteristic of a device, but the present embodiment is not limited thereto.

When the auxiliary emission layer is provided in the first EML 114, a peak wavelength of an emission area of the first EML 114 may be within a range of 440 nm to 650 nm. Here, the peak wavelength may be an emission area.

Each of the first HTL 112, the EBL, and the HIL may be referred to as an organic layer. All organic layers between the substrate 101 and the first EML 114, and the first electrode 102 may be referred to as an organic layer. Therefore, all organic layers between the substrate 101 and the first EML 114 may be referred to as a first organic layer.

An emission position L1 of the first EML 114 may be set to be located within a range of 2,000 Å to 2,650 Å from the second electrode 104 irrespective of at least one among the number or thickness of the first HTL 112, the number or thickness of the first electrode 102, the number or thickness of the EBL, the number or thickness of the HIL, or the number or thickness of the organic layers disposed between the substrate 101 and the first EML 114. Alternatively, the emission position L1 of the first EML 114 may be within a range of 2,000 Å to 2,650 Å from an interface of the substrate 101 and the first electrode 102.

Therefore, the emission position L1 of the first EML 114 may be within a range of 2,000 Å to 2,650 Å from the first electrode 102 irrespective of at least one the number of the first organic layers and a thickness of the fourth organic layer. Alternatively, the emission position L1 of the first EML 114 may be within a range of 2,000 Å to 2,650 Å from the interface of the substrate 101 and the first electrode 102 irrespective of at least one the number of the first organic layers and a thickness of the first organic layer.

The second emission part 120 may include a second HTL 122, a second EML 124, and a second ETL 126.

An HIL may be further formed under the second HTL 122.

An HBL may be further formed on the second EML 124. The second ETL 126 and the HBL may be provided as one layer or single layer.

An EBL may be further formed under the second EML 124. The second HTL 122 and the EBL may be provided as one layer or single layer.

The second EML 124 may be configured with one among a yellow-green emission layer, a yellow emission layer and a red emission layer, the red emission layer and a green emission layer, and the yellow-green emission layer and the red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the second EML 124. Also, the yellow emission layer and the red emission layer, the red emission layer and the green emission layer, or the yellow-green emission layer and the red emission layer may be identically or differently provided as the auxiliary emission layer on and under the second EML 124.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the second EML 124 is configured with two layers (for example, the yellow emission layer and the red emission layer), an emission efficiency of the red emission layer may increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the second EML 124 is configured with two layers (for example, the red emission layer and the green emission layer), a color reproduction rate can be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the second EML 124 is configured with two layers (for example, the yellow emission layer and the red emission layer), an emission efficiency of the red emission layer may increase.

Moreover, the second EML 124 of the second emission part 120 may be configured with two layers (for example, the red emission layer and the yellow-green emission layer) depending on a characteristic or a structure of an organic light emitting device. A peak wavelength of an emission area of the red emission layer may be within a range of 600 nm to 650 nm. A peak wavelength of an emission area of the yellow-green emission layer may be within a range of 510 nm to 580 nm. When the second EML 124 is configured with two layers (for example, the red emission layer and the yellow-green emission layer), an emission efficiency of the red emission layer can increase. In this case, a peak wavelength of an emission area of the second EML 124 may be within a range of 510 nm to 650 nm. Here, the peak wavelength may be an emission area.

When the second EML 124 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the second EML 124 may be within a range of 510 nm to 650 nm. Here, the peak wavelength may be an emission area.

A first CGL 140 may be further formed between the first emission part 110 and the second emission part 120. The first CGL 140 may include an N-type CGL and a P-type CGL.

Each of the first EML 114, the first ETL 116, the first CGL 140, the second HTL 122, the HBL, the EBL, and the HTL may be referred to as an organic layer. All organic layers between the second EML 124 and the first EML 114, and the first EML 114 may be referred to as an organic layer. Therefore, all organic layers between the second EML 124 and the first EML 114 may be referred to as a second organic layer.

The emission position L2 of the second EML 124 may be within a range of 2,750 Å to 3,500 Å from the first electrode 102 irrespective of at least one among the number or thickness of the first ETL 116, the number or thickness of the second HTL 122, the number or thickness of the first CGL 140, the number or thickness of the HBL, the number or thickness of the EBL, the number or thickness of the HIL, the number or thickness of the first EML 114, the number or thickness of organic layers between the substrate 101 and the first EML 114, or the number or thickness of organic layers disposed between the first EML 114 and the second EML 124. Alternatively, the emission position L2 of the second EML 124 may be within a range of 2,750 Å to 3,500 Å from the interface of the substrate 101 and the first electrode 102.

Therefore, the emission position L2 of the second EML 124 may be within a range of 2,750 Å to 3,500 Å from the first electrode 102 irrespective of at least one among the number of the first organic layers, a thickness of the first organic layer, the number of the second organic layers, a thickness of the second organic layer, the number of the first EMLs, and a thickness of the first EML. Alternatively, the emission position L2 of the second EML 124 may be within a range of 2,750 Å to 3,500 Å from the interface of the substrate 101 and the first electrode 102 irrespective of at least one among the number of the first organic layers, a thickness of the first organic layer, the number of the second organic layers, a thickness of the second organic layer, the number of the first EMLs, and a thickness of the first EML.

The third emission part 130 may include a third ETL 136, a third EML 134, and a third HTL 132 which are disposed under the second electrode 104.

Although not shown, an EIL may be further formed on the third ETL 136. An HIL may be further formed under the third HTL 132. An HBL may be further formed on the third EML 134. The third ETL 136 and the HBL may be provided as one layer or single layer.

An EBL may be further formed under the third EML 134. The third EML 132 and the EBL may be provided as one layer or single layer.

The third EML 134 may include a blue emission layer or a blue emission layer that includes an auxiliary emission layer emitting a different color. The blue emission layer may include one among a blue emission layer, a deep blue emission layer, and a sky blue emission layer.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the third EML 134 is provided along with the auxiliary emission layer, the yellow-green emission layer, the red emission layer, or the green emission layer may be disposed on or under the third EML 134. Also, the yellow-green emission layer, the red emission layer, or the green emission layer may be identically or differently provided as the auxiliary emission layer on and under the third EML 134. The positions or number of emission layers may be selectively determined depending on a structure and a characteristic of an organic light emitting device, but the present embodiment is not limited thereto.

When the auxiliary emission layer is provided in the third EML 134, a peak wavelength of an emission area of the third EML 134 may be within a range of 440 nm to 650 nm. Here, the peak wavelength may be an emission area.

A second CGL 150 may be further formed between the second emission part 120 and the third emission part 130. The second CGL 150 may include an N-type CGL and a P-type CGL.

Each of the second EML 124, the second ETL 126, the third HTL 132, the second CGL 150, the HIL, the EBL, and the HBL may be referred to as an organic layer. All organic layers between the second EML 124 and the third EML 134, and the second EML 124 may be referred to as an organic layer. Therefore, all organic layers between the second EML 124 and the third EML 134 may be referred to as a third organic layer.

An emission position L3 of the third EML 134 may be within a range of 4,500 Å to 5,100 Å from the first electrode 102 irrespective of at least one among the number or thickness of the second EML 124, the number or thickness of the second ETL 126, the number or thickness of the third HTL 132, the number or thickness of the second CGL 150, the number or thickness of the HIL, the number or thickness of the EBL, the number or thickness of the HBL, the number or thickness of the first EML 114, the number or thickness of organic layers between the substrate 101 and the first EML 114, the number or thickness of organic layers between the first EML 114 and the second EML 124, or the number or thickness of the organic layers between the second EML 124 and the third EML 134. Alternatively, the emission position L3 of the third EML 134 may be within a range of 4,500 Å to 5,100 Å from the interface of the substrate 101 and the first electrode 102.

Therefore, the emission position L3 of the third EML 134 may be within a range of 4,500 Å to 5,100 from the first electrode 102 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML. Alternatively, the emission position L3 of the third EML 134 may be within a range of 4,500 Å to 5,100 from the interface of the substrate 101 and the first electrode 102 irrespective of at least one among the number of the fourth organic layers, a thickness of the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML.

Moreover, the third HTL 134, the third ETL 136, the HBL, and the EIL may be referred to as an organic layer. Therefore, all layers between the third EML 134 and the second electrode 104 may be referred to as an organic layer. All the layers between the third EML 134 and the second electrode 104 may be referred to as a first organic layer.

A position L0 of the second electrode 104 may be within a range of 4,500 Å to 6,000 Å from the first electrode 102 irrespective of at least one among the number or thickness of the third ETL 136, the number or thickness of the EIL, the number or thickness of the HBL, the number or thickness of the third EML 134, the number or thickness of the second EML 124, the number or thickness of the first EML 114, the number or thickness of organic layers between the substrate 101 and the first EML 114, the number or thickness of organic layers between the first EML 114 and the second EML 124, and the number or thickness of organic layers between the third EML 134 and the second electrode 104. Alternatively, the position L0 of the second electrode 104 may be within a range of 4,500 Å to 6,000 Å from the interface of the substrate 101 and the first electrode 102.

Therefore, the position L0 of the second electrode 104 may be within a range of 4,500 Å to 6,000 Å from the first electrode 102 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML. Alternatively, the position L0 of the second electrode 104 may be within a range of 4,500 Å to 6,000 Å from the interface of the substrate 101 and the first electrode 102 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML.

Here, the emission position L3 of the third EML 134 may be within a range of 4,500 Å to 5,100 Å from the first electrode 102. Also, the position L0 of the second electrode 104 is within a range of 4,500 Å to 6,000 Å from the first electrode 102. Also, when the emission position L3 of the third EML 134 is set to 4,500 Å from the first electrode 102, the position L0 of the second electrode 104 is set to be located within a range of 4,550 Å to 6,000 Å from the first electrode 102. Also, when the emission position L3 of the third EML 134 is set to 5,100 Å from the first electrode 102, the position L0 of the second electrode 104 is within a range of 5,150 Å to 6,000 Å from the first electrode 102.

Therefore, the present invention may set the position of the second electrode 104 and positions of emission layers from the first electrode 102 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML.

The structure illustrated in FIG. 8 is an example of the present invention, and may be selectively changed depending on a structure or a characteristic of an organic light emitting device. However, the present embodiment is not limited thereto.

Figure 9:
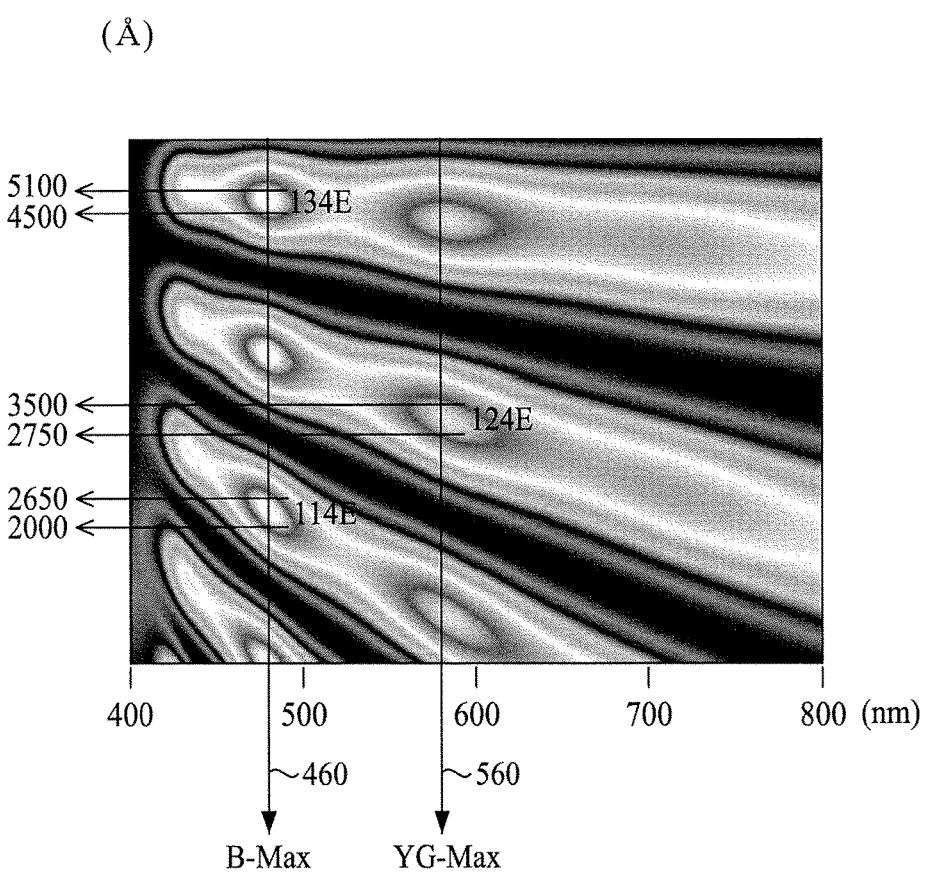
FIG. 9 is a diagram illustrating an emission position of an organic light emitting device according to the third embodiment of the present invention.

FIG. 9 is a diagram illustrating an emission position of an organic light emitting device according to the third embodiment of the present invention.

In FIG. 9, the abscissa axis indicates a wavelength range of light, and the ordinate axis indicates emission positions of emission layers configuring the emission part from the first electrode 102 and may be referred to as a contour map. Here, when the EPEL structure according to an embodiment of the present invention is applied except the second electrode 104, FIG. 9 shows the emission positions of the emission layers at an emission peak. Also, FIG. 9 shows emission positions of emission layers having a maximum emission range in emission areas of the emission layers. Since the first EML 114 configuring the first emission part 110 is the blue emission layer, a peak wavelength range of an emission area of the first EML 114 may be 440 nm to 480 nm. When light is emitted at 460 nm that is a maximum wavelength "B-Max" of the blue emission layer, maximum efficiency is obtained in a white color area of the contour map.

Therefore, an emission position of the first EML 114 is within a range of 2,000 Å to 2,650 Å, and thus, the emission peak 114E of the first EML 114 is located at 460 nm that is the maximum wavelength "B-Max". Thus, the first EML 114 emits light at 460 nm that is the maximum wavelength "B-Max", thereby obtaining maximum efficiency.

Moreover, when the first EML 114 is configured with one among the blue emission layer and the yellow-green emission layer, the blue emission layer and the red emission layer, and the blue emission layer and the green emission layer, or is configured by a combination thereof, a peak wavelength range of the emission area of the first EML 114 may be 440 nm to 650 nm. The blue emission layer may include one among a blue emission layer, a deep blue emission layer, and a sky blue emission layer.

Since the second EML 124 configuring the second emission part 120 is the yellow-green emission layer, a peak wavelength range of the emission area of the second EML 124 may be a range of 510 nm to 580 nm. When light is emitted at 560 nm that is a maximum wavelength "YG-Max" of the blue emission layer, maximum efficiency is obtained in the white color area of the contour map.

Therefore, an emission position of the second EML 124 is set to within a range of 2,750 Å to 3,500 Å from the second electrode 104, and thus, the emission peak 124E of the second EML 124 is located at 560 nm that is the maximum wavelength "YG-Max". Thus, the second EML 124 emits light at 560 nm that is the maximum wavelength "YG-Max", thereby obtaining maximum efficiency.

The second EML 124 of the second emission part 120 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the second EML 124, maximum efficiency is obtained in the white color area of the contour map.

Moreover, the second EML 124 of the second emission part 120 may be configured with two layers (for example, a red emission layer and a green emission layer) depending on a characteristic or a structure of an organic light emitting device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the second EML 124, maximum efficiency is obtained in the white color area of the contour map.

Moreover, the second EML 124 of the second emission part 120 may be configured with two layers (for example, a red emission layer and a yellow-green emission layer) depending on a characteristic or a structure of an organic light emitting device. A peak wavelength range of an emission area of the red emission layer may be a range of 600 nm to 650 nm. A peak wavelength range of an emission area of the yellow-green emission layer may be a range of 510 nm to 560 nm. In this case, therefore, when light is emitted at 510 nm to 650 nm that is the emission area of the second EML 124, maximum efficiency is obtained in the white color area of the contour map.

Therefore, when the second EML 124 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the second EML 124 may be 510 nm to 650 nm. In this case, when light is emitted at 510 nm to 650 nm that is the emission area of the second EML 124, maximum efficiency is obtained in the white color area of the contour map.

Since the third EML 134 configuring the third emission part 130 is the blue emission layer, a peak wavelength range of the emission area of the third EML 134 may be a range of 440 nm to 480 nm. When light is emitted at 460 nm that is the maximum wavelength "B-Max" of the blue emission layer, maximum efficiency is obtained in the white color area of the contour map.

Therefore, an emission position of the third EML 134 is within a range of 4,500 Å to 5,100 Å, and thus, an emission peak 134E of the third EML 134 is located at 460 nm that is the maximum wavelength "B-Max". Thus, the third EML 134 emits light at 460 nm that is the maximum wavelength "B-Max", thereby obtaining maximum efficiency.

Moreover, when the third EML 134 is configured with one among the blue emission layer and the yellow-green emission layer, the blue emission layer and the red emission layer, and the blue emission layer and a green emission layer, or is configured by a combination thereof, a peak wavelength range of the emission area of the third EML 134 may be 440 nm to 650 nm. The blue emission layer may include one among a blue emission layer, a deep blue emission layer, and a sky blue emission layer.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

In other words, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. That is, a peak wavelength may be an emission area. Therefore, a maximum emission range of the first EML may be 440 nm to 470 nm, a maximum emission range of the second EML may be 530 nm to 570 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific the number of layers within at least one among the first EMLs, the second EMLs, and the third EMLs, or the specific thickness of at least one among the first EML, the second EML, and the third EML.

Figure 10:
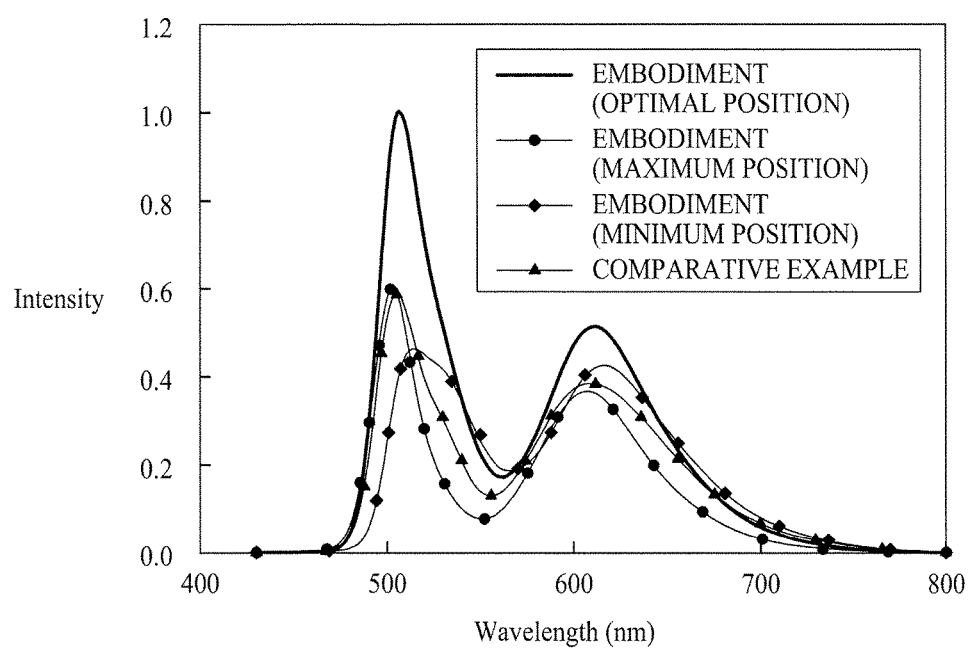
FIG. 10 is a diagram illustrating an EL spectrum according to the third embodiment of the present invention and a comparative example.

FIG. 10 is a diagram illustrating an EL spectrum according to the third embodiment of the present invention and a comparative example.

That is, FIG. 10 shows an emission intensity of a bottom emission type having a structure, where a blue emission layer and a yellow-green emission layer are formed, by comparing a comparative example and a case where the EPEL structure according to an embodiment of the present invention is applied. In FIG. 10, the abscissa axis indicates a wavelength range of light, and the ordinate axis indicates emission intensity. The emission intensity is a numerical value that is expressed as a relative value from a maximum value of an EL spectrum.

In FIG. 10, a minimum position according to an embodiment is a portion which is set as a minimum position when emission positions of emission layers are set. For example, when the emission position of the first EML 114 is within a range of 2,000 Å to 2,650 Å from the first electrode 102, the minimum position is set to 2,000 Å.

A maximum position according to an embodiment is a portion which is set as a maximum position when emission positions of emission layers are set. For example, when the emission position L1 of the first EML 114 is within a range of 2,000 Å to 2,650 Å from the first electrode 102, the maximum position is set to 2,650 Å.

An optimal position according to an embodiment is a portion which is set as an emission position according to a first embodiment of the present invention. For example, when the emission position L1 of the first EML 114 is within a range of 2,000 Å to 2,650 Å from the first electrode 102, an emission position according to an embodiment is set to 2,000 Å to 2,650 Å.

As shown in FIG. 10, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light, and is out of a peak wavelength range of the blue light. Also, it can be seen that emission intensity is reduced at 510 nm to 580 nm that is a peak wavelength range of yellow-green light. Also, it can be seen that emission intensity is out of a peak wavelength range at 600 nm to 650 nm that is a peak wavelength range of red light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light, and is out of a peak wavelength range of the blue light. Therefore, blue light emission efficiency is reduced. Also, it can be seen that emission intensity is considerably reduced at 510 nm to 580 nm that is the peak wavelength range of the yellow-green light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 5. When it is assumed that efficiency of a comparative example is 100%, the following Table 5 shows efficiency of a third embodiment of the present invention.

In the following Table 5, the comparative example relates to a bottom emission type white light emitting device having a structure where a blue emission layer and a yellow-green emission layer are stacked. Also, an embodiment relates to a bottom emission type white light emitting device when an optimal position of the EPEL structure according to an embodiment of the present invention is applied.

TABLE 5

| Division | Red (R) Efficiency | Green (G) Efficiency | Blue (B) Efficiency | White (W) Efficiency | Average |
|---|---|---|---|---|---|
| Comparative Example | 100% | 100% | 100% | 100% | 100% |
| Embodiment (Optimal Position) | 91% | 125% | 147% | 119% | 120% |

As shown in Table 5, in comparison with the comparative example, when it is assumed that efficiency of the comparative example is 100% in a case where the EPEL structure is applied, it can be seen that green efficiency increases by about 25%. Also, it can be seen that blue efficiency increases by about 47%, and white efficiency increases by about 19%. Also, it can be seen that average efficiency increases by about 20% in comparison with the comparative example.

A panel efficiency of a white light emitting device having the EPEL structure and a panel efficiency of a comparative example are as listed in the following Table 6.

When it is assumed that an efficiency of an optimal position according to an embodiment is 100%, the following Table 6 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 6

| Division | Red (R) Efficiency | Green (G) Efficiency | Blue (B) Efficiency | White (W) Efficiency | Average |
|---|---|---|---|---|---|
| Embodiment (Minimum Position) | 155% | 69% | 66% | 83% | 93% |
| Embodiment (Optimal Position) | 100% | 100% | 100% | 100% | 100% |
| Embodiment (Maximum Position) | 22% | 52% | 46% | 45% | 41% |

As shown in Table 6, it can be seen that efficiencies of red, green, blue, and white are all reduced in a boundary between the embodiment (the minimum position) and the embodiment (the maximum position). Also, it can be seen that efficiencies of red, green, blue, and white are more reduced in the embodiment (the maximum position) than the embodiment (the minimum position). Accordingly, when an emission position of the EPEL structure is out of an optimal position, it can be seen that panel efficiency is reduced.

As described above in the third embodiment of the present invention, the organic light emitting device may be a bottom emission type organic light emitting device.

A position of the second electrode may be within a range of 4,500 Å to 6,000 Å from the first electrode.

An emission position of the first EML may be within a range of 2,000 Å to 2,650 Å from the first electrode.

An emission position of the second EML may be within a range of 2,750 Å to 3,500 Å from the first electrode.

An emission position of the third EML may be within a range of 4,500 Å to 5,100 Å from the first electrode.

The first EML may be configured with one among a blue emission layer, a blue emission layer and a yellow-green emission layer, a blue emission layer and a red emission layer, and a blue emission layer and a green emission layer, or may be configured by a combination thereof.

The second EML may be configured with one among a yellow-green emission layer, a yellow emission layer and a red emission layer, a red emission layer and a green emission layer, and a yellow-green emission layer and a red emission layer, or may be configured by a combination thereof.

The third EML may be configured with one among a blue emission layer, a blue emission layer and a yellow-green emission layer, a blue emission layer and a red emission layer, or a blue emission layer and a green emission layer, or may be configured by a combination thereof.

An emission area of the first EML may be a range of 440 nm to 650 nm, an emission area of the second EML may be a range of 510 nm to 650 nm, and an emission area of the third EML may be a range of 440 nm to 650 nm.

A maximum emission range of the first EML may be a range of 440 nm to 470 nm, a maximum emission range of the second EML may be a range of 530 nm to 570 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

The above-described organic light emitting device according to embodiments of the present invention may be applied to a lighting device, may be used as a thin light source of an LCD apparatus, and may be applied to a display apparatus. Hereinafter, an embodiment where the organic light emitting device according to embodiments of the present invention is applied to a display apparatus will be described in detail.

Figure 11:
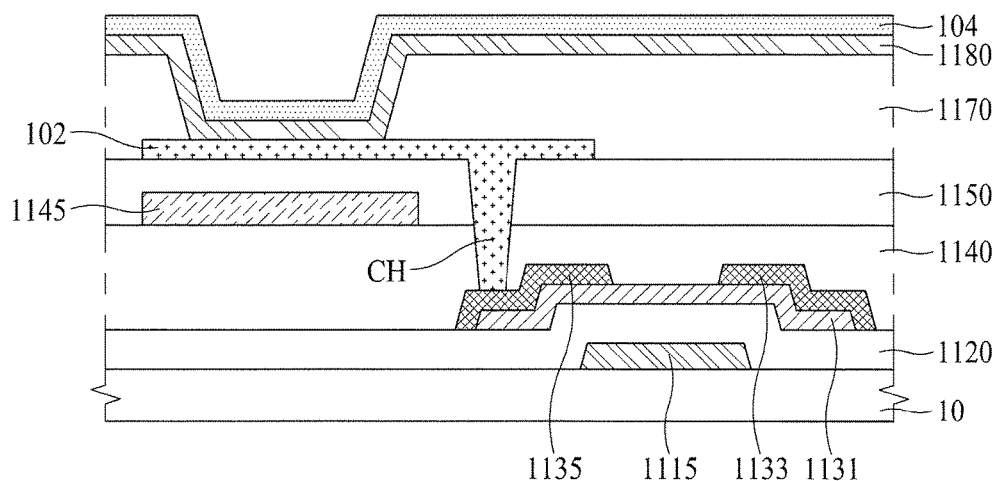
FIG. 11 is a diagram illustrating an organic light emitting device according to first to the third embodiments of the present invention.

FIG. 11 is a cross-sectional view illustrating an organic light emitting device 1000 according to an embodiment of the present invention, and uses the above-described organic light emitting device according to the first to third embodiments of the present invention.

As illustrated in FIG. 11, the organic light emitting device 1000 according to an embodiment of the present invention includes a substrate 10, a thin film transistor TFT, an overcoating layer 1150, a first electrode 102, an emission part 1180, and a second electrode 104. The TFT includes a gate electrode 1115, a gate insulator 1120, a semiconductor layer 1131, a source electrode 1133, and a drain electrode 1135.

In FIG. 11, the thin film transistor TFT is illustrated as having an inverted staggered structure, but may be formed in a coplanar structure.

The substrate 10 may be formed of glass, metal, or plastic.

The gate electrode 1115 may be formed on the substrate 10 and may be connected to a gate line (not shown). The gate electrode 1115 may include a multilayer formed of one selected from the group consisting of molybdenum (Mo), aluminum (Al), chromium (Cr), gold (Au), titanium (Ti), nickel (Ni), neodymium (Nd), and copper (Cu) or an alloy thereof.

The gate insulator 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulator 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper (not shown) may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may be formed of a single layer or a multilayer, and may be formed of one selected from the group consisting of molybdenum (Mo), aluminum (Al), chromium (Cr), gold (Au), titanium (Ti), nickel (Ni), neodymium (Nd), and copper (Cu) or an alloy thereof.

A passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

A color filter 1145 may be formed on the passivation layer 1140, and although only one sub-pixel is illustrated in the drawing, the color filter 1145 may be formed in each of a red sub-pixel, a blue sub-pixel, and a green sub-pixel. The color filter 1145 may include a red (R) color filter, a green (G) color filter, and a blue (B) color filter which are patterned and formed in respective sub-pixels. The color filter 1145 transmits light having only a specific wavelength among white lights emitted from the emission part 1180.

The overcoating layer 1150 may be formed on the color filter 1145 and may be formed of an acryl resin, a polyimide resin, SiOx, SiNx, or a multilayer thereof, but is not limited thereto.

The first electrode 102 may be formed on the overcoating layer 1150. The first electrode 102 may be electrically connected to the drain electrode 1135 through a contact hole CH which is formed in a certain area of the passivation layer 1140 and the overcoating layer 1150. In FIG. 11, the drain electrode 1135 is illustrated as being electrically connected to the first electrode 102, but the present embodiment is not limited thereto. As another example, the source electrode 1133 may be electrically connected to the first electrode 102 through the contact hole CH which is formed in the certain area of the passivation layer 1140 and the overcoating layer 1150.

A bank layer 1170 may be formed on the first electrode 102 and may define a pixel area. That is, the bank layer 1170 may be formed in a boundary area between a plurality of pixels, and thus, the pixel area may be defined by the bank layer 1170. The bank layer 1170 may be formed of an organic material such as a benzocyclobutene (BCB) resin, an acryl resin, or a polyimide resin. Alternatively, the bank layer 1170 may be formed of a photosensitive material containing a black pigment, and in this case, the bank layer 1170 may act as a light blocking member.

The emission part 1180 may be formed on the bank layer 1170. As illustrated in the first to third embodiments of the present invention, the emission part 1180 may include a first emission part 110, a second emission part 120, and a third emission part 130 which are formed on the first electrode 102.

The second electrode 1104 may be formed on the emission part 1180.

Although not shown in FIG. 11, an encapsulation part may be formed on the second electrode 104. The encapsulation part prevents moisture from penetrating into the emission part 1180. The encapsulation part may include a plurality of layers where different inorganic materials are stacked, or include a plurality of layers where an inorganic material and an organic material are alternately stacked. Also, an encapsulation substrate may be further formed on the encapsulation part. The encapsulation substrate may be formed of glass, plastic, or metal. The encapsulation substrate may be adhered to the encapsulation part by an adhesive.

In the above-described embodiment, a bottom emission type has been described as an example. In the bottom emission type, a polarizer is used for lowering a reflectance of an external light source. Due to the use of the polarizer, luminance decreases by about 60%.

The inventors have invented a top emission type white organic light emitting device having a new structure, where panel efficiency and emission efficiency of an emission layer are enhanced and luminance and an aperture ratio are enhanced because the polarizer is not used, through various experiments. An aperture ratio of the top emission type white organic light emitting device according to an embodiment of the present invention is more enhanced than that of the bottom emission type white organic light emitting device.

Figure 12:
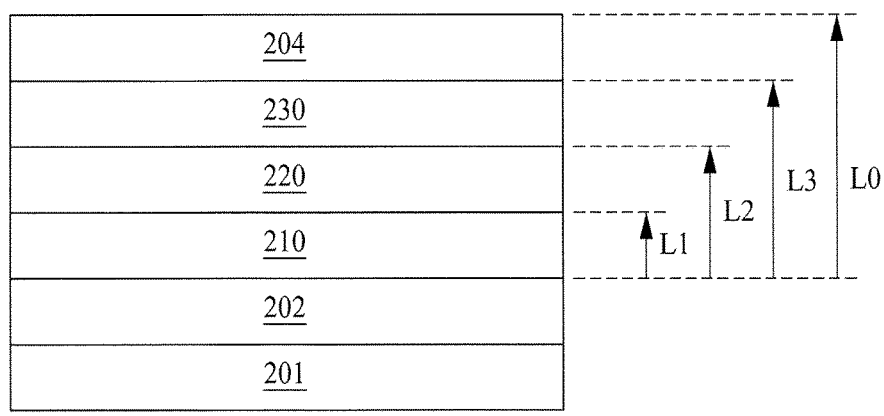
FIG. 12 is a schematic diagram illustrating a white organic light emitting device according to fourth and fifth embodiments of the present invention.

FIG. 12 is a schematic diagram illustrating a white organic light emitting device 200 according to fourth and fifth embodiments of the present invention.

The white organic light emitting device 200 illustrated in FIG. 12 includes first and second electrodes 202 and 204 and first to third emission parts 210, 220 and 230 disposed between the first and second electrodes 202 and 204.

The first electrode 202 is an anode that supplies a hole, and may be formed of Au, Ag, Al, Mo, or Mg, or may be formed of an alloy thereof. However, the present embodiment is not limited thereto. Alternatively, the first electrode 202 may be formed of ITO, IZO, or IGZO which is a transparent conductive material such as TCO, but the present embodiment is not limited thereto.

The second electrode 204 is a cathode that supplies an electron, and may be formed of ITO, IZO, or IGZO which is a transparent conductive material such as TCO, but the present embodiment is not limited thereto. Alternatively, the second electrode 204 may be formed of Au, Ag, Al, Mo, or Mg, or may be formed of an alloy thereof. However, the present embodiment is not limited thereto. Alternatively, the second electrode 204 may be formed of two layers of ITO, IZO, or IGZO and Au, Ag, Al, Mo, or Mg which is a metal material, but the present embodiment is not limited thereto.

Each of the first electrode 202 and the second electrode 204 may be referred to as an anode or a cathode.

The first electrode 202 may be formed of a reflective electrode, and the second electrode 204 may be formed of a semitransmissive electrode.

In the top emission type white organic light emitting device 200 according to an embodiment of the present embodiment, the first emission part 210, the second emission part 220, and the third emission part 230 which includes a blue emission layer may be disposed between the first electrode 202 and the second electrode 204, thereby improving an emission efficiency of an emission layer. Also, a position of the second electrode 204, an emission position of a first emission layer, an emission position of a second emission layer, and an emission position of a third emission layer may be set from the first electrode 202, thereby improving emission efficiency and panel efficiency. That is, an emission position of emitting layers (EPEL) structure may be applied to the first to third emission layers. Also, the first to third emission parts 210, 220 and 230 may have the EPEL structure which has a maximum emission range in emission areas of the first to third emission layers.

A position L0 of the second electrode 204 is within a range of 4,700 Å to 5,400 Å from the first electrode 202. Alternatively, the position L0 of the second electrode 204 may be within a range of 4,700 Å to 5,400 Å from a reflective surface of the first electrode 202. Also, emission peaks of emission layers configuring the first to third emission parts 210, 220 and 230 are located at a specific wavelength, and light having the specific wavelength is emitted, thereby improving emission efficiency. The emission peak may be referred to as an emission peak of an organic layer configuring the emission parts.

The position L0 of the second electrode 204 may be set from the first electrode 201, and an emission position L1 of the first emission part 210 closest to the first electrode 201 may be within a range of 150 Å to 700 Å. Alternatively, the emission position L1 of the first emission part 210 may be within a range of 150 Å to 700 Å from the reflective surface of the first electrode 201. The first emission part 210 may be configured with one among a blue emission layer, the blue emission layer and a yellow-green emission layer, the blue emission layer and a red emission layer, or the blue emission layer and a green emission layer, or may be configured by a combination thereof. The blue emission layer may include one from a blue emission layer, a deep blue emission layer, and a sky blue emission layer. The deep blue emission layer may be disposed in a short-wavelength range unlike the blue emission layer, and thus can enhance a color reproduction rate and luminance.

The emission position L1 of the first emission part 210 may be within a range of 150 Å to 700 Å from the first electrode 202 irrespective of at least one among a thickness of the emission layers, the number of the emission layers, a thickness of an organic layer, and the number of organic layers. Alternatively, the emission position L1 of the first emission part 210 may be within a range of 150 Å to 700 Å from the reflective surface of the first electrode 202. Therefore, an emission peak is located in a blue emission area, and light having a wavelength corresponding to the emission peak is emitted, thereby enabling the first emission part 210 to realize the maximum luminance. A peak wavelength of the emission area of the blue emission layer may be 440 nm to 480 nm. Also, an auxiliary emission layer of the first emission part 210 may be configured with one among a red emission layer, a green emission layer, and a yellow-green emission layer, or may be configured by a combination thereof. A peak wavelength of an emission area of each of the auxiliary emission layer and the emission layer configuring the first emission part 210 may be 440 nm to 650 nm. Here, the peak wavelength may be an emission area.

An emission position L2 of the second emission part 210 may be within a range of 1,600 Å to 2,300 Å from the first electrode 202. Alternatively, the emission position L2 of the second emission part 220 may be within a range of 1,600 Å to 2,300 Å from the reflective surface of the first electrode 202.

The second emission part 220 may be configured with a yellow-green emission layer. The emission position L2 of the second emission part 220 may be within a range of 1,600 Å to 2,300 Å from the first electrode 202 irrespective of at least one among a thickness of the emission layer, the number of the emission layers, a thickness of the organic layer, and the number of the organic layers. Alternatively, the emission position L2 of the second emission part 220 may be within a range of 1,600 Å to 2,300 Å from the reflective surface of the first electrode 202.

Therefore, the emission peak is located in a yellow-green emission area, and light having a wavelength corresponding to the emission peak is emitted, thereby enabling the second emission part 220 to realize the maximum luminance. A peak wavelength of an emission area of the yellow-green emission layer may be 510 nm to 580 nm. Here, the peak wavelength may be an emission area.

Moreover, the second emission part 220 may be configured with two layers (for example, a red emission layer and a green emission layer) depending on a characteristic or a structure of a device. When the second emission part 220 is configured with two layers (for example, the red emission layer and the green emission layer), a color reproduction rate can be enhanced. A peak wavelength of an emission area of the red emission layer and the green emission layer may be 510 nm to 650 nm. Here, the peak wavelength may be an emission area.

Moreover, the second emission part 220 may be configured with two layers (for example, a red emission layer and a yellow-green emission layer) depending on a characteristic or a structure of a device. When the second emission part 220 is configured with two layers (for example, the red emission layer and the yellow-green emission layer), an emission efficiency of the red emission layer can increase. A peak wavelength of an emission area of the red emission layer and the yellow-green emission layer may be 540 nm to 650 nm. Here, the peak wavelength may be an emission area.

Moreover, the second emission part 220 may be configured with two layers (for example, a yellow emission layer and a red emission layer) depending on a characteristic or a structure of a device. When the second emission part 220 is configured with two layers (for example, the yellow emission layer and the red emission layer), an emission efficiency of the red emission layer can increase. A peak wavelength of an emission area of the yellow emission layer and the red emission layer may be 540 nm to 650 nm. Here, the peak wavelength may be an emission area.

When the second emission part 220 is configured with one among a yellow-green emission layer, a yellow emission layer and a red emission layer, the red emission layer and a green emission layer, and the yellow-green emission layer and the red emission layer, or is configured by a combination thereof, a peak wavelength of an emission area of the second emission part 220 may be within a range of 510 nm to 650 nm. Here, the peak wavelength may be an emission area.

An emission position L3 of the third emission part 230 may be within a range of 2,400 Å to 3,100 Å from the first electrode 202. Alternatively, the emission position L3 of the third emission part 230 may be within a range of 2,400 Å to 3,100 Å from the reflective surface of the first electrode 202.

The third emission part 230 may include a blue emission layer. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The emission position L3 of the third emission part 230 may be within a range of 2,400 Å to 3,100 Å from the first electrode 202 irrespective of at least one among a thickness of the emission layer, the number of the emission layers, a thickness of the organic layer, and the number of the organic layers. Alternatively, the emission position L3 of the third emission part 230 may be within a range of 2,400 Å to 3,100 Å from the reflective surface of the first electrode 202.

Therefore, the emission peak of the third emission part 230 is located in a blue emission area, thereby enabling the third emission part 230 to realize the maximum luminance. A peak wavelength range of the blue emission layer may be 440 nm to 480 nm. Also, an auxiliary emission layer of the third emission part 230 may be configured with one among a red emission layer, a green emission layer, and a yellow-green emission layer, or may be configured by a combination thereof. A peak wavelength of an emission area of each of the auxiliary emission layer and the emission layer configuring the third emission part 230 may be 440 nm to 650 nm. Here, the peak wavelength may be an emission area.

The present invention relates to the top emission type white organic light emitting device having the EPEL structure where the emission positions of the emission layers are set irrespective of at least one among a thickness of the emission layer, the number of the emission layers, a thickness of the organic layer, and the number of the organic layers. Also, the first to third emission parts 210, 220 and 230 have the EPEL structure that has a maximum emission range in emission areas of the first to third emission layers irrespective of at least one among a thickness of the emission layer, the number of the emission layers, a thickness of the organic layer, and the number of the organic layers.

Figure 13:
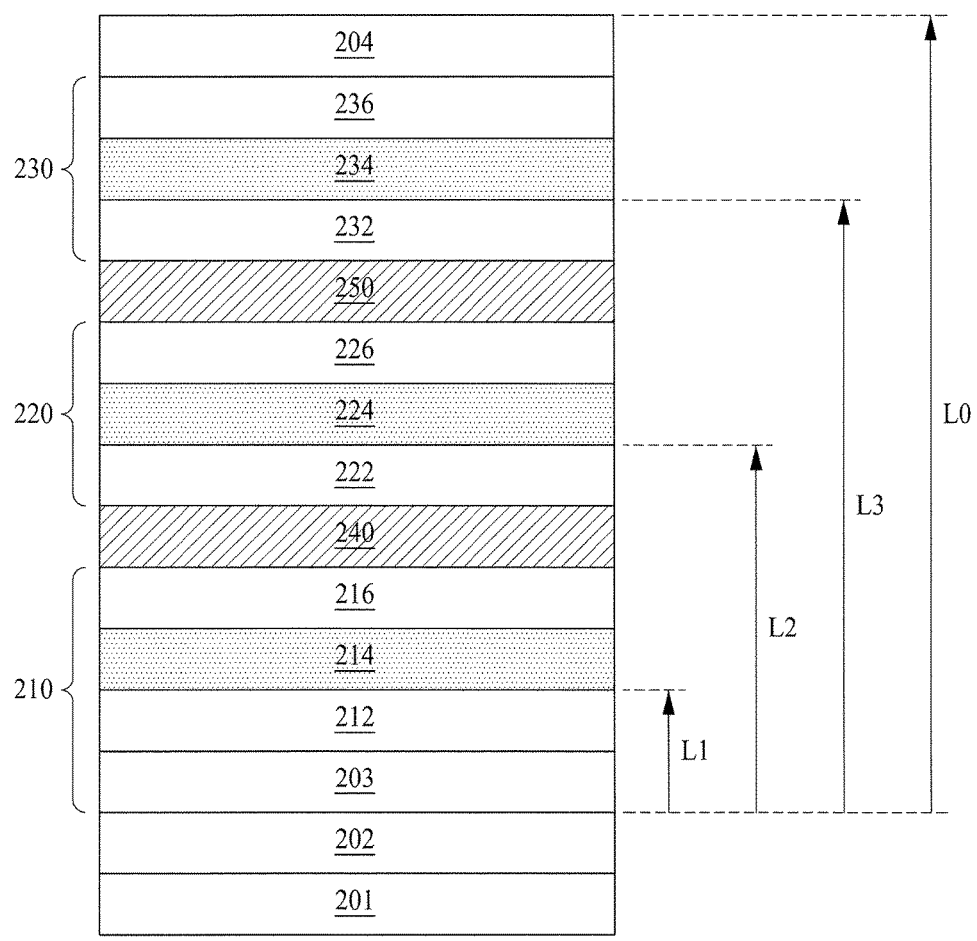
FIG. 13 is a diagram illustrating a white organic light emitting device according to the fourth embodiment of the present invention.

FIG. 13 is a diagram illustrating a white organic light emitting device 200 according to the fourth embodiment of the present invention.

A white organic light emitting device 200 illustrated in FIG. 13 includes first and second electrodes 202 and 204 and first to third emission parts 210, 220 and 230 disposed between the first and second electrodes 202 and 204.

Each of the first electrode 202 and the second electrode 204 may be referred to as an anode or a cathode.

The first electrode 202 may be formed of a reflective electrode, and the second electrode 204 may be formed of a semitransmissive electrode.

Referring to FIG. 13, a position L0 of the second electrode 204 is within a range of 4,700 Å to 5,400 Å from the first electrode 202. Since the position L0 of the second electrode 204 is set, emission peaks of emission layers configuring the first to third emission parts 210, 220 and 230 are located at a specific wavelength, and light having the specific wavelength is emitted, thereby improving an emission efficiency of the emission layers.

The first emission part 210 may include a first HTL 212, a first EML 214, and a first ETL 216 which are disposed on the first electrode 202.

An auxiliary electrode 203 may be formed on the first electrode 202. The auxiliary electrode 203 may be formed of ITO, IZO, or IGZO which is a transparent conductive material such as metal oxide or TCO, but is not limited thereto.

Although not shown, the first emission part 210 may further include an HIL. The HIL may be formed on the auxiliary electrode 203 and enables a hole, supplied from the first electrode 202, to be smoothly injected. The first HTL 212 may supply a hole, supplied from the HIL, to a first EML 214. The first ETL 216 may supply an electron, supplied from a first CGL 240, to the first EML 214.

A hole supplied through the first HTL 212 and an electron supplied through the first ETL 216 may be recombined in the first EML 214 to emit light.

When the first HTL 212 is formed on the first electrode 202 without forming the auxiliary electrode 203, it is difficult for an electron to move to the first EML 214, and it is difficult for a hole to move to the first EML 214. The auxiliary electrode 203 may be provided depending on a characteristic or a structure of a device.

The first HTL 212 may be formed of two or more layers or two or more materials.

The first ETL 216 may be formed of two or more layers or two or more materials.

An HBL may be further formed on the first EML 214. The HBL prevents a hole, generated by the first EML 214, from being transferred to the first ETL 216 and thus enhances a combination of an electron and a hole in the first EML 214, thereby enhancing an emission efficiency of the first EML 214. The first ETL 216 and the HBL may be provided as one layer or single layer.

An EBL may be further formed under the first EML 214. The EBL prevents an electron, generated by the first EML 214, from being transferred to the first HTL 212 and thus enhances a combination of an electron and a hole in the first EML 214, thereby enhancing an emission efficiency of the first EML 214. The first HTL 212 and the EBL may be provided as one layer or single layer.

The first EML 214 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the first EML 214 is provided along with the auxiliary emission layer, the yellow-green emission layer, the red emission layer, or the green emission layer may be disposed on or under the first EML 214. Also, the yellow-green emission layer, the red emission layer, or the green emission layer may be identically or differently provided as the auxiliary emission layer on and under the first EML 214. The positions or number of emission layers may be selectively determined depending on a structure and a characteristic of a device, but the present embodiment is not limited thereto.

When the auxiliary emission layer is provided in the first EML 214, a peak wavelength of an emission area of the first EML 214 may be within a range of 440 nm to 650 nm. Here, the peak wavelength may be an emission area.

All organic layers such as the first HTL 212, the EBL, and the HTL may be referred to as an organic layer. All organic layers between the first electrode 202 and the first EML 214, and the auxiliary electrode 203 may be referred to as an organic layer. Therefore, all organic layers between the first electrode 202 and the first EML 214 may be referred to as a first organic layer.

An emission position L1 of the first EML 214 may be within a range of 150 Å to 700 Å from the reflective surface of the first electrode 202 irrespective of at least one among the number or thickness of the second HTL 212, the number or thickness of the auxiliary electrode 203, the number or thickness of the EBL, the number or thickness of the HIL, or the number or thickness of the organic layers disposed between the first electrode 202 and the first EML 214. Alternatively, the emission position L1 of the first EML 214 may be within a range of 150 Å to 700 Å from the reflective surface of the first electrode 202. Therefore, the emission position L1 of the first EML 214 may be within a range of 150 Å to 700 Å from the first electrode 202 irrespective of at least one among the number of the first organic layers and a thickness of the first organic layer. Alternatively, the emission position L1 of the first EML 214 may be within a range of 150 Å to 700 Å from the reflective surface of the first electrode 202 irrespective of at least one the number of the first organic layers and a thickness of the first organic layer.

The second emission part 220 may include a second HTL 222, a second EML 224, and a second ETL 226.

The second HTL 222 may be formed of two or more layers or two or more materials.

The second HTL 222 may be formed of the same material as that of the first HTL 212, but is not limited thereto.

An HIL may be further formed under the second HTL 222. The HIL may inject a hole, supplied from the first CGL 240, into the second HTL 222.

The second ETL 226 may be formed of two or more layers or two or more materials.

The second ETL 226 may be formed of the same material as that of the first ETL 216, but is not limited thereto.

An HBL may be further formed on the second EML 224. The HBL prevents a hole, generated by the second EML 224, from being transferred to the second ETL 226 and thus enhances a combination of an electron and a hole in the second EML 224, thereby enhancing an emission efficiency of the second EML 224. The second ETL 226 and the HBL may be provided as one layer or single layer.

An EBL may be further formed under the second EML 224. The EBL prevents an electron, generated by the second EML 224, from being transferred to the second HTL 222 and thus enhances a combination of an electron and a hole in the second EML 224, thereby enhancing an emission efficiency of the second EML 224. The second HTL 222 and the EBL may be provided as one layer or single layer.

The second EML 224 may be configured with a yellow-green emission layer. A peak wavelength of an emission area of the yellow-green emission layer may be within a range of 510 nm to 580 nm. Here, the peak wavelength may be an emission area.

The second EML 224 may be configured with one among a yellow-green emission layer, a yellow emission layer and a red emission layer, the red emission layer and a green emission layer, and the yellow-green emission layer and the red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the second EML 224. Also, the yellow emission layer and the red emission layer, the red emission layer and the green emission layer, or the yellow-green emission layer and the red emission layer may be identically or differently provided as the auxiliary emission layer on and under the second EML 224.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the second EML 224 is configured with two layers (for example, the yellow emission layer and the red emission layer), an emission efficiency of the red emission layer can increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the second EML 224 is configured with two layers (for example, the red emission layer and the green emission layer), a color reproduction rate can be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer of the second EML 224 may be within a range of 540 nm to 650 nm. Here, the peak wavelength may be an emission area. When the second EML 224 is configured with two layers (for example, the yellow emission layer and the red emission layer), an emission efficiency of the red emission layer can increase.

Moreover, the second EML 224 of the second emission part 220 may be configured with two layers (for example, the red emission layer and the yellow-green emission layer) depending on a characteristic or a structure of a device. A peak wavelength of an emission area of the red emission layer may be within a range of 600 nm to 650 nm. A peak wavelength of an emission area of the yellow-green emission layer may be within a range of 510 nm to 580 nm. When the second EML 224 is configured with two layers (for example, the red emission layer and the yellow-green emission layer), an emission efficiency of the red emission layer can increase. In this case, a peak wavelength of an emission area of the second EML 224 may be within a range of 510 nm to 650 nm. Here, the peak wavelength may be an emission area.

When the second EML 224 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the second EML 224 may be within a range of 510 nm to 650 nm. Here, the peak wavelength may be an emission area.

A first CGL 240 may be further formed between the first emission part 210 and the second emission part 220. The first CGL 240 adjusts a balance of electrical charges between the first emission part 210 and the second emission part 220. The first CGL 240 may include an N-type CGL and a P-type CGL.

The first CGL 240 may be formed of a single layer.

Each of the first EML 214, the first ETL 216, the first CGL 240, the second HTL 222, the HBL, the EBL, and the HTL may be referred to as an organic layer. All organic layers between the second EML 224 and the first EML 214, and the first EML 214 may be referred to as an organic layer. Therefore, all organic layers between the second EML 224 and the first EML 214 may be referred to as a second organic layer.

The emission position L2 of the second EML 224 may be within a range of 1,600 Å to 2,300 Å from the first electrode 202 irrespective of at least one among the number or thickness of the first ETL 216, the number or thickness of the second HTL 222, the number or thickness of the first CGL 240, the number or thickness of the HBL, the number or thickness of the EBL, the number or thickness of the HIL, the number or thickness of the first EML 214, the number or thickness of organic layers between the first electrode 202 and the first EML 214, or the number or thickness of organic layers between the first EML 214 and the second EML 224. Alternatively, the emission position L2 of the second EML 224 may be within a range of 1,600 Å to 2,300 Å from the first electrode 202. Therefore, the emission position L2 of the second EML 224 may be within a range of 1,600 Å to 2,300 Å from the first electrode 202 irrespective of at least one among the number of the first organic layers, a thickness of the first organic layer, the number of the second organic layers, a thickness of the second organic layer, the number of the first EMLs, and a thickness of the first EML. Alternatively, the emission position L2 of the second EML 224 may be within a range of 1,600 Å to 2,300 Å from the reflective surface of the first electrode 202 irrespective of at least one among the number of the first organic layers, a thickness of the first organic layer, the number of the second organic layers, a thickness of the second organic layer, the number of the first EMLs, and a thickness of the first EML.

The third emission part 230 may include a third ETL 236, a third EML 234, and a third HTL 232. Although not shown, an EIL may be further formed on the third ETL 236. The EIL may inject an electron, supplied from the second electrode 204, into the third ETL 236.

The third HTL 232 may be formed of N,N'-bis(3-methylphenyl)-N,N'-bis(phenyl)-benzidine (TPD) or N,N'-di(naphthalen-1-yl)-N,N'-diphenyl-benzidine (NPB), but is not limited thereto.

The third HTL 232 may be formed of two or more layers or two or more materials.

The third HTL 232 may be formed of the same material as that of the second HTL 222, but is not limited thereto.

An HIL may be further formed under the third HTL 232. The HIL may inject a hole, supplied from a second CGL 250, into the third HTL 232.

The third ETL 236 may be formed of oxadiazole, triazole, phenanthroline, benzoxazole, or benzthiazole, but is not limited thereto.

The third ETL 236 may be formed of two or more layers or two or more materials.

The third ETL 236 may be formed of the same material as that of the second ETL 226, but is not limited thereto.

A second CGL 250 may be further formed between the second emission part 220 and the third emission part 230. The second CGL 250 adjusts a balance of electrical charges between the second emission part 220 and the third emission part 230. The second CGL 250 may include an N-type CGL and a P-type CGL.

The N-type CGL may inject an electron into the second emission part 220, and the P-type CGL may inject a hole into the third emission part 230.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The P-type CGL may be formed as an organic layer including a P-type dopant, but is not limited thereto.

The second CGL 250 may be formed of the same material as that of the N-CGL and the P-CGL of the first CGL 240, but is not limited thereto.

The second CGL 250 may be formed of a single layer.

An HBL may be further formed on the third EML 234. The HBL prevents a hole, generated by the third EML 234, from being transferred to the third ETL 236 and thus enhances a combination of an electron and a hole in the third EML 234, thereby enhancing an emission efficiency of the third EML 234. The third ETL 236 and the HBL may be provided as one layer or single layer.

An EBL may be further formed under the third EML 234. The EBL prevents an electron, generated by the third EML 234, from being transferred to the third HTL 232 and thus enhances a combination of an electron and a hole in the third EML 234, thereby enhancing an emission efficiency of the third EML 234. The third HTL 232 and the EBL may be provided as one layer or single layer.

The third EML 234 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the third EML 234 is provided along with the auxiliary emission layer, the yellow-green emission layer, the red emission layer, or the green emission layer may be disposed on or under the third EML 234. Also, the yellow-green emission layer, the red emission layer, or the green emission layer may be identically or differently provided as the auxiliary emission layer on and under the third EML 234. The positions or number of emission layers may be selectively determined depending on a structure and a characteristic of a device, but the present embodiment is not limited thereto.

When the auxiliary emission layer is provided in the third EML 234, a peak wavelength of an emission area of the third EML 234 may be within a range of 440 nm to 650 nm. Here, the peak wavelength may be an emission area.

Each of the second EML 224, the second ETL 226, the second CGL 250, the third HTL 232, the HBL, the EBL, and the HTL may be referred to as an organic layer. All organic layers between the third EML 234 and the second EML 224, and the second EML 224 may be referred to as an organic layer. Therefore, all organic layers between the third EML 234 and the second EML 224 may be referred to as a third organic layer.

The emission position L3 of the third EML 234 may be within a range of 2,400 Å to 3,100 Å from the first electrode 202 irrespective of at least one among the number or thickness of the second ETL 226, the number or thickness of the second CGL 250, the number or thickness of the third HTL 232, the number or thickness of the second EML 224, the number or thickness of the first EML 214, the number or thickness of organic layers disposed between the first electrode 202 and the first EML 214, the number or thickness of organic layers disposed between the first EML 214 and the second EML 224, or the number or thickness of organic layers disposed between the second EML 224 and the third EML 234. Alternatively, the emission position L3 of the third EML 234 may be within a range of 2,400 Å to 3,100 Å from the reflective surface of the first electrode 202. Therefore, the emission position L3 of the third EML 234 may be within a range of 2,400 Å to 3,100 Å from the first electrode 202 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML. Alternatively, the emission position L3 of the third EML 234 may be within a range of 2,400 Å to 3,100 Å from the reflective surface of the first electrode 202 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML.

All layers such as the third ETL 236, the third EML 234, the EIL, and the HBL may be referred to as an organic layer. All organic layers between the second electrode 204 and the third EML 234, the second electrode 204, and the third EML 234 may be referred to as an organic layer. Therefore, all organic layers between the second electrode 204 and the third EML 234 may be referred to as a fourth organic layer.

A position L0 of the second electrode 204 may be within a range of 4,700 Å to 5,400 Å from the first electrode 202 irrespective of at least one among the number or thickness of the third ETL 236, the number or thickness of the EBL, the number or thickness of the HBL, the number or thickness of the second electrode 204, the number or thickness of the third EML 234, the number or thickness of organic layers between the substrate 201 and the first EML 214, the number or thickness of organic layers between the first EML 214 and the second EML 224, the number or thickness of organic layers between the second EML 224 and the third EML 234, or the number or thickness of organic layers between the second electrode 204 and the third EML 234. Alternatively, the position L0 of the second electrode 204 may be within a range of 4,700 Å to 5,400 Å from the reflective surface of the first electrode 202.

Therefore, the position L0 of the second electrode 204 may be within a range of 4,700 Å to 5,400 Å from the first electrode 202 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML. Alternatively, the position L0 of the second electrode 204 may be within a range of 4,700 Å to 5,400 Å from the reflective surface of the first electrode 202 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML.

The structure illustrated in FIG. 13 is an example of the present invention, and may be selectively changed depending on a structure or a characteristic of a white organic light emitting device. However, the present embodiment is not limited thereto.

Figure 14:
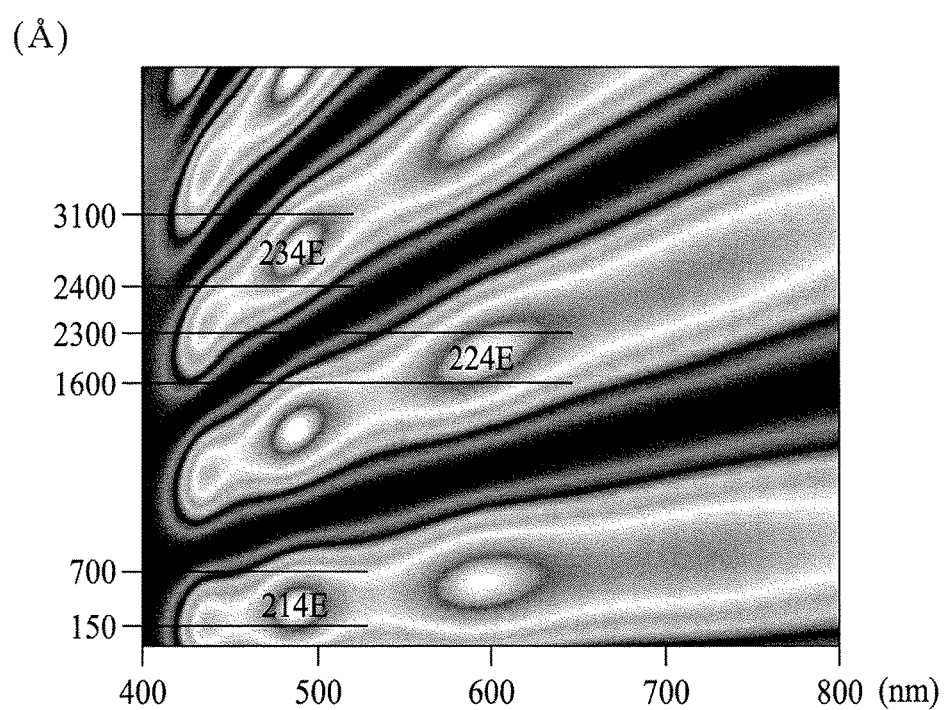
FIG. 14 is a diagram illustrating an emission position of an organic light emitting device according to the fourth embodiment of the present invention.

FIG. 14 is a diagram illustrating an emission position of an organic light emitting device according to the fourth embodiment of the present invention.

In FIG. 14, the abscissa axis indicates a wavelength range of light, and the ordinate axis indicates emission positions of emission layers configuring the emission part from the first electrode 202 and may be referred to as a contour map. Here, when the EPEL structure according to an embodiment of the present invention is applied except the first electrode 202 and the second electrode 204, FIG. 14 shows the emission positions of the emission layers at an emission peak. Also, FIG. 14 shows emission positions of emission layers having a maximum emission range in emission areas of the emission layers.

Since the first EML 214 configuring the first emission part 210 is the blue emission layer, a peak wavelength range of the emission area of the first EML 214 may be 440 nm to 480 nm. When light is emitted at 440 nm to 480 nm that is an emission area of the blue emission layer, maximum efficiency is obtained in a white color area of the contour map.

Therefore, an emission position of the first EML 214 is within a range of 150 Å to 700 Å, and thus, an emission peak 214E is located at 440 nm to 480 nm. Thus, the first EML 214 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the first EML 214 configuring the first emission part 210, a peak wavelength range of the emission area of the first EML 214 may be a range of 440 nm to 650 nm. Therefore, when light is emitted at 440 nm to 650 nm that is an emission area of the first EML 214, maximum efficiency is obtained in the white color area of the contour map.

In FIG. 14, for example, an emission position is shown in a case where the first EML 214 is the blue emission layer without adding an auxiliary emission layer into the first EML 214. Therefore, a peak wavelength range of an emission area of the first EML 214 realizes maximum efficiency at 440 nm to 480 nm.

Since the second EML 224 configuring the second emission part 220 is the yellow-green emission layer, a peak wavelength range of the emission area of the second EML 224 may be a range of 510 nm to 580 nm. When light is emitted at 510 nm to 580 nm that is an emission area of the yellow-green emission layer, maximum efficiency is obtained in the white color area of the contour map.

Therefore, an emission position of the second EML 224 is within a range of 1,600 Å to 2,300 Å, and thus, an emission peak 224E of the second EML 224 is located at 510 nm to 580 nm. Thus, the second EML 224 emits light at 510 nm to 580 nm, thereby obtaining maximum efficiency.

Moreover, the second EML 224 of the second emission part 220 may be configured with two layers (for example, a red emission layer and a green emission layer) depending on a characteristic or a structure of an organic light emitting device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the second EML 224, maximum efficiency is obtained in the white color area of the contour map.

The second EML 224 of the second emission part 220 may be configured with two layers (for example, a red emission layer and a yellow-green emission layer) depending on a characteristic or a structure of an organic light emitting device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the second EML 224, maximum efficiency is obtained in the white color area of the contour map.

The second EML 224 of the second emission part 220 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the second EML 224, maximum efficiency is obtained in the white color area of the contour map.

Therefore, when the second EML 224 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the second EML 124 may be 510 nm to 650 nm. In this case, when light is emitted at 510 nm to 650 nm that is the emission area of the second EML 124, maximum efficiency is obtained in the white color area of the contour map.

In FIG. 14, for example, an emission position is shown in a case where the second EML 224 is the yellow-green emission layer without adding an auxiliary emission layer into the second EML 224. Therefore, a peak wavelength range of an emission area of the second EML 224 realizes maximum efficiency at 510 nm to 580 nm.

Since the third EML 234 configuring the third emission part 230 is the blue emission layer, a peak wavelength range of the emission area of the third EML 234 may be a range of 440 nm to 480 nm. When light is emitted at 440 nm to 480 nm that is an emission area of the blue emission layer, maximum efficiency is obtained in the white color area of the contour map.

Therefore, an emission position of the third EML 234 is within a range of 2,400 Å to 3,100 Å, and thus, an emission peak 234E of the third EML 234 is located at 440 nm to 480 nm. Thus, the third EML 234 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the third EML 234 configuring the third emission part 230, a peak wavelength range of the emission area of the third EML 234 may be a range of 440 nm to 650 nm. Therefore, when light is emitted at 440 nm to 650 nm that is an emission area of the third EML 234, maximum efficiency is obtained in the white color area of the contour map.

In FIG. 14, for example, an emission position is shown in a case where the third EML 234 is the blue emission layer without adding an auxiliary emission layer into the third EML 234. Therefore, a peak wavelength range of an emission area of the third EML 234 realizes maximum efficiency at 440 nm to 480 nm.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

Therefore, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. Therefore, a maximum emission range of the first EML may be 440 nm to 470 nm, a maximum emission range of the second EML may be 530 nm to 570 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 15:
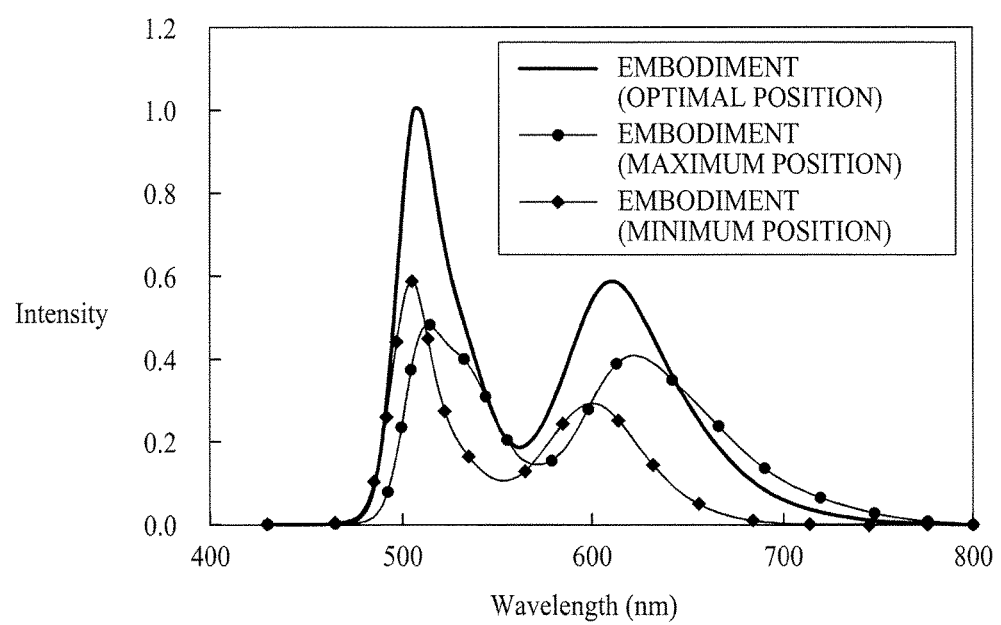
FIG. 15 is a diagram illustrating an EL spectrum according to the fourth embodiment of the present invention.

FIG. 15 is a diagram illustrating an EL spectrum according to the fourth embodiment of the present invention.

In FIG. 15, the abscissa axis indicates a wavelength range of light, and the ordinate axis indicates emission intensity. The emission intensity is a numerical value that is expressed as a relative value with respect to a maximum value of an EL spectrum.

In FIG. 15, a minimum position according to an embodiment is a portion which is set as a minimum position when emission positions of emission layers are set. For example, when the emission position L1 of the first EML 214 is within a range of 150 Å to 700 Å from the first electrode 202, the minimum position is set to 150 Å.

A maximum position according to an embodiment is a portion which is set as a maximum position when emission positions of emission layers are set. For example, when the emission position L1 of the first EML 214 is within a range of 150 Å to 700 Å from the first electrode 202, the maximum position is set to 700 Å.

An optimal position according to an embodiment is a portion which is set as an emission position according to a fourth embodiment of the present invention. For example, when the emission position L1 of the first EML 214 is within a range of 150 Å to 700 Å from the first electrode 202, an emission position according to an embodiment is within a range of 150 Å to 700 Å.

As shown in FIG. 15, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light, and is out of a peak wavelength range of the blue light. Also, it can be seen that emission intensity is reduced at 510 nm to 580 nm that is a peak wavelength range of yellow-green light. Also, it can be seen that emission intensity is considerably reduced at 600 nm to 650 nm that is a peak wavelength range of red light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light, and is out of a peak wavelength range of the blue light. Also, it can be seen that emission intensity is reduced at 510 nm to 580 nm that is the peak wavelength range of the yellow-green light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 7. When it is assumed that efficiency of a comparative example is 100%, the following Table 7 shows efficiency of a fourth embodiment of the present invention.

In the following Table 7, the comparative example relates to the bottom emission type white light emitting device including the first to third emission parts, the first emission part being configured with the blue emission layer, the second emission part being configured with the yellow-green emission layer, and the third emission part being configured with the blue emission layer. Also, an embodiment relates to a top emission type white light emitting device when an optimal position of the EPEL structure according to an embodiment of the present invention is applied.

TABLE 7

| Division | Red (R) Efficiency | Green (G) Efficiency | Blue (B) Efficiency | White (W) Efficiency | Average |
|---|---|---|---|---|---|
| Comparative Example | 100% | 100% | 100% | 100% | 100% |
| Embodiment (Optimal Position) | 139% | 163% | 147% | 161% | 153% |

As shown in Table 7, in comparison with the comparative example, when it is assumed that efficiency of the comparative example is 100% in a case where the EPEL structure is applied, it can be seen that red efficiency increases by about 39%, and green efficiency increases by about 63%. Also, it can be seen that blue efficiency increases by about 47%, and white efficiency increases by about 53%.

A panel efficiency of a white light emitting device having the EPEL structure and a panel efficiency of a comparative example are as listed in the following Table 8.

When it is assumed that an efficiency of an optimal position according to an embodiment is 100%, the following Table 8 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 8

| Division | Red (R) Efficiency | Green (G) Efficiency | Blue (B) Efficiency | White (W) Efficiency | Average |
|---|---|---|---|---|---|
| Embodiment (Minimum Position) | 18% | 53% | 49% | 44% | 41% |
| Embodiment (Optimal Position) | 100% | 100% | 100% | 100% | 100% |
| Embodiment (Maximum Position) | 122% | 65% | 65% | 75% | 82% |

As shown in Table 8, it can be seen that efficiencies of red, green, blue, and white are all reduced in a boundary between the embodiment (the minimum position) and the embodiment (the maximum position). Also, it can be seen that efficiencies of red, green, blue, and white are more reduced in the embodiment (the maximum position) than the embodiment (the minimum position). Accordingly, when an emission position of the EPEL structure is out of an optimal position, it can be seen that panel efficiency is reduced.

As described above in the fourth embodiment of the present invention, the organic light emitting device may be a top emission type organic light emitting device.

A position of the second electrode may be within a range of 4,700 Å to 5,400 Å from the first electrode.

An emission position of the first EML may be within a range of 150 Å to 700 Å from the first electrode.

An emission position of the second EML may be within a range of 1,600 Å to 2,300 Å from the first electrode.

An emission position of the third EML may be within a range of 2,400 Å to 3,100 Å from the first electrode.

The first EML may be configured with one among a blue emission layer, a blue emission layer and a yellow-green emission layer, a blue emission layer and a red emission layer, and a blue emission layer and a green emission layer, or may be configured by a combination thereof.

The second EML may be configured with one among a yellow-green emission layer, a yellow emission layer and a red emission layer, a red emission layer and a green emission layer, and a yellow-green emission layer and a red emission layer, or may be configured by a combination thereof.

The third EML may be configured with one among a blue emission layer, a blue emission layer and a yellow-green emission layer, a blue emission layer and a red emission layer, or a blue emission layer and a green emission layer, or may be configured by a combination thereof.

An emission area of the first EML may be a range of 440 nm to 650 nm, an emission area of the second EML may be a range of 510 nm to 650 nm, and an emission area of the third EML may be a range of 440 nm to 650 nm.

A maximum emission range of the first EML may be a range of 440 nm to 470 nm, a maximum emission range of the second EML may be a range of 530 nm to 570 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 16:
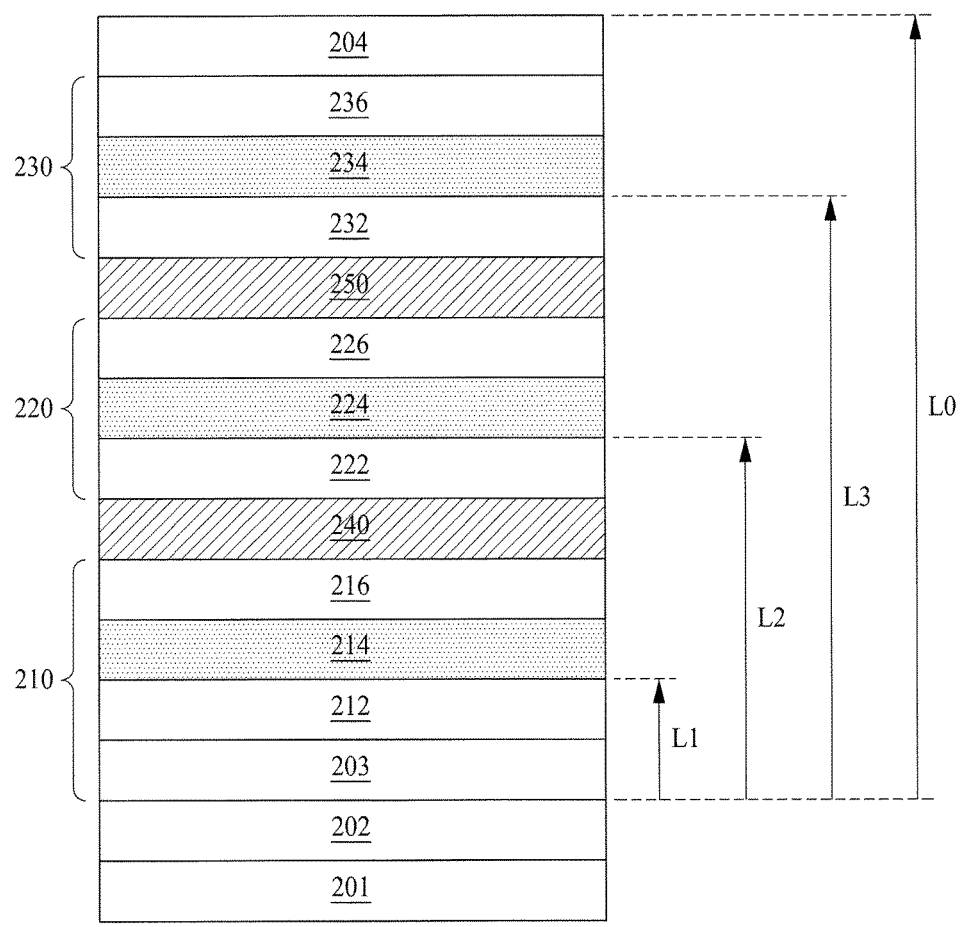
FIG. 16 is a diagram illustrating a white organic light emitting device according to the fifth embodiment of the present invention.

FIG. 16 is a diagram illustrating a white organic light emitting device 200 according to the fifth embodiment of the present invention. In describing the present embodiment, descriptions on elements which are the same as or correspond to the elements according to the preceding embodiment are not repeated.

The white organic light emitting device 200 illustrated in FIG. 16 includes first and second electrodes 202 and 204 and first to third emission parts 210, 220 and 230 between the first and second electrodes 202 and 204.

A position L0 of the second electrode 204 is within a range of 4,700 Å to 5,400 Å from the first electrode 202. Since the position L0 of the second electrode 204 is set, the emission peaks of the emission layers configuring the first to third emission parts 210, 220 and 230 is located at a specific wavelength, and light having the specific wavelength is emitted, thereby improving emission efficiency.

The first emission part 210 may include a first HTL 212, a first EML 214, and a first ETL 216 which are disposed on the first electrode 202.

An auxiliary electrode 203 may be formed on the first electrode 202. However, the auxiliary electrode 203 may not be provided depending on a characteristic or a structure of an organic light emitting device.

Although not shown, the first emission part 210 may further include an HIL disposed on the auxiliary electrode 203. An HBL may be further formed on the first EML 214. The first ETL 216 and the HBL may be provided as one layer or single layer.

An EBL may be further formed under the first EML 214. The first HTL 212 and the EBL may be provided as one layer or single layer.

The first EML 214 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the first EML 214 is provided along with the auxiliary emission layer, the yellow-green emission layer, the red emission layer, or the green emission layer may be disposed on or under the first EML 214. Also, the yellow-green emission layer, the red emission layer, or the green emission layer may be identically or differently provided as the auxiliary emission layer on and under the first EML 214. The positions or number of emission layers may be selectively determined depending on a structure and a characteristic of an organic light emitting device, but the present embodiment is not limited thereto.

When the auxiliary emission layer is provided in the first EML 214, a peak wavelength of an emission area of the first EML 214 may be within a range of 440 nm to 650 nm. Here, the peak wavelength may be an emission area.

All organic layers such as the first HTL 212, the EBL, and the HTL may be referred to as an organic layer. All organic layers between the first electrode 202 and the first EML 214, and the auxiliary electrode 203 may be referred to as an organic layer. Therefore, all organic layers between the first electrode 202 and the first EML 214 may be referred to as a first organic layer.

An emission position L1 of the first EML 214 may be within a range of 150 Å to 650 Å from the reflective surface of the first electrode 202 irrespective of at least one among the number or thickness of the second HTL 212, the number or thickness of the auxiliary electrode 203, the number or thickness of the EBL, the number or thickness of the HIL, or the number or thickness of the organic layers disposed between the first electrode 202 and the first EML 214. Alternatively, the emission position L1 of the first EML 214 may be within a range of 150 Å to 650 Å from the reflective surface of the first electrode 202. Therefore, the emission position L1 of the first EML 214 may be within a range of 150 Å to 650 Å from the first electrode 202 irrespective of at least one the number of the first organic layers and a thickness of the first organic layer. Alternatively, the emission position L1 of the first EML 214 may be within a range of 150 Å to 650 Å from the reflective surface of the first electrode 202 irrespective of at least one the number of the first organic layers and a thickness of the first organic layer.

The second emission part 220 may include a second HTL 222, a second EML 224, and a second ETL 226.

An HIL may be further formed under the second HTL 222.

An HBL may be further formed on the second EML 224. The second ETL 226 and the HBL may be provided as one layer or single layer.

An EBL may be further formed under the second EML 224. The second HTL 222 and the EBL may be provided as one layer or single layer.

The second EML 224 may be configured with a yellow-green emission layer. A peak wavelength of an emission area of the yellow-green emission layer may be within a range of 510 nm to 580 nm. Here, the peak wavelength may be an emission area.

The second EML 224 may be configured with one among a yellow-green emission layer, a yellow emission layer and a red emission layer, the red emission layer and a green emission layer, and the yellow-green emission layer and the red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the second EML 224. Also, the yellow emission layer and the red emission layer, the red emission layer and the green emission layer, or the yellow-green emission layer and the red emission layer may be identically or differently provided as the auxiliary emission layer on and under the second EML 224.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the second EML 224 is configured with two layers (for example, the yellow emission layer and the red emission layer), an emission efficiency of the red emission layer can increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the second EML 224 is configured with two layers (for example, the red emission layer and the green emission layer), a color reproduction rate can be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer of the second EML 224 may be within a range of 540 nm to 650 nm. Here, the peak wavelength may be an emission area. When the second EML 224 is configured with two layers (for example, the yellow emission layer and the red emission layer), an emission efficiency of the red emission layer can increase.

Moreover, the second EML 224 of the second emission part 220 may be configured with two layers (for example, the red emission layer and the yellow-green emission layer) depending on a characteristic or a structure of an organic light emitting device. A peak wavelength of an emission area of the red emission layer may be within a range of 600 nm to 650 nm. A peak wavelength of an emission area of the yellow-green emission layer may be within a range of 510 nm to 580 nm. When the second EML 224 is configured with two layers (for example, the red emission layer and the yellow-green emission layer), an emission efficiency of the red emission layer can increase. In this case, a peak wavelength of an emission area of the second EML 224 may be within a range of 510 nm to 650 nm. Here, the peak wavelength may be an emission area.

When the second EML 224 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the second EML 224 may be within a range of 510 nm to 650 nm. Here, the peak wavelength may be an emission area.

A first CGL 240 may be further formed between the first emission part 210 and the second emission part 220. The first CGL 240 may include an N-type CGL and a P-type CGL.

Each of the first EML 214, the first ETL 216, the first CGL 240, the second HTL 222, the HBL, the EBL, and the HTL may be referred to as an organic layer. All organic layers between the second EML 224 and the first EML 214, and the first EML 214 may be referred to as an organic layer. Therefore, all organic layers between the second EML 224 and the first EML 214 may be referred to as a second organic layer.

The emission position L2 of the second EML 224 may be within a range of 1,700 Å to 2,300 Å from the first electrode 202 irrespective of at least one among the number or thickness of the first ETL 216, the number or thickness of the second HTL 222, the number or thickness of the first CGL 240, the number or thickness of the HBL, the number or thickness of the EBL, the number or thickness of the HIL, the number or thickness of the first EML 214, the number or thickness of organic layers disposed between the first electrode 202 and the first EML 214, or the number or thickness of organic layers disposed between the first EML 214 and the second EML 224. Alternatively, the emission position L2 of the second EML 224 may be within a range of 1,700 Å to 2,300 Å from the first electrode 202. Therefore, the emission position L2 of the second EML 224 may be within a range of 1,700 Å to 2,300 Å from the first electrode 202 irrespective of at least one among the number of the first organic layers, a thickness of the first organic layer, the number of the second organic layers, a thickness of the second organic layer, the number of the first EMLs, and a thickness of the first EML. Alternatively, the emission position L2 of the second EML 224 may be within a range of 1,700 Å to 2,300 Å from the reflective surface of the first electrode 202 irrespective of at least one among the number of the first organic layers, a thickness of the first organic layer, the number of the second organic layers, a thickness of the second organic layer, the number of the first EMLs, and a thickness of the first EML.

The third emission part 230 may include a third ETL 236, a third EML 234, and a third HTL 232. Although not shown, an EIL may be further formed on the third ETL 236. An HIL may be further formed under the third HTL 232. A second CGL 250 may be further formed between the second emission part 220 and the third emission part 230. The second CGL 250 may include an N-type CGL and a P-type CGL.

An HBL may be further formed on the third EML 234. The third ETL 236 and the HBL may be provided as one layer or single layer.

An EBL may be further formed under the third EML 234. The third HTL 232 and the EBL may be provided as one layer or single layer.

The third EML 234 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the third EML 234 is provided along with the auxiliary emission layer, the yellow-green emission layer, the red emission layer, or the green emission layer may be disposed on or under the third EML 234. Also, the yellow-green emission layer, the red emission layer, or the green emission layer may be identically or differently provided as the auxiliary emission layer on and under the third EML 234. The positions or number of emission layers may be selectively determined depending on a structure and a characteristic of an organic light emitting device, but the present embodiment is not limited thereto.

When the auxiliary emission layer is provided in the third EML 234, a peak wavelength of an emission area of the third EML 234 may be within a range of 440 nm to 650 nm. Here, the peak wavelength may be an emission area.

Each of the second EML 224, the second ETL 226, the second CGL 250, the third HTL 232, the HBL, the EBL, and the HTL may be referred to as an organic layer. All organic layers between the third EML 234 and the second EML 224, and the second EML 224 may be referred to as an organic layer. Therefore, all organic layers between the third EML 234 and the second EML 224 may be referred to as a third organic layer.

The emission position L3 of the third EML 234 may be within a range of 2,400 Å to 3,000 Å from the first electrode 202 irrespective of at least one among the number or thickness of the second ETL 226, the number or thickness of the second CGL 250, the number or thickness of the third HTL 232, the number or thickness of the second EML 224, the number or thickness of the first EML 214, the number or thickness of organic layers between the first electrode 202 and the first EML 214, the number or thickness of organic layers between the first EML 214 and the second EML 224, or the number or thickness of organic layers between the second EML 224 and the third EML 234. Alternatively, the emission position L3 of the third EML 234 may be within a range of 2,400 Å to 3,000 Å from the reflective surface of the first electrode 202. Therefore, the emission position L3 of the third EML 234 may be within a range of 2,400 Å to 3,000 Å from the first electrode 202 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML. Alternatively, the emission position L3 of the third EML 234 may be within a range of 2,400 Å to 3,000 Å from the reflective surface of the first electrode 202 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML.

All layers such as the third ETL 236, the third EML 234, the EIL, and the HBL may be referred to as an organic layer. All organic layers between the second electrode 204 and the third EML 234, the second electrode 204, and the third EML 234 may be referred to as an organic layer. Therefore, all organic layers between the second electrode 204 and the third EML 234 may be referred to as a fourth organic layer.

A position L0 of the second electrode 204 may be s within a range of 4,700 Å to 5,400 Å from the first electrode 202 irrespective of at least one among the number or thickness of the third ETL 236, the number or thickness of the EBL, the number or thickness of the HBL, the number or thickness of the second electrode 204, the number or thickness of the first EML 214, the number or thickness of the second EML 224, the number or thickness of the third EML 234, the number or thickness of organic layers between the substrate 201 and the first EML 214, the number or thickness of organic layers between the first EML 214 and the second EML 224, the number or thickness of organic layers between the second EML 224 and the third EML 234, or the number or thickness of organic layers between the second electrode 204 and the third EML 234. Alternatively, the position L0 of the second electrode 204 may be within a range of 4,700 Å to 5,400 Å from the reflective surface of the first electrode 202. Therefore, the position L0 of the second electrode 204 may be within a range of 4,700 Å to 5,400 Å from the first electrode 202 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML. Alternatively, the position L0 of the second electrode 204 may be within a range of 4,700 Å to 5,400 Å from the reflective surface of the first electrode 202 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML.

The structure illustrated in FIG. 16 is an example of the present invention, and may be selectively changed depending on a structure or a characteristic of a white organic light emitting device. However, the present embodiment is not limited thereto.

Figure 17:
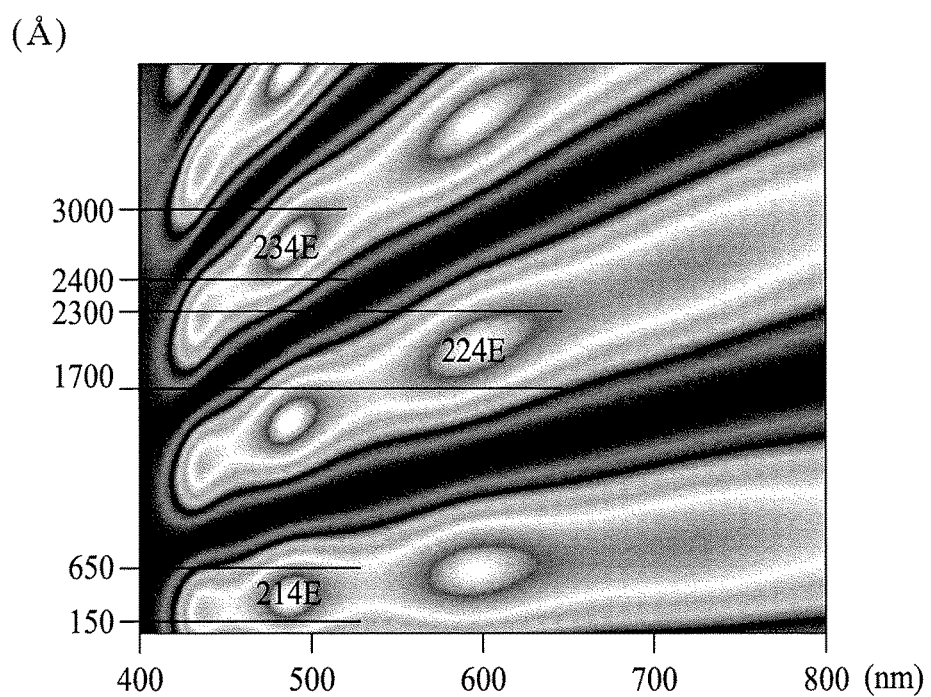
FIG. 17 is a diagram illustrating an emission position of an organic light emitting device according to the fifth embodiment of the present invention.

FIG. 17 is a diagram illustrating an emission position of an organic light emitting device according to the fifth embodiment of the present invention.

In FIG. 17, the abscissa axis indicates a wavelength range of light, and the ordinate axis indicates emission positions of emission layers configuring the emission part from the first electrode 202 and may be referred to as a contour map. Here, when the EPEL structure according to an embodiment of the present invention is applied except the first electrode 202 and the second electrode 204, FIG. 17 shows the emission positions of the emission layers at an emission peak. Also, FIG. 17 shows emission positions of emission layers having a maximum emission range in emission areas of the emission layers.

Since the first EML 214 configuring the first emission part 210 is the blue emission layer, a peak wavelength range of the emission area of the first EML 214 may be 440 nm to 480 nm. When light is emitted at 440 nm to 480 nm that is an emission area of the blue emission layer, maximum efficiency is obtained in a white color area of the contour map.

Therefore, an emission position of the first EML 214 is set to a range of 150 Å to 650 Å, and thus, an emission peak 214E is located at 440 nm to 480 nm. Thus, the first EML 214 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the first EML 214 configuring the first emission part 210, a peak wavelength range of the emission area of the first EML 214 may be a range of 440 nm to 650 nm. Therefore, when light is emitted at 440 nm to 650 nm that is an emission area of the first EML 214, maximum efficiency is obtained in the white color area of the contour map.

In FIG. 17, for example, an emission position is shown in a case where the first EML 214 is the blue emission layer without adding an auxiliary emission layer into the first EML 214. Therefore, a peak wavelength range of an emission area of the first EML 214 realizes maximum efficiency at 440 nm to 480 nm.

Since the second EML 224 configuring the second emission part 220 is the yellow-green emission layer, a peak wavelength range of the emission area of the second EML 224 may be a range of 510 nm to 580 nm. When light is emitted at 510 nm to 580 nm that is an emission area of the yellow-green emission layer, maximum efficiency is obtained in the white color area of the contour map.

Therefore, an emission position of the second EML 224 is within a range of 1,700 Å to 2,300 Å, and thus, an emission peak 224E of the second EML 224 is located at 510 nm to 580 nm. Thus, the second EML 224 emits light at 510 nm to 580 nm, thereby obtaining maximum efficiency.

Moreover, the second EML 224 of the second emission part 220 may be configured with two layers (for example, a red emission layer and a green emission layer) depending on a characteristic or a structure of a device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the second EML 224, maximum efficiency is obtained in the white color area of the contour map.

The second EML 224 of the second emission part 220 may be configured with two layers (for example, a red emission layer and a yellow-green emission layer) depending on a characteristic or a structure of a device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the second EML 224, maximum efficiency is obtained in the white color area of the contour map.

The second EML 224 of the second emission part 220 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the second EML 224, maximum efficiency is obtained in the white color area of the contour map.

Therefore, when the second EML 224 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the second EML 124 may be 510 nm to 650 nm. In this case, when light is emitted at 510 nm to 650 nm that is the emission area of the second EML 124, maximum efficiency is obtained in the white color area of the contour map.

In FIG. 17, for example, an emission position is shown in a case where the second EML 224 is the yellow-green emission layer without adding an auxiliary emission layer into the second EML 224. Therefore, a peak wavelength range of an emission area of the second EML 224 realizes maximum efficiency at 510 nm to 580 nm.

Since the third EML 234 configuring the third emission part 230 is the blue emission layer, a peak wavelength range of the emission area of the third EML 234 may be a range of 440 nm to 480 nm. When light is emitted at 440 nm to 480 nm that is an emission area of the blue emission layer, maximum efficiency is obtained in the white color area of the contour map.

Therefore, an emission position of the third EML 234 is within a range of 2,400 Å to 3,000 Å, and thus, an emission peak 234E of the third EML 234 is located at 440 nm to 480 nm. Thus, the third EML 234 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the third EML 234 configuring the third emission part 230, a peak wavelength range of the emission area of the third EML 234 may be a range of 440 nm to 650 nm. Therefore, when light is emitted at 440 nm to 650 nm that is an emission area of the third EML 234, maximum efficiency is obtained in the white color area of the contour map.

In FIG. 17, for example, an emission position is shown in a case where the third EML 234 is the blue emission layer without adding an auxiliary emission layer into the third EML 234. Therefore, a peak wavelength range of an emission area of the third EML 234 realizes maximum efficiency at 440 nm to 480 nm.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

Therefore, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. Therefore, a maximum emission range of the first EML may be 440 nm to 470 nm, a maximum emission range of the second EML may be 530 nm to 570 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 18:
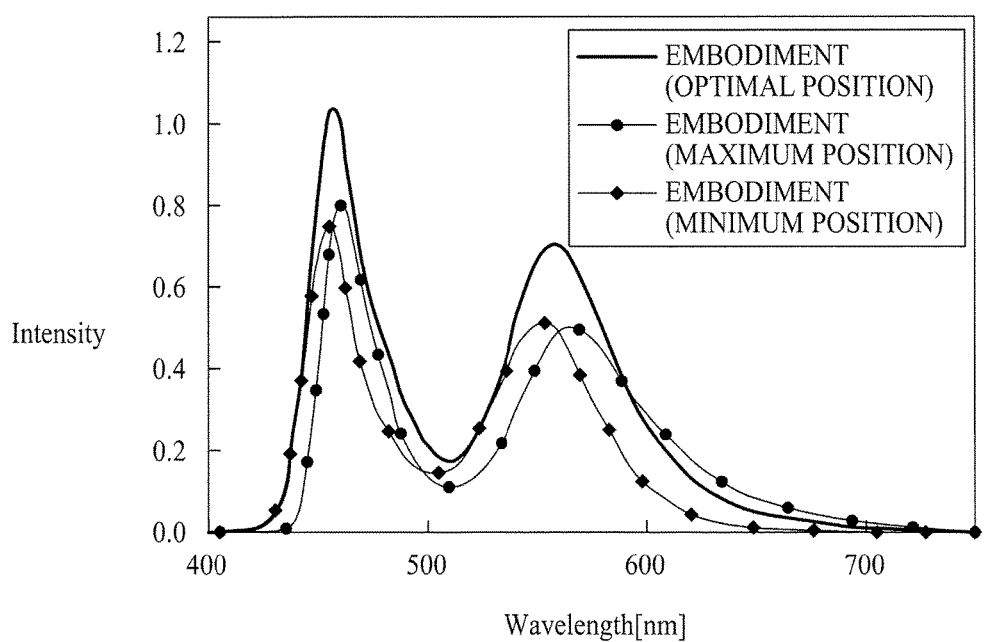
FIG. 18 is a diagram illustrating an EL spectrum according to the fifth embodiment of the present invention.

FIG. 18 is a diagram illustrating an EL spectrum according to the fifth embodiment of the present invention.

In FIG. 18, the abscissa axis indicates a wavelength range of light, and the ordinate axis indicates emission intensity. The emission intensity is a numerical value that is expressed as a relative value with respect to a maximum value of an EL spectrum.

In FIG. 18, a minimum position according to an embodiment is a portion which is set as a minimum position when emission positions of emission layers are set. For example, when the emission position L1 of the first EML 214 is within a range of 150 Å to 650 Å from the first electrode 202, the minimum position is set to 150 Å.

A maximum position according to an embodiment is a portion which is set as a maximum position when emission positions of emission layers are set. For example, when the emission position L1 of the first EML 214 is within a range of 150 Å to 650 Å from the first electrode 202, the maximum position is set to 650 Å.

An optimal position according to an embodiment is a portion which is set as an emission position according to a fifth embodiment of the present invention. For example, when the emission position L1 of the first EML 214 is within a range of 150 Å to 650 Å from the first electrode 202, an emission position according to an embodiment is within a range of 150 Å to 650 Å.

As shown in FIG. 18, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light, and is out of a peak wavelength range of the blue light. Also, it can be seen that emission intensity is reduced at 510 nm to 580 nm that is a peak wavelength range of yellow-green light. Also, it can be seen that emission intensity is considerably reduced at 600 nm to 650 nm that is a peak wavelength range of red light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light, and is out of a peak wavelength range of the blue light. Also, it can be seen that emission intensity is reduced at 510 nm to 580 nm that is the peak wavelength range of the yellow-green light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 9. When it is assumed that efficiency of a comparative example is 100%, the following Table 9 shows efficiency of a fifth embodiment of the present invention.

In the following Table 9, the comparative example relates to the bottom emission type white light emitting device including the first to third emission parts, the first emission part being configured with the blue emission layer, the second emission part being configured with the yellow-green emission layer, and the third emission part being configured with the blue emission layer. Also, an embodiment relates to a top emission type white light emitting device when an optimal position of the EPEL structure according to an embodiment of the present invention is applied.

TABLE 9

| Division | Red (R) Efficiency | Green (G) Efficiency | Blue (B) Efficiency | White (W) Efficiency | Average |
| --- | --- | --- | --- | --- | --- |
| Comparative Example | 100% | 100% | 100% | 100% | 100% |

TABLE 9-continued

| Division | Red (R) Efficiency | Green (G) Efficiency | Blue (B) Efficiency | White (W) Efficiency | Average |
| --- | --- | --- | --- | --- | --- |
| Embodiment (Optimal Position) | 139% | 163% | 147% | 161% | 153% |

As shown in Table 9, in comparison with the comparative example, when it is assumed that efficiency of the comparative example is 100% in a case where the EPEL structure is applied, it can be seen that red efficiency increases by about 39%, and green efficiency increases by about 63%. Also, it can be seen that blue efficiency increases by about 47%, and white efficiency increases by about 61%.

A panel efficiency of a white light emitting device having the EPEL structure and a panel efficiency of a comparative example are as listed in the following Table 10.

When it is assumed that an efficiency of an optimal position according to an embodiment is 100%, the following Table 10 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 10

| Division | Red (R) Efficiency | Green (G) Efficiency | Blue (B) Efficiency | White (W) Efficiency | Average |
| --- | --- | --- | --- | --- | --- |
| Embodiment (Minimum Position) | 38% | 76% | 68% | 68% | 62% |
| Embodiment (Optimal Position) | 100% | 100% | 100% | 100% | 100% |
| Embodiment (Maximum Position) | 120% | 66% | 73% | 76% | 84% |

As shown in Table 10, it can be seen that efficiencies of red, green, blue, and white are all reduced in a boundary between the embodiment (the minimum position) and the embodiment (the maximum position). To provide a description on comparison of Table 8 according to the fourth embodiment of the present invention and Table 10 according to the fifth embodiment of the present invention, it can be seen that efficiencies of red, green, blue, and white are more enhanced in a boundary of the embodiment (the minimum position) and the embodiment (the maximum position). Therefore, according to the fifth embodiment of the present invention, an organic light emitting display apparatus with more enhanced efficiency is provided. Also, it can be seen that efficiencies of red, green, blue, and white are more reduced in the embodiment (the minimum position) than the embodiment (the maximum position). Accordingly, when an emission position of the EPEL structure is out of an optimal position, it can be seen that panel efficiency is reduced.

As described above in the fifth embodiment of the present invention, the organic light emitting device may be a top emission type organic light emitting device.

A position of the second electrode may be within a range of 4,700 Å to 5,400 Å from the first electrode.

An emission position of the first EML may be within a range of 150 Å to 650 Å from the first electrode.

An emission position of the second EML may be within a range of 1,700 Å to 2,300 Å from the first electrode.

An emission position of the third EML may be within a range of 2,400 Å to 3,000 Å from the first electrode.

The first EML may be configured with one among a blue emission layer, a blue emission layer and a yellow-green emission layer, a blue emission layer and a red emission layer, and a blue emission layer and a green emission layer, or may be configured by a combination thereof.

The second EML may be configured with one among a yellow-green emission layer, a yellow emission layer and a red emission layer, a red emission layer and a green emission layer, and a yellow-green emission layer and a red emission layer, or may be configured by a combination thereof.

The third EML may be configured with one among a blue emission layer, a blue emission layer and a yellow-green emission layer, a blue emission layer and a red emission layer, or a blue emission layer and a green emission layer, or may be configured by a combination thereof.

An emission area of the first EML may be a range of 440 nm to 650 nm, an emission area of the second EML may be a range of 510 nm to 650 nm, and an emission area of the third EML may be a range of 440 nm to 650 nm.

A maximum emission range of the first EML may be a range of 440 nm to 470 nm, a maximum emission range of the second EML may be a range of 530 nm to 570 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 19:
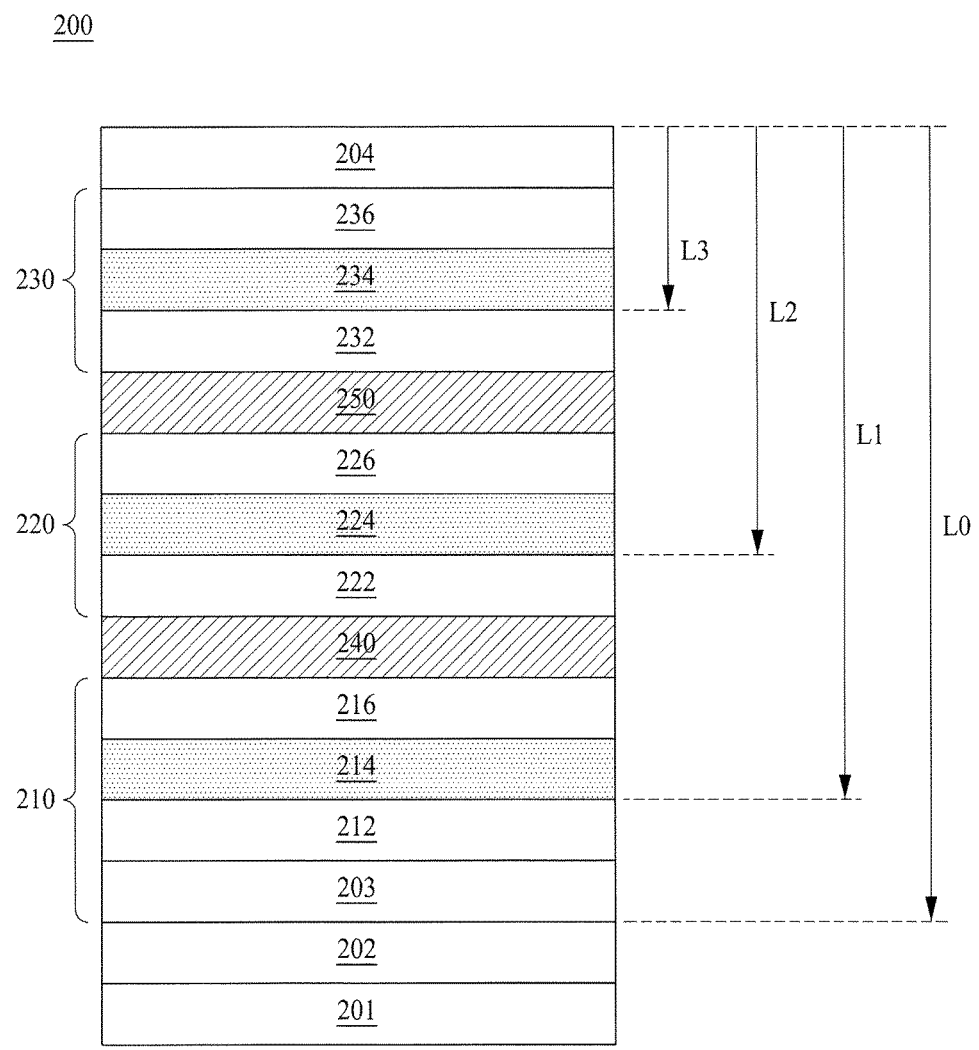
FIG. 19 is a diagram illustrating a white organic light emitting device according to a sixth embodiment of the present invention.

FIG. 19 is a diagram illustrating a white organic light emitting device 200 according to a sixth embodiment of the present invention. In describing the present embodiment, descriptions on elements which are the same as or correspond to the elements according to the preceding embodiment are not repeated. In the present embodiment, emission positions of emission layers are set from a second electrode, and may be set from the second electrode depending on a device design.

The white organic light emitting device 200 illustrated in FIG. 19 includes first and second electrodes 202 and 204 and first to third emission parts 210, 220 and 230 disposed between the first and second electrodes 202 and 204.

A position L0 of the first electrode 202 is within a range of 4,700 Å to 5,400 Å from the second electrode 204. Since the position L0 of the first electrode 202 is set, the emission peaks of the emission layers configuring the first to third emission parts 210, 220 and 230 is located at a specific wavelength, and light having the specific wavelength is emitted, thereby improving emission efficiency.

The third emission part 230 may include a third ETL 236, a third EML 234, and a third HTL 232 which are disposed under the second electrode 204. Although not shown, an EIL may be further formed on the third ETL 236. An HIL may be further formed under the third HTL 232. An HBL may be further formed on the third EML 234. The third ETL 236 and the HBL may be provided as one layer or single layer.

An EBL may be further formed under the third EML 234. The third EML 232 and the EBL may be provided as one layer or single layer.

The third EML 234 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the third EML 234 is provided along with the auxiliary emission layer, the yellow-green emission layer, the red emission layer, or the green emission layer may be disposed on or under the third EML 234. Also, the yellow-green emission layer, the red emission layer, or the green emission layer may be identically or differently provided as the auxiliary emission layer on and under the third EML 234. The positions or number of emission layers may be selectively determined depending on a structure and a characteristic of an organic light emitting device, but the present embodiment is not limited thereto.

When the auxiliary emission layer is provided in the third EML 234, a peak wavelength of an emission area of the third EML 234 may be within a range of 440 nm to 650 nm. Here, the peak wavelength may be an emission area.

Each of the third ETL 236, the third EML 234, the EIL, and the HBL may be referred to as an organic layer. All organic layers between the second electrode 204 and the third EML 234, and the third EML 134 may be referred to as an organic layer. Therefore, all organic layers between the second electrode 204 and the third EML 234 may be referred to as a fourth organic layer.

An emission position L3 of the third EML 234 may be within a range of 2,050 Å to 2,750 Å from the second electrode 204 irrespective of at least one among the number or thickness of the third ETL 236, the number or thickness of the third EML 234, the number or thickness of the EIL, the number or thickness of the HBL, the number or thickness of the second electrode 204, or the number or thickness of the organic layers between the second electrode 204 and the third EML 234. Therefore, the emission position L3 of the third EML 234 may be within a range of 2,050 Å to 2,750 Å from the second electrode 204 irrespective of at least one among the number of fourth organic layers, a thickness of the fourth organic layer, the number of third EMLs, and a thickness of the third EML.

The second emission part 220 may include a second HTL 222, a second EML 224, and a second ETL 226.

An HIL may be further formed under the second HTL 222. An HBL may be further formed on the second EML 224. The second ETL 226 and the HBL may be provided as one layer or single layer.

An EBL may be further formed under the second EML 224. The second HTL 222 and the EBL may be provided as one layer or single layer.

The second EML 224 may be configured with a yellow-green emission layer. A peak wavelength of an emission area of the yellow-green emission layer may be within a range of 510 nm to 580 nm. Here, the peak wavelength may be an emission area.

The second EML 224 may be configured with one among a yellow-green emission layer, a yellow emission layer and a red emission layer, the red emission layer and a green emission layer, and the yellow-green emission layer and the red emission layer, or may be configured by a combination thereof. When the red emission layer is further provided along with the yellow-green emission layer, an emission efficiency of the red emission layer can be further improved. The red emission layer may be disposed on or under the yellow-green emission layer.

Moreover, the yellow emission layer and the red emission layer, the red emission layer and the green emission layer, or the yellow-green emission layer and the red emission layer may be disposed on or under the second EML 224. Also, the yellow emission layer and the red emission layer, the red emission layer and the green emission layer, or the yellow-green emission layer and the red emission layer may be identically or differently provided as the auxiliary emission layer on and under the second EML 224.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the second EML 224 is configured with two layers (for example, the yellow emission layer and the red emission layer), an emission efficiency of the red emission layer can increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the second EML 224 is configured with two layers (for example, the red emission layer and the green emission layer), a color reproduction rate can be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer of the second EML 224 may be within a range of 540 nm to 650 nm. Here, the peak wavelength may be an emission area. When the second EML 224 is configured with two layers (for example, the yellow emission layer and the red emission layer), an emission efficiency of the red emission layer can increase.

Moreover, the second EML 224 of the second emission part 220 may be configured with two layers (for example, the red emission layer and the yellow-green emission layer) depending on a characteristic or a structure of a device. A peak wavelength of an emission area of the red emission layer may be within a range of 600 nm to 650 nm. A peak wavelength of an emission area of the yellow-green emission layer may be within a range of 510 nm to 580 nm. When the second EML 224 is configured with two layers (for example, the red emission layer and the yellow-green emission layer), an emission efficiency of the red emission layer can increase. In this case, a peak wavelength of an emission area of the second EML 224 may be within a range of 510 nm to 650 nm. Here, the peak wavelength may be an emission area.

When the second EML 224 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the second EML 224 may be within a range of 510 nm to 650 nm. Here, the peak wavelength may be an emission area.

A second CGL 250 may be further formed between the second emission part 220 and the third emission part 230. The second CGL 250 may include an N-type CGL and a P-type CGL.

Each of the second EML 224, the second ETL 226, the third HTL 232, the second CGL 250, the HIL, the EBL, and the HBL may be referred to as an organic layer. All organic layers between the second EML 224 and the third EML 234, and the second EML 224 may be referred to as an organic layer. Therefore, all organic layers between the second EML 224 and the third EML 234 may be referred to as a third organic layer.

An emission position L2 of the second EML 224 may be within a range of 2,850 Å to 3,550 Å from the second electrode 204 irrespective of at least one among the number or thickness of the third HTL 232, the number or thickness of the second ETL 226, the number or thickness of the second CGL 250, the number or thickness of the HBL, the number or thickness of the EBL, the number or thickness of the HIL, the number or thickness of the third EML 234, the number or thickness of the second EML 224, the number or thickness of the organic layers disposed between the second electrode 204 and the third EML 234, or the number or thickness of the organic layers disposed between the third EML 234 and the second EML 224. Alternatively, the emission position L2 of the second EML 224 may be within a range of 2,850 Å to 3,550 Å from of the second electrode 204 irrespective of at least one among the number or thickness of the organic layers between the third EML 234 and the second EML 224.

Therefore, the emission position L2 of the second EML 224 may be within a range of 2,850 Å to 3,550 Å from the second electrode 204 irrespective of at least one among the number of the fourth organic layers, a thickness of the fourth organic layer, the number of the third organic layers, a thickness of the third organic layer, the number of the third EMLs, a thickness of the third EML, the number of the second EMLs, and a thickness of the second EML.

The first emission part 210 may include a first HTL 212, a first EML 214, and a first ETL 216 which are disposed on the first electrode 202. An auxiliary electrode 203 may be formed on the first electrode 202. However, the auxiliary electrode 203 may not be provided depending on a characteristic or a structure of an organic light emitting device.

Although not shown, the first emission part 210 may further include an HIL disposed under the first HTL 212. An HBL may be further formed on the first EML 214. The first ETL 216 and the HBL may be provided as one layer or single layer.

An EBL may be further formed under the first EML 214. The first HTL 212 and the EBL may be provided as one layer or single layer.

The first EML 214 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the first EML 214 is provided along with the auxiliary emission layer, the yellow-green emission layer, the red emission layer, or the green emission layer may be disposed on or under the first EML 214. Also, the yellow-green emission layer, the red emission layer, or the green emission layer may be identically or differently provided as the auxiliary emission layer on and under the first EML 214. The positions or number of emission layers may be selectively determined depending on a structure and a characteristic of a device, but the present embodiment is not limited thereto.

When the auxiliary emission layer is provided in the first EML 214, a peak wavelength of an emission area of the first EML 214 may be within a range of 440 nm to 650 nm. Here, the peak wavelength may be an emission area.

A first CGL 240 may be further formed between the first emission part 210 and the second emission part 220. The first CGL 240 may include an N-type CGL and a P-type CGL.

Each of the first EML 214, the first ETL 216, the first CGL 240, the second HTL 222, the HBL, the EBL, and the HTL may be referred to as an organic layer. All organic layers between the second EML 224 and the first EML 214, and the first EML 214 may be referred to as an organic layer. Therefore, all organic layers between the second EML 224 and the first EML 214 may be referred to as a second organic layer.

An emission position L1 of the first EML 214 may be within a range of 4,450 Å to 5,000 Å from the second electrode 204 irrespective of at least one among the number or thickness of the second ETL 216, the number or thickness of the second CGL 240, the number or thickness of the third HTL 222, the number or thickness of the HBL, the number or thickness of the EBL, the number or thickness of the HIL, the number or thickness of the third EML 234, the number or thickness of the second EML 224, the number or thickness of the first EML 214, the number or thickness of the organic layers between the second electrode 204 and the third EML 234, the number or thickness of the organic layers between the third EML 234 and the second EML 224, or the number or thickness of the organic layers between the first EML 214 and the second EML 224.

Therefore, the emission position L1 of the first EML 214 may be within a range of 4,450 Å to 5,000 Å from the second electrode 204 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, and a thickness of the first EML.

All organic layers such as the auxiliary electrode 203, the first HTL 212, the EBL, and the HTL may be referred to as an organic layer. All organic layers between the first electrode 202 and the first EML 214, and the first EML 214 may be referred to as an organic layer. Therefore, all organic layers between the first electrode 202 and the first EML 214 may be referred to as a first organic layer.

A position L0 of the first electrode 202 may be within a range of 4,700 Å to 5,400 Å from the second electrode 204 irrespective of at least one among the number or thickness of the auxiliary electrode 203, the number or thickness of the first HTL 212, the number or thickness of the EBL, the number or thickness of the HIL, the number or thickness of the third EML 234, the number or thickness of the second EML 224, the number or thickness of the first EML 214, the number or thickness of the organic layers between the second electrode 204 and the third EML 234, the number or thickness of the organic layers between the third EML 234 and the second EML 224, the number or thickness of the organic layers between the first EML 214 and the second EML 224, or the number or thickness of the organic layers between the first electrode 202 and the first EML 214.

Therefore, the position L0 of the first electrode 202 may be within a range of 4,700 Å to 5,400 Å from the second electrode 204 irrespective of at least one among the number of the fourth organic layers, a thickness of the fourth organic layer, the number of the third organic layers, a thickness of the third organic layer, the number of the second organic layers, a thickness of the second organic layer, the number of the first organic layers, a thickness of the first organic layer, the number of the third EMLs, a thickness of the third EML, the number of the second EMLs, a thickness of the second EML, the number of the first EMLs, and a thickness of the first EML.

Here, the emission position L1 of the first EML 214 may be within a range of 4,450 Å to 5,000 Å from the second electrode 204. Also, the position L0 of the first electrode 202 is within a range of 4,700 Å to 5,400 Å from the second electrode 204. Also, when the emission position L1 of the first EML 214 is set to 5,000 Å from the second electrode 204, the position L0 of the first electrode 202 is within a range of 5,050 Å to 5,400 Å from the second electrode 204.

Therefore, the present invention may set the position of the first electrode 202 and positions of emission layers from the second electrode 204 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML.

The structure illustrated in FIG. 19 is an example of the present invention, and may be selectively changed depending on a structure or a characteristic of an organic light emitting device. However, the present embodiment is not limited thereto.

Figure 20:
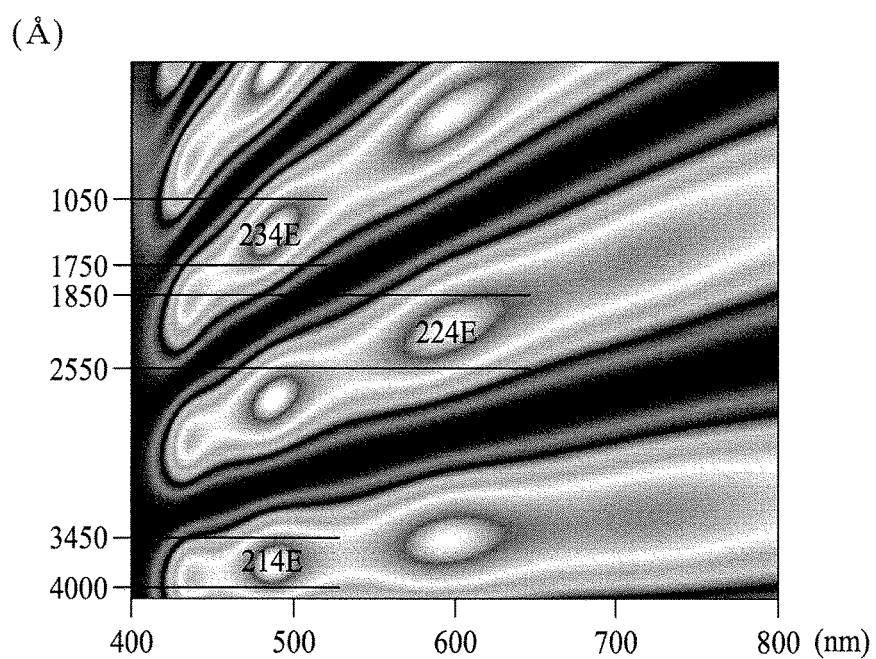
FIG. 20 is a diagram illustrating an emission position of an organic light emitting device according to the sixth embodiment of the present invention.

FIG. 20 is a diagram illustrating an emission position of an organic light emitting device according to a sixth embodiment of the present invention.

In FIG. 20, the abscissa axis indicates a wavelength range of light, and the ordinate axis indicates emission positions of emission layers configuring the emission part from the second electrode 204 and may be referred to as a contour map. Here, when the EPEL structure according to an embodiment of the present invention is applied except the first electrode 202 and the second electrode 204, FIG. 20 shows the emission positions of the emission layers at an emission peak. Also, FIG. 20 shows emission positions of emission layers having a maximum emission range in emission areas of the emission layers. FIG. 20 shows emission positions of the emission layers except 1,000 Å that is a thickness of the second electrode 204. And the thickness of the second electrode 204 does not limit details of the present invention.

Since the third EML 234 configuring the third emission part 230 is the blue emission layer, a peak wavelength range of the emission area of the third EML 234 may be a range of 440 nm to 480 nm. When light is emitted at 440 nm to 480 nm that is an emission area of the blue emission layer, maximum efficiency is obtained in a white color area of a contour map.

Therefore, an emission position of the third EML 234 is within a range of 2,050 Å to 2,750 Å, and thus, an emission peak 234E of the third EML 234 is located at 440 nm to 480 nm. Thus, the third EML 234 emits light at 440 nm to 480 nm, thereby obtaining maximum efficiency. As described above, in FIG. 20, the emission position of the third EML 234 is illustrated as 1,050 □ to 1,750 □, which is a value that is obtained by subtracting 1,000 Å that is a thickness of the second electrode 204. Accordingly, the emission position of the third EML 234 may be a range of 2,050 Å to 2,750 Å. This may be identically applied to an emission position of the second EML 224 and an emission position of the first EML 214.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the third EML 234 configuring the third emission part 230, a peak wavelength range of the emission area of the third EML 234 may be a range of 440 nm to 650 nm. Therefore, when light is emitted at 440 nm to 650 nm that is an emission area of the third EML 234, maximum efficiency is obtained in the white color area of the contour map.

In FIG. 20, for example, an emission position is shown in a case where the third EML 234 is the blue emission layer without adding an auxiliary emission layer into the third EML 234. Therefore, a peak wavelength range of an emission area of the third EML 234 realizes maximum efficiency at 440 nm to 480 nm.

Since the second EML 224 configuring the second emission part 220 is the yellow-green emission layer, a peak wavelength range of the emission area of the second EML 224 may be a range of 510 nm to 580 nm. When light is emitted at 510 nm to 580 nm that is an emission area of the yellow-green emission layer, maximum efficiency is obtained in the white color area of the contour map.

Therefore, an emission position of the second EML 224 is within a range of 2,850 Å to 3,550 Å, and thus, an emission peak 224E of the second EML 224 is located at 510 nm to 580 nm. Thus, the second EML 224 emits light at 510 nm to 580 nm, thereby obtaining maximum efficiency.

Moreover, the second EML 224 of the second emission part 220 may be configured with two layers (for example, a red emission layer and a green emission layer) depending on a characteristic or a structure of an organic light emitting device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the second EML 224, maximum efficiency is obtained in the white color area of the contour map.

The second EML 224 of the second emission part 220 may be configured with two layers (for example, a red emission layer and a yellow-green emission layer) depending on a characteristic or a structure of a device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the second EML 224, maximum efficiency is obtained in the white color area of the contour map.

The second EML 224 of the second emission part 220 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the second EML 224, maximum efficiency is obtained in the white color area of the contour map.

Therefore, when the second EML 224 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the second EML 124 may be 510 nm to 650 nm.

In FIG. 20, for example, an emission position is shown in a case where the second EML 224 is the yellow-green emission layer without adding an auxiliary emission layer into the second EML 224. Therefore, a peak wavelength range of an emission area of the second EML 224 realizes maximum efficiency at 510 nm to 580 nm.

Since the first EML 214 configuring the first emission part 210 is the yellow-green emission layer, a peak wavelength range of the emission area of the first EML 214 may be a range of 440 nm to 480 nm. When light is emitted at 440 nm to 480 nm that is an emission area of the blue emission layer, maximum efficiency is obtained in the white color area of the contour map.

Therefore, an emission position of the first EML 214 is within a range of 4,450 Å to 5,000 Å, and thus, an emission peak 214E is located at 440 nm to 480 nm. Thus, the first EML 214 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the first EML 214 configuring the first emission part 210, a peak wavelength range of the emission area of the first EML 214 may be a range of 440 nm to 650 nm. Therefore, when light is emitted at 440 nm to 650 nm that is an emission area of the first EML 214, maximum efficiency is obtained in the white color area of the contour map.

In FIG. 20, for example, an emission position is shown in a case where the first EML 214 is the blue emission layer without adding an auxiliary emission layer into the first EML 214. Therefore, a peak wavelength range of an emission area of the first EML 214 realizes maximum efficiency at 440 nm to 480 nm.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

Therefore, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. Therefore, a maximum emission range of the first EML may be 440 nm to 470 nm, a maximum emission range of the second EML may be 530 nm to 570 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 21:
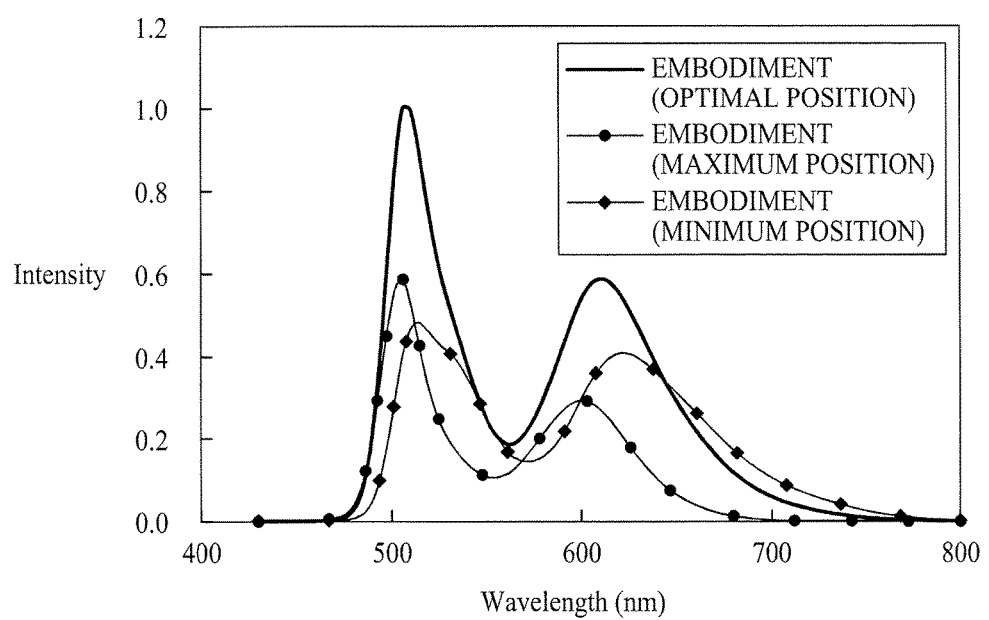
FIG. 21 is a diagram illustrating an EL spectrum according to the sixth embodiment of the present invention.

FIG. 21 is a diagram illustrating an EL spectrum according to a sixth embodiment of the present invention.

In FIG. 21, the abscissa axis indicates a wavelength range of light, and the ordinate axis indicates emission intensity. The emission intensity is a numerical value that is expressed as a relative value with respect to a maximum value of an EL spectrum.

In FIG. 21, a minimum position according to an embodiment is a portion which is set as a minimum position when emission positions of emission layers are set. For example, when the emission position L3 of the third EML 234 is within a range of 2,050 Å to 2,750 Å from the second electrode 204, the minimum position is set to 2,050 Å.

A maximum position according to an embodiment is a portion which is set as a maximum position when emission positions of emission layers are set. For example, when the emission position L3 of the third EML 234 is within a range of 2,050 Å to 2,750 Å from the second electrode 204, the maximum position is set to 2,050 Å.

An optimal position according to an embodiment is a portion which is set as an emission position according to a sixth embodiment of the present invention. For example, when the emission position L3 of the third EML 234 is within a range of 2,050 Å to 2,750 Å from the second electrode 204, an emission position according to an embodiment is within a range of 2,050 Å to 2,750 Å.

As shown in FIG. 21, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light, and is out of a peak wavelength range of the blue light. Also, it can be seen that emission intensity is reduced at 510 nm to 580 nm that is a peak wavelength range of yellow-green light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light, and is out of a peak wavelength range of the blue light. Also, it can be seen that emission intensity is reduced at 510 nm to 580 nm that is the peak wavelength range of the yellow-green light. Also, it can be seen that emission intensity is considerably reduced at 600 nm to 650 nm that is a peak wavelength range of red light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 11. When it is assumed that efficiency of a comparative example is 100%, the following Table 11 shows efficiency of a sixth embodiment of the present invention.

In the following Table 11, the comparative example relates to the bottom emission type white light emitting device including the first to third emission parts, the first emission part being configured with the blue emission layer, the second emission part being configured with the yellow-green emission layer, and the third emission part being configured with the blue emission layer. Also, an embodiment relates to a top emission type white light emitting device when an optimal position of the EPEL structure according to an embodiment of the present invention is applied.

TABLE 11

| Division | Red (R) Efficiency | Green (G) Efficiency | Blue (B) Efficiency | White (W) Efficiency | Average |
|---|---|---|---|---|---|
| Comparative Example | 100% | 100% | 100% | 100% | 100% |
| Embodiment (Optimal Position) | 139% | 163% | 147% | 161% | 153% |

As shown in Table 11, in comparison with the comparative example, when it is assumed that efficiency of the comparative example is 100% in a case where the EPEL structure is applied, it can be seen that red efficiency increases by about 39%, and green efficiency increases by about 63%. Also, it can be seen that blue efficiency increases by about 47%, and white efficiency increases by about 61%.

A panel efficiency of a white light emitting device having the EPEL structure and a panel efficiency of a comparative example are as listed in the following Table 12.

When it is assumed that an efficiency of an optimal position according to an embodiment is 100%, the following Table 12 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 12

| Division | Red (R) Efficiency | Green (G) Efficiency | Blue (B) Efficiency | White (W) Efficiency | Average |
|---|---|---|---|---|---|
| Embodiment (Minimum Position) | 122% | 65% | 65% | 75% | 82% |
| Embodiment (Optimal Position) | 100% | 100% | 100% | 100% | 100% |
| Embodiment (Maximum Position) | 18% | 53% | 49% | 44% | 41% |

As shown in Table 12, it can be seen that efficiencies of red, green, blue, and white are all reduced in a boundary between the embodiment (the minimum position) and the embodiment (the maximum position). Also, it can be seen that efficiencies of red, green, blue, and white are more reduced in the embodiment (the minimum position) than the embodiment (the maximum position). Accordingly, when an emission position of the EPEL structure is out of an optimal position, it can be seen that panel efficiency is reduced.

As described above in the sixth embodiment of the present invention, the organic light emitting device may be a top emission type organic light emitting device.

A position of the first electrode may be within a range of 4,700 Å to 5,400 Å from the second electrode.

An emission position of the third EML may be within a range of 2,050 Å to 2,750 Å from the second electrode.

An emission position of the second EML may be within a range of 2,850 Å to 3,550 Å from the second electrode.

The emission position of the third EML may be within a range of 4,450 Å to 5,000 Å from the second electrode.

The first EML may be configured with one among a blue emission layer, a blue emission layer and a yellow-green emission layer, a blue emission layer and a red emission layer, and a blue emission layer and a green emission layer, or may be configured by a combination thereof.

The second EML may be configured with one among a yellow-green emission layer, a yellow emission layer and a red emission layer, a red emission layer and a green emission layer, and a yellow-green emission layer and a red emission layer, or may be configured by a combination thereof.

The third EML may be configured with one among a blue emission layer, a blue emission layer and a yellow-green emission layer, a blue emission layer and a red emission layer, or a blue emission layer and a green emission layer, or may be configured by a combination thereof.

An emission area of the first EML may be a range of 440 nm to 650 nm, an emission area of the second EML may be a range of 510 nm to 650 nm, and an emission area of the third EML may be a range of 440 nm to 650 nm.

A maximum emission range of the first EML may be a range of 440 nm to 470 nm, a maximum emission range of the second EML may be a range of 530 nm to 570 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 22:
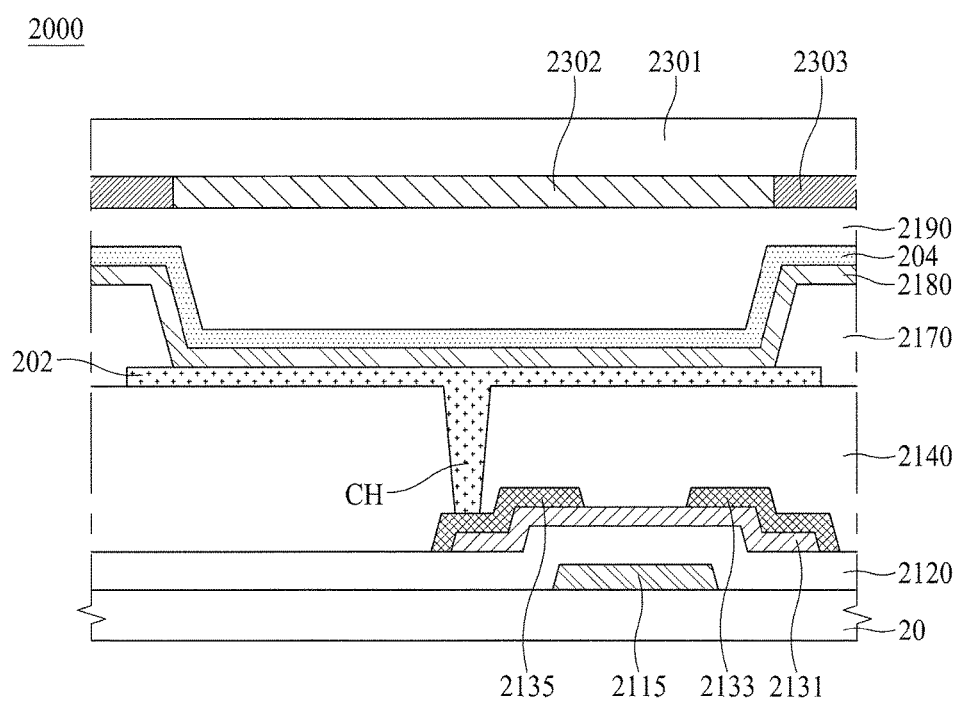
FIG. 22 is a diagram illustrating an organic light emitting device according to the fourth to sixth embodiments of the present invention.

FIG. 22 is a cross-sectional view illustrating an organic light emitting device 1000 according to an embodiment of the present invention, and uses the above-described organic light emitting device according to the fourth to sixth embodiments of the present invention.

As illustrated in FIG. 22, the organic light emitting device 1000 according to an embodiment of the present invention includes a substrate 20, a thin film transistor TFT, a first electrode 202, an emission part 2180, and a second electrode 204. The TFT includes a gate electrode 2115, a gate insulator 2120, a semiconductor layer 2131, a source electrode 2133, and a drain electrode 2135.

In FIG. 22, the thin film transistor TFT is illustrated as having an inverted staggered structure, but may be formed in a coplanar structure.

The substrate 20 may be formed of glass, metal, or plastic.

The gate electrode 2115 may be formed on the substrate 20 and may be connected to a gate line (not shown). The gate electrode 1115 may include a multilayer formed of one selected from the group consisting of molybdenum (Mo), aluminum (Al), chromium (Cr), gold (Au), titanium (Ti), nickel (Ni), neodymium (Nd), and copper (Cu) or an alloy thereof.

The gate insulator 2120 may be formed on the gate electrode 2115 and may be formed of silicon oxide (SiOx), silicon nitride (SiNx), or a multilayer thereof, but is not limited thereto.

The semiconductor layer 2131 may be formed on the gate insulator 2120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper (not shown) may be formed on the semiconductor layer 2131 and may protect the semiconductor layer 2131, but may be omitted depending on a configuration of a device.

The source electrode 2133 and the drain electrode 1135 may be formed on the semiconductor layer 2131. The source electrode 2133 and the drain electrode 2135 may be formed of a single layer or a multilayer, and may be formed of one selected from the group consisting of molybdenum (Mo), aluminum (Al), chromium (Cr), gold (Au), titanium (Ti), nickel (Ni), neodymium (Nd), and copper (Cu) or an alloy thereof.

A passivation layer 2140 may be formed on the source electrode 2133 and the drain electrode 2135, and may be formed of SiOx, SiNx, or a multilayer thereof. Alternatively, the passivation layer 2140 may be formed of an acryl resin or a polyimide resin, but is not limited thereto.

The first electrode 202 may be formed on the passivation layer 2140.

A reflective electrode may be further formed under the first electrode 202, and may reflect light toward the second electrode 204. Also, an auxiliary electrode may be further formed on the first electrode 202.

The first electrode 202 may be electrically connected to the drain electrode 2135 through a contact hole CH which is formed in a certain area of the passivation layer 2140. In FIG. 22, the drain electrode 2135 is illustrated as being electrically connected to the first electrode 202, but the present embodiment is not limited thereto. As another example, the source electrode 2133 may be electrically connected to the first electrode 202 through the contact hole CH which is formed in the certain area of the passivation layer 2140.

A bank layer 2170 may be formed on the first electrode 202 and may define a pixel area. That is, the bank layer 2170 may be formed in a boundary area between a plurality of pixels, and thus, the pixel area may be defined by the bank layer 2170.

The emission part 2180 may be formed on the bank layer 2170. As illustrated in the fourth to sixth embodiments of the present invention, the emission part 2180 may include a first emission part, a second emission part, and a third emission part which are formed on the first electrode 202.

The second electrode 204 may be formed on the emission part 2180. Also, a buffer layer may be further formed under the second electrode 204.

An encapsulation layer 2190 may be formed on the second electrode 204. The encapsulation layer 2190 prevents moisture from penetrating into the emission part 2180. The encapsulation layer 2190 may include a plurality of layers where different inorganic materials are stacked, or include a plurality of layers where an inorganic material and an organic material are alternately stacked. An encapsulation substrate 2301 may be bonded to the first substrate 20 by the encapsulation layer 2190. The encapsulation substrate 2301 may be formed of glass, plastic, or metal. A color filter 2302 and a black matrix 2303 may be disposed on the encapsulation substrate 2301. Light emitted from the emission part 2180 may travel toward the encapsulation substrate 2301 and pass through the color filter 2302, thereby displaying an image.

The inventors have invented a top emission type white organic light emitting device having a new structure where panel efficiency and emission efficiency of an emission layer are enhanced and luminance and an aperture ratio are enhanced. The inventors have a white organic light emitting device where emission layers emitting light of the same color are disposed adjacent to each other, and thus, blue efficiency is further enhanced. An aperture ratio of the top emission type white organic light emitting device according to an embodiment of the present invention is more enhanced than that of the bottom emission type white organic light emitting device.

Figure 23:
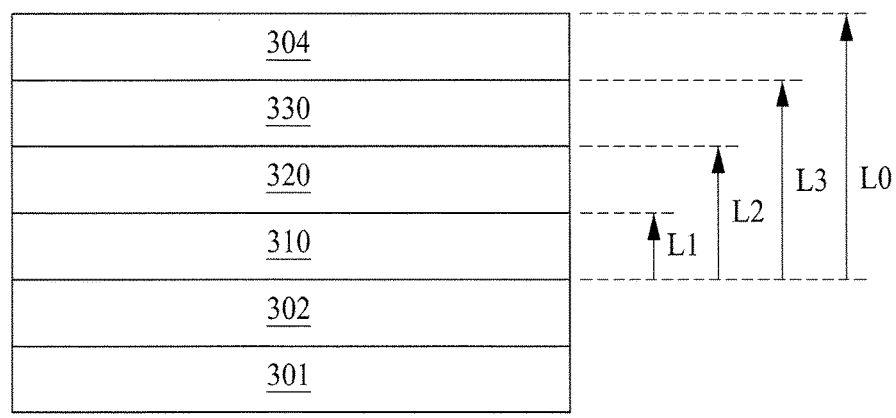
FIG. 23 is a schematic diagram illustrating a white organic light emitting device according to seventh and eighth embodiments of the present invention.

FIG. 23 is a schematic diagram illustrating a white organic light emitting device 300 according to seventh and eighth embodiments of the present invention.

The white organic light emitting device 300 illustrated in FIG. 23 includes first and second electrodes 302 and 304 and first to third emission parts 310, 320 and 330 disposed between the first and second electrodes 302 and 304.

The first electrode 302 is an anode that supplies a hole. The second electrode 304 is a cathode that supplies an electron. Each of the first electrode 302 and the second electrode 304 may be referred to as an anode or a cathode. The first electrode 302 may be a reflective electrode, and the second electrode 304 may be a semitransmissive electrode.

The top emission type white organic light emitting device 300 may include the first emission part 310, the second emission part 320, and the third emission part 330 which are disposed between the first electrode 302 and the second electrode 304.

Moreover, a position of the second electrode 304, an emission position of a first emission layer, an emission position of a second emission layer, and an emission position of a third emission layer may be set from the first electrode 302, thereby improving emission efficiency and panel efficiency. That is, an emission position of emitting layers (EPEL) structure may be applied to the first to third emission layers. Also, at least two of the first to third emission layers emit light having the same color, and thus, provided is a white organic light emitting device where emission efficiency is enhanced. Emission layers that emit light having the same color may be referred to as an emission layer that includes one or more emission layers emitting light having the same color.

A position L0 of the second electrode 304 is within a range of 4,700 Å to 5,400 Å from the first electrode 302. Also, emission peaks of emission layers configuring the first to third emission parts 310, 320 and 330 are located at a specific wavelength, and light having the specific wavelength is emitted, thereby improving emission efficiency. The emission peak may be referred to as an emission peak of an organic layer configuring the emission parts.

The position L0 of the second electrode 304 may be set from the first electrode 301, and an emission position L1 of the first emission part 310 closest to the first electrode 301 may be within a range of 200 Å to 700 Å. Alternatively, the emission position L1 of the first emission part 310 may be within a range of 200 Å to 700 Å from a reflective surface of the first electrode 301. The first emission part 310 may be configured with a yellow-green emission layer. The emission position L1 of the first emission part 310 may be within a range of 200 Å to 700 Å from the first electrode 302 irrespective of at least one among a thickness of the emission layer, the number of the emission layers, a thickness of the organic layer, and the number of the organic layers. Therefore, the emission peak is located in a yellow-green emission area, and light having a wavelength corresponding to the emission peak is emitted, thereby enabling the first emission part 310 to realize the maximum luminance. A peak wavelength of an emission area of the yellow-green emission layer may be 510 nm to 580 nm. Here, the peak wavelength may be an emission area.

Moreover, the first emission part 310 may be configured with two layers (for example, a red emission layer and a green emission layer) depending on a characteristic or a structure of a device. A peak wavelength of an emission area of the red emission layer may be 600 nm to 650 nm. A peak wavelength of an emission area of the green emission layer may be 510 nm to 560 nm. Therefore, when the first emission part 310 is configured with two layers (for example, the red emission layer and the green emission layer), a peak wavelength of an emission area may be 510 nm to 650 nm. Here, the peak wavelength may be an emission area. When the first emission part 310 is configured with two layers (for example, the red emission layer and the green emission layer), a color reproduction rate can be enhanced.

Moreover, the first emission part 310 may be configured with two layers (for example, a red emission layer and a yellow-green emission layer) depending on a characteristic or a structure of an organic light emitting device. A peak wavelength of an emission area of the red emission layer may be 600 nm to 650 nm. A peak wavelength of an emission area of the yellow-green emission layer may be 510 nm to 580 nm. Therefore, when the first emission part 310 is configured with two layers (for example, the red emission layer and the yellow-green emission layer), a peak wavelength of an emission area may be 510 nm to 650 nm. Here, the peak wavelength may be an emission area. When the first emission part 310 is configured with two layers (for example, the red emission layer and the yellow-green emission layer), an emission efficiency of the red emission layer can be enhanced.

Moreover, the first emission part 310 may be configured with two layers (for example, a yellow emission layer and a red emission layer) depending on a characteristic or a structure of a device. A peak wavelength of an emission area of the yellow emission layer and the red emission layer may be 540 nm to 650 nm. Here, the peak wavelength may be an emission area. When the first emission part 310 is configured with two layers (for example, the yellow emission layer and the red emission layer), an emission efficiency of the red emission layer can be enhanced.

An emission position L2 of the second emission part 310 may be within a range of 1,200 Å to 1,800 Å from the first electrode 302. Alternatively, the emission position L2 of the second emission part 320 may be within a range of 1,200 Å to 1,800 Å from a reflective surface of the first electrode 302.

The second emission part 320 may be configured with a blue emission layer. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

An emission position L2 of the second emission part 320 may be within a range of 1,200 Å to 1,800 Å from the first electrode 302 irrespective of at least one among a thickness of the emission layer, the number of the emission layers, a thickness of the organic layer, and the number of the organic layers. Alternatively, the emission position L2 of the second emission part 320 may be within a range of 1,200 Å to 1,800 Å from a reflective surface of the first electrode 302.

Therefore, an emission peak of the second emission part 320 is located in a blue emission area, and light having a wavelength corresponding to the emission peak is emitted, thereby enabling the second emission part 320 to realize the maximum luminance. A peak wavelength range of an emission area of the blue emission layer may be 440 nm to 480 nm. Also, an auxiliary emission layer of the second emission part 320 may be configured with one among a red emission layer, a green emission layer, and a yellow-green emission layer, or may be configured by a combination thereof. A peak wavelength of an emission area of each of the auxiliary emission layer and the emission layer configuring the second emission part 320 may be 440 nm to 650 nm. Here, the peak wavelength may be an emission area.

An emission position L3 of the third emission part 330 may be within a range of 2,400 Å to 3,100 Å from the first electrode 302. Alternatively, the emission position L3 of the third emission part 330 may be within a range of 2,400 Å to 3,100 Å from the reflective surface of the first electrode 302.

The third emission part 330 may be configured with a blue emission layer. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The emission position L3 of the third emission part 330 may be within a range of 2,400 Å to 3,100 Å from the first electrode 302 irrespective of at least one among a thickness of the among emission layer, the number of the emission layers, a thickness of the organic layer, and the number of the organic layers. Alternatively, the emission position L3 of the third emission part 330 may be within a range of 2,400 Å to 3,100 Å from the reflective surface of the first electrode 302. Therefore, an emission peak of the third emission part 330 is located in a blue emission area, thereby enabling the third emission part 330 to realize the maximum luminance. A peak wavelength range of an emission area of the blue emission layer may be 440 nm to 480 nm. Also, an auxiliary emission layer of the third emission part 330 may be configured with one among a red emission layer, a green emission layer, and a yellow-green emission layer, or may be configured by a combination thereof. A peak wavelength of an emission area of each of the auxiliary emission layer and the emission layer configuring the third emission part 330 may be 440 nm to 650 nm. Here, the peak wavelength may be an emission area.

The present invention relates to the top emission type white organic light emitting device having the EPEL structure where the emission positions of the emission layers are set irrespective of at least one among a thickness of the emission layer, the number of the emission layers, a thickness of the organic layer, and the number of the organic layers. Also, the first to third emission parts have the EPEL structure that has a maximum emission range in emission areas of the first to third emission layers.

Figure 24:
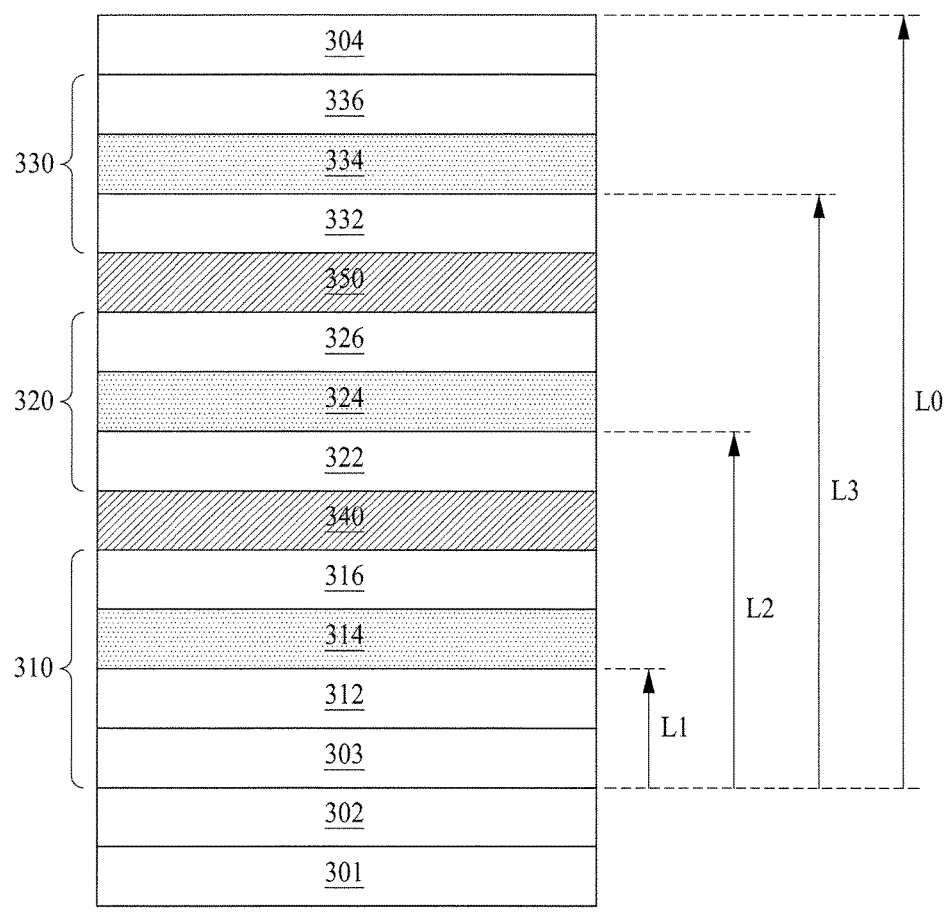
FIG. 24 is a diagram illustrating a white organic light emitting device according to the seventh embodiment of the present invention.

FIG. 24 is a diagram illustrating a white organic light emitting device 300 according to a seventh embodiment of the present invention.

The white organic light emitting device 300 illustrated in FIG. 24 includes first and second electrodes 302 and 304 and first to third emission parts 310, 320 and 330 disposed between the first and second electrodes 302 and 304.

A position L0 of the second electrode 304 is within a range of 4,700 Å to 5,400 Å from the first electrode 302. Since the position L0 of the second electrode 304 is set, the emission peaks of the emission layers configuring the first to third emission parts 310, 320 and 330 is located at a specific wavelength, and light having the specific wavelength is emitted, thereby improving emission efficiency.

The first emission part 310 may include a first HTL 312, a first EML 314, and a first ETL 316 which are disposed on the first electrode 302.

An auxiliary electrode 303 may be formed on the first electrode 302. However, the auxiliary electrode 303 may not be provided depending on a characteristic or a structure of an organic light emitting device.

Although not shown, an HIL may be further formed on the auxiliary electrode 303.

An HBL may be further formed on the first EML 314. The first ETL 316 and the HBL may be provided as one layer or single layer.

An EBL may be further formed under the first EML 314. The first HTL 312 and the EBL may be provided as one layer or single layer.

The first EML 314 may be configured with a yellow-green emission layer. A peak wavelength of an emission area of the yellow-green emission layer may be within a range of 510 nm to 580 nm. Here, the peak wavelength may be an emission area.

The first EML 314 may be configured with one among a yellow-green emission layer, a yellow emission layer and a red emission layer, the red emission layer and a green emission layer, and the yellow-green emission layer and the red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the first EML 314. Also, the yellow emission layer and the red emission layer, the red emission layer and the green emission layer, or the yellow-green emission layer and the red emission layer may be identically or differently provided as the auxiliary emission layer on and under the first EML 314.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the first EML 314 is configured with two layers (for example, the yellow emission layer and the red emission layer), an emission efficiency of the red emission layer can increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the first EML 314 is configured with two layers (for example, the red emission layer and the green emission layer), a color reproduction rate can be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer of the first EML 314 may be within a range of 540 nm to 650 nm. Here, the peak wavelength may be an emission area. When the first EML 314 is configured with two layers (for example, the yellow emission layer and the red emission layer), an emission efficiency of the red emission layer can increase.

Moreover, the first EML 314 may be configured with two layers (for example, the red emission layer and the yellow-green emission layer) depending on a characteristic or a structure of a device. A peak wavelength of an emission area of the red emission layer may be within a range of 600 nm to 650 nm. A peak wavelength of an emission area of the yellow-green emission layer may be within a range of 510 nm to 580 nm. When the first EML 314 is configured with two layers (for example, the red emission layer and the yellow-green emission layer), an emission efficiency of the red emission layer can increase. In this case, a peak wavelength of an emission area of the first EML 314 may be within a range of 510 nm to 650 nm. Here, the peak wavelength may be an emission area.

When the first EML 314 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the first EML 314 may be within a range of 510 nm to 650 nm. Here, the peak wavelength may be an emission area.

All organic layers such as the first HTL 312, the EBL, and the HTL may be referred to as an organic layer. All organic layers between the first electrode 302 and the first EML 314, and the auxiliary electrode 303 may be referred to as an organic layer. Therefore, all organic layers between the first electrode 302 and the first EML 314 may be referred to as a first organic layer.

An emission position L1 of the first EML 314 may be within a range of 200 Å to 700 Å from the reflective surface of the first electrode 302 irrespective of at least one among the number or thickness of the second HTL 312, the number or thickness of the auxiliary electrode 303, the number or thickness of the EBL, the number or thickness of the HIL, or the number or thickness of the organic layers disposed between the first electrode 302 and the first EML 314. Alternatively, the emission position L1 of the first EML 314 may be within a range of 200 Å to 700 Å from the reflective surface of the first electrode 302. Therefore, the emission position L1 of the first EML 314 may be within a range of 200 Å to 700 Å from the first electrode 302 irrespective of at least one the number of the first organic layers and a thickness of the first organic layer. Alternatively, the emission position L1 of the first EML 314 may be within a range of 200 Å to 700 Å from the reflective surface of the first electrode 302 irrespective of at least one the number of the first organic layers and a thickness of the first organic layer.

The second emission part 320 may include a second HTL 322, a second EML 324, and a second ETL 326.

An HIL may be further formed under the second HTL 322.

An HBL may be further formed on the second EML 324. The second ETL 326 and the HBL may be provided as one layer or single layer.

An EBL may be further formed under the second EML 324. The second HTL 322 and the EBL may be provided as one layer or single layer.

The second EML 324 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the second EML 324 is provided along with the auxiliary emission layer, the yellow-green emission layer, the red emission layer, or the green emission layer may be disposed on or under the second EML 324. Also, the yellow-green emission layer, the red emission layer, or the green emission layer may be identically or differently provided as the auxiliary emission layer on and under the second EML 324. The positions or number of emission layers may be selectively determined depending on a structure and a characteristic of an organic light emitting device, but the present embodiment is not limited thereto.

When the auxiliary emission layer is provided in the second EML 324, a peak wavelength of an emission area of the second EML 324 may be within a range of 440 nm to 650 nm. Here, the peak wavelength may be an emission area.

A first CGL 340 may be further formed between the first emission part 310 and the second emission part 320. The first CGL 340 may include an N-type CGL and a P-type CGL.

Each of the first EML 314, the first ETL 316, the first CGL 340, the second HTL 322, the HBL, the EBL, and the HTL may be referred to as an organic layer. All organic layers between the second EML 324 and the first EML 314, and the first EML 314 may be referred to as an organic layer. Therefore, all organic layers between the second EML 324 and the first EML 314 may be referred to as a second organic layer.

The emission position L2 of the second EML 324 may be within a range of 1,200 Å to 1,800 Å from the first electrode 302 irrespective of at least one among the number or thickness of the first ETL 316, the number or thickness of the second HTL 322, the number or thickness of the first CGL 340, the number or thickness of the HBL, the number or thickness of the EBL, the number or thickness of the HIL, the number or thickness of the first EML 314, the number or thickness of organic layers disposed between the first electrode 302 and the first EML 314, or the number or thickness of organic layers disposed between the first EML 314 and the second EML 324. Alternatively, the emission position L2 of the second EML 324 may be within a range of 1,200 Å to 1,800 Å from a reflective surface of the first electrode 302. Therefore, the emission position L2 of the second EML 324 may be within a range of 1,200 Å to 1,800 Å from the first electrode 302 irrespective of at least one among the number of the first organic layers, a thickness of the first organic layer, the number of the second organic layers, a thickness of the second organic layer, the number of the first EMLs, and a thickness of the first EML. Alternatively, the emission position L2 of the second EML 324 may be within a range of 1,200 Å to 1,800 Å from the reflective surface of the first electrode 302 irrespective of at least one among the number of the first organic layers, a thickness of the first organic layer, the number of the second organic layers, a thickness of the second organic layer, the number of the first EMLs, and a thickness of the first EML.

The third emission part 330 may include a third ETL 336, a third EML 334, and a third HTL 332. Although not shown, an EIL may be further formed on the third ETL 336.

An HIL may be further formed under the third HTL 332.

A second CGL 350 may be further formed between the second emission part 320 and the third emission part 330. The second CGL 350 may include an N-type CGL An HBL may be further formed on the third EML 334. The third ETL 336 and the HBL may be provided as one layer or single layer.

An EBL may be further formed under the third EML 334. The third HTL 332 and the EBL may be provided as one layer or single layer.

The third EML 334 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the third EML 334 is provided along with the auxiliary emission layer, the yellow-green emission layer, the red emission layer, or the green emission layer may be disposed on or under the third EML 334. Also, the yellow-green emission layer, the red emission layer, or the green emission layer may be identically or differently provided as the auxiliary emission layer on and under the third EML 334. The positions or number of emission layers may be selectively determined depending on a structure and a characteristic of a device, but the present embodiment is not limited thereto.

When the auxiliary emission layer is provided in the third EML 334, a peak wavelength of an emission area of the third EML 334 may be within a range of 440 nm to 650 nm. Here, the peak wavelength may be an emission area.

Each of the second EML 324, the second ETL 326, the second CGL 350, the third HTL 332, the HBL, the EBL, and the HTL may be referred to as an organic layer. All organic layers between the third EML 334 and the second EML 324, and the second EML 324 may be referred to as an organic layer. Therefore, all organic layers between the third EML 334 and the second EML 324 may be referred to as a third organic layer.

The emission position L3 of the third EML 334 may be within a range of 2,400 Å to 3,100 Å from the first electrode 302 irrespective of at least one among the number or thickness of the second ETL 326, the number or thickness of the second CGL 350, the number or thickness of the third HTL 332, the number or thickness of the second EML 324, the number or thickness of the first EML 314, the number or thickness of organic layers between the first electrode 302 and the first EML 314, the number or thickness of organic layers between the first EML 314 and the second EML 324, or the number or thickness of organic layers between the second EML 324 and the third EML 334. Alternatively, the emission position L3 of the third EML 334 may be within a range of 2,400 Å to 3,100 Å from the reflective surface of the first electrode 302. Therefore, the emission position L3 of the third EML 334 may be within a range of 2,400 Å to 3,100 Å from the first electrode 302 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML. Alternatively, the emission position L3 of the third EML 334 may be within a range of 2,400 Å to 3,100 Å from the reflective surface of the first electrode 302 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML.

All layers such as the third ETL 336, the third EML 334, the EIL, and the HBL may be referred to as an organic layer. All organic layers between the second electrode 304 and the third EML 334, the second electrode 304, and the third EML 334 may be referred to as an organic layer. Therefore, all organic layers between the second electrode 304 and the third EML 334 may be referred to as a fourth organic layer.

A position L0 of the second electrode 304 may be within a range of 4,700 Å to 5,400 Å from the first electrode 302 irrespective of at least one among the number or thickness of the third ETL 336, the number or thickness of the EBL, the number or thickness of the HBL, the number or thickness of the second electrode 304, the number or thickness of the first EML 314, the number or thickness of the second EML 324, the number or thickness of the third EML 334, the number or thickness of organic layers disposed between the substrate 301 and the first EML 314, the number or thickness of organic layers disposed between the first EML 314 and the second EML 324, the number or thickness of organic layers disposed between the second EML 324 and the third EML 334, or the number or thickness of organic layers disposed between the second electrode 304 and the third EML 334. Alternatively, the position L0 of the second electrode 304 may be within a range of 4,700 Å to 5,400 Å from the reflective surface of the first electrode 302.

Therefore, the position L0 of the second electrode 304 may be set to be located within a range of 4,700 Å to 5,400 Å with respect to the first electrode 302 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML. Alternatively, the position L0 of the second electrode 304 may be set to be located within a range of 4,700 Å to 5,400 Å with respect to the reflective surface of the first electrode 302 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML. The structure illustrated in FIG. 24 is an example of the present invention, and may be selectively changed depending on a structure or a characteristic of a white organic light emitting device. However, the present embodiment is not limited thereto.

Figure 25:
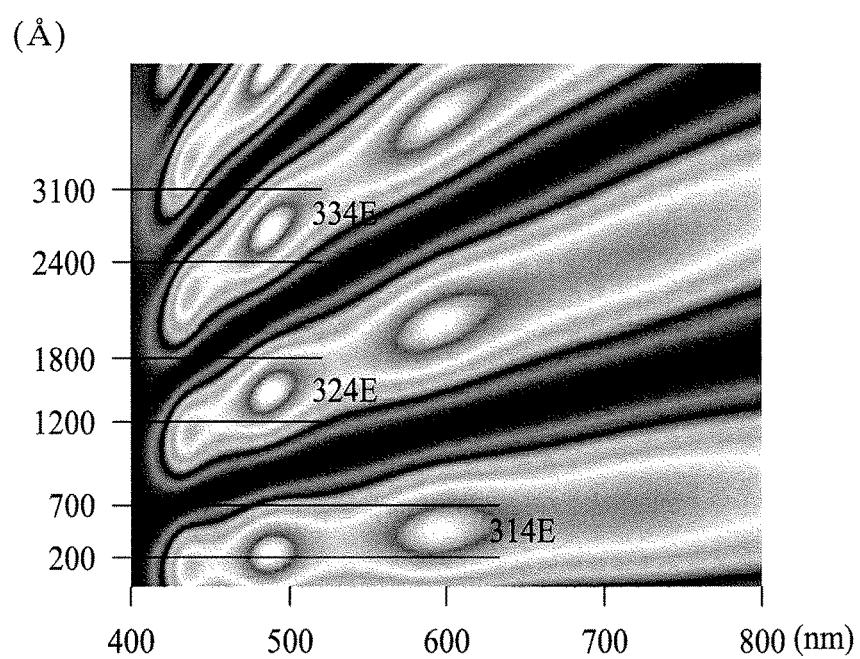
FIG. 25 is a diagram illustrating an emission position of an organic light emitting device according to the seventh embodiment of the present invention.

FIG. 25 is a diagram illustrating an emission position of an organic light emitting device according to the seventh embodiment of the present invention.

In FIG. 25, the abscissa axis indicates a wavelength range of light, and the ordinate axis indicates emission positions of emission layers configuring the emission part from the first electrode 302 and may be referred to as a contour map. Here, when the EPEL structure according to an embodiment of the present invention is applied except the first electrode 302 and the second electrode 304, FIG. 25 shows the emission positions of the emission layers at an emission peak. Also, FIG. 25 shows emission positions of emission layers having a maximum emission range in emission areas of the emission layers.

Since the first EML 314 configuring the first emission part 310 is the blue emission layer, a peak wavelength range of the emission area of the first EML 314 may be 510 nm to 580 nm. When light is emitted at 510 nm to 580 nm that is an emission area of the blue emission layer, maximum efficiency is obtained in a white color area of the contour map.

Therefore, an emission position of the first EML 314 is within a range of 200 Å to 700 Å, and thus, an emission peak 314E is located at 510 nm to 580 nm. Thus, the first EML 314 emits light at 510 nm to 580 nm, thereby obtaining maximum efficiency.

Moreover, the first EML 314 of the first emission part 310 may be configured with two layers (for example, a red emission layer and a green emission layer) depending on a characteristic or a structure of a device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the first EML 314, maximum efficiency is obtained in the white color area of the contour map.

The first EML 314 of the first emission part 310 may be configured with two layers (for example, a red emission layer and a yellow-green emission layer) depending on a characteristic or a structure of a device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the first EML 314, maximum efficiency is obtained in the white color area of the contour map.

The first EML 314 of the first emission part 310 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the first EML 314, maximum efficiency is obtained in the white color area of the contour map.

Therefore, when the first EML 314 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the first EML 314 may be 510 nm to 650 nm. In this case, when light is emitted at 510 nm to 650 nm that is the emission area of the first EML 314, maximum efficiency is obtained in the white color area of the contour map.

In FIG. 25, for example, an emission position is shown in a case where the first EML 314 is the yellow-green emission layer without adding an auxiliary emission layer into the first EML 314. Therefore, a peak wavelength range of an emission area of the first EML 314 realizes maximum efficiency at 510 nm to 580 nm.

Since the second EML 324 configuring the second emission part 320 is the blue emission layer, a peak wavelength range of the emission area of the second EML 324 may be a range of 440 nm to 480 nm. When light is emitted at 440 nm to 480 nm that is an emission area of the blue emission layer, maximum efficiency is obtained in the white color area of the contour map.

Therefore, an emission position of the second EML 324 is within a range of 1,200 Å to 1,800 Å, and thus, an emission peak 324E of the second EML 324 is located at 440 nm to 480 nm. Thus, the second EML 324 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the second EML 324 configuring the second emission part 320, a peak wavelength range of the emission area of the second EML 324 may be a range of 440 nm to 650 nm. Therefore, when light is emitted at 440 nm to 650 nm that is an emission area of the second EML 324, maximum efficiency is obtained in the white color area of the contour map.

In FIG. 25, for example, an emission position is shown in a case where the second EML 324 is the blue emission layer without adding an auxiliary emission layer into the second EML 324. Therefore, a peak wavelength range of an emission area of the second EML 324 realizes maximum efficiency at 440 nm to 480 nm.

Since the third EML 334 configuring the third emission part 330 is the blue emission layer, a peak wavelength range of the emission area of the third EML 334 may be a range of 440 nm to 480 nm. When light is emitted at 440 nm to 480 nm that is an emission area of the blue emission layer, maximum efficiency is obtained in the white color area of the contour map.

Therefore, an emission position of the third EML 334 is within a range of 2,400 Å to 3,100 Å, and thus, an emission peak 334E of the third EML 334 is located at 440 nm to 480 nm. Thus, the third EML 334 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the third EML 334 configuring the third emission part 330, a peak wavelength range of the emission area of the third EML 334 may be a range of 440 nm to 650 nm. Therefore, when light is emitted at 440 nm to 650 nm that is an emission area of the third EML 334, maximum efficiency is obtained in the white color area of the contour map.

In FIG. 25, for example, an emission position is shown in a case where the third EML 334 is the blue emission layer without adding an auxiliary emission layer into the third EML 334. Therefore, a peak wavelength range of an emission area of the third EML 334 realizes maximum efficiency at 440 nm to 480 nm.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

Therefore, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. Therefore, a maximum emission range of the first EML may be 530 nm to 570 nm, a maximum emission range of the second EML may be 440 nm to 470 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 26:
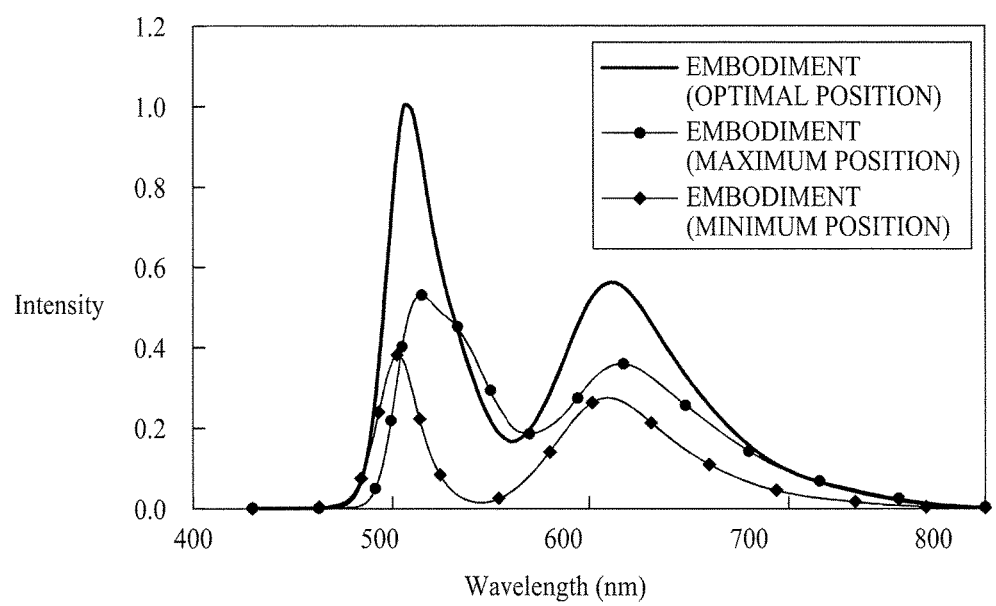
FIG. 26 is a diagram illustrating an EL spectrum according to the seventh embodiment of the present invention.

FIG. 26 is a diagram illustrating an EL spectrum according to the seventh embodiment of the present invention.

In FIG. 26, the abscissa axis indicates a wavelength range of light, and the ordinate axis indicates emission intensity. The emission intensity is a numerical value that is expressed as a relative value with respect to a maximum value of an EL spectrum.

In FIG. 26, a minimum position according to an embodiment is a portion which is set as a minimum position when emission positions of emission layers are set. For example, when the emission position L1 of the first EML 314 is within a range of 200 Å to 700 Å from the first electrode 302, the minimum position is set to 200 Å.

A maximum position according to an embodiment is a portion which is set as a maximum position when emission positions of emission layers are set. For example, when the emission position L1 of the first EML 314 is within a range of 200 Å to 700 Å from the first electrode 302, the maximum position is set to 700 Å.

An optimal position according to an embodiment is a portion which is set as an emission position according to a seventh embodiment of the present invention. For example, when the emission position L1 of the first EML 314 is within a range of 200 Å to 700 Å from the first electrode 302, an emission position according to an embodiment is within a range of 200 Å to 700 Å.

As shown in FIG. 26, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light, and is out of a peak wavelength range of the blue light. Also, it can be seen that emission intensity is reduced at 510 nm to 580 nm that is a peak wavelength range of yellow-green light. Also, it can be seen that emission intensity is considerably reduced at 600 nm to 650 nm that is a peak wavelength range of red light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light, and is out of a peak wavelength range of the blue light. Also, it can be seen that emission intensity is reduced at 510 nm to 580 nm that is the peak wavelength range of the yellow-green light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 13. When it is assumed that efficiency of a comparative example is 100%, the following Table 13 shows efficiency of a seventh embodiment of the present invention.

The following Table 13 shows a result that is obtained by comparing an efficiency of the comparative example and an efficiency of an embodiment. In the following Table 13, the comparative example relates to the bottom emission type white light emitting device including the first to third emission parts, the first emission part being configured with the blue emission layer, the second emission part being configured with the yellow-green emission layer, and the third emission part being configured with the blue emission layer. Also, an embodiment relates to a top emission type white light emitting device when an optimal position of the EPEL structure according to an embodiment of the present invention is applied.

TABLE 13

| Division | Red (R) Efficiency | Green (G) Efficiency | Blue (B) Efficiency | White (W) Efficiency | Average |
| --- | --- | --- | --- | --- | --- |
| Comparative Example | 100% | 100% | 100% | 100% | 100% |
| Embodiment (Optimal Position) | 177% | 164% | 151% | 168% | 165% |

As shown in Table 13, in comparison with the comparative example, when it is assumed that efficiency of the comparative example is 100% in a case where the EPEL structure is applied, it can be seen that red efficiency increases by about 77%, and green efficiency increases by about 64%. Also, it can be seen that blue efficiency increases by about 51%, and white efficiency increases by about 68%.

A panel efficiency of a white light emitting device having the EPEL structure and a panel efficiency of a comparative example are as listed in the following Table 14.

When it is assumed that an efficiency of an optimal position according to an embodiment is 100%, the following Table 14 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 14

| Division | Red (R) Efficiency | Green (G) Efficiency | Blue (B) Efficiency | White (W) Efficiency | Average |
| --- | --- | --- | --- | --- | --- |
| Embodiment (Minimum Position) | 43% | 46% | 23% | 44% | 39% |
| Embodiment (Optimal Position) | 100% | 100% | 100% | 100% | 100% |
| Embodiment (Maximum Position) | 84% | 72% | 76% | 73% | 76% |

As shown in Table 14, it can be seen that efficiencies of red, green, blue, and white are all reduced in a boundary between the embodiment (the minimum position) and the embodiment (the maximum position). Also, it can be seen that efficiencies of red, green, blue, and white are more reduced in the embodiment (the minimum position) than the embodiment (the maximum position).

Accordingly, when an emission position of the EPEL structure is out of an optimal position, it can be seen that panel efficiency is reduced.

As described above in the seventh embodiment of the present invention, the organic light emitting device may be a top emission type organic light emitting device.

The second emission layer and the third emission layer may respectively include emission layers that emit light having the same color.

A position of the second electrode may be within a range of 4,700 Å to 5,400 Å from the first electrode.

An emission position of the first EML may be within a range of 200 Å to 700 Å from the first electrode.

An emission position of the second EML may be within a range of 1,200 Å to 1,800 Å from the first electrode.

An emission position of the third EML may be within a range of 2,400 Å to 3,100 Å from the first electrode.

The first EML may be configured with one among a yellow-green emission layer, a yellow emission layer and a red emission layer, a red emission layer and a green emission layer, and a yellow-green emission layer and a red emission layer, or may be configured by a combination thereof.

Each of the second EML and the third EML may be configured with one among a blue emission layer, a blue emission layer and a yellow-green emission layer, a blue emission layer and a red emission layer, and a blue emission layer and a green emission layer, or may be configured by a combination thereof.

An emission area of the first EML may be a range of 510 nm to 650 nm, an emission area of the second EML may be a range of 440 nm to 650 nm, and an emission area of the third EML may be a range of 440 nm to 650 nm.

A maximum emission range of the first EML may be a range of 530 nm to 570 nm, a maximum emission range of the second EML may be a range of 440 nm to 470 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 27:
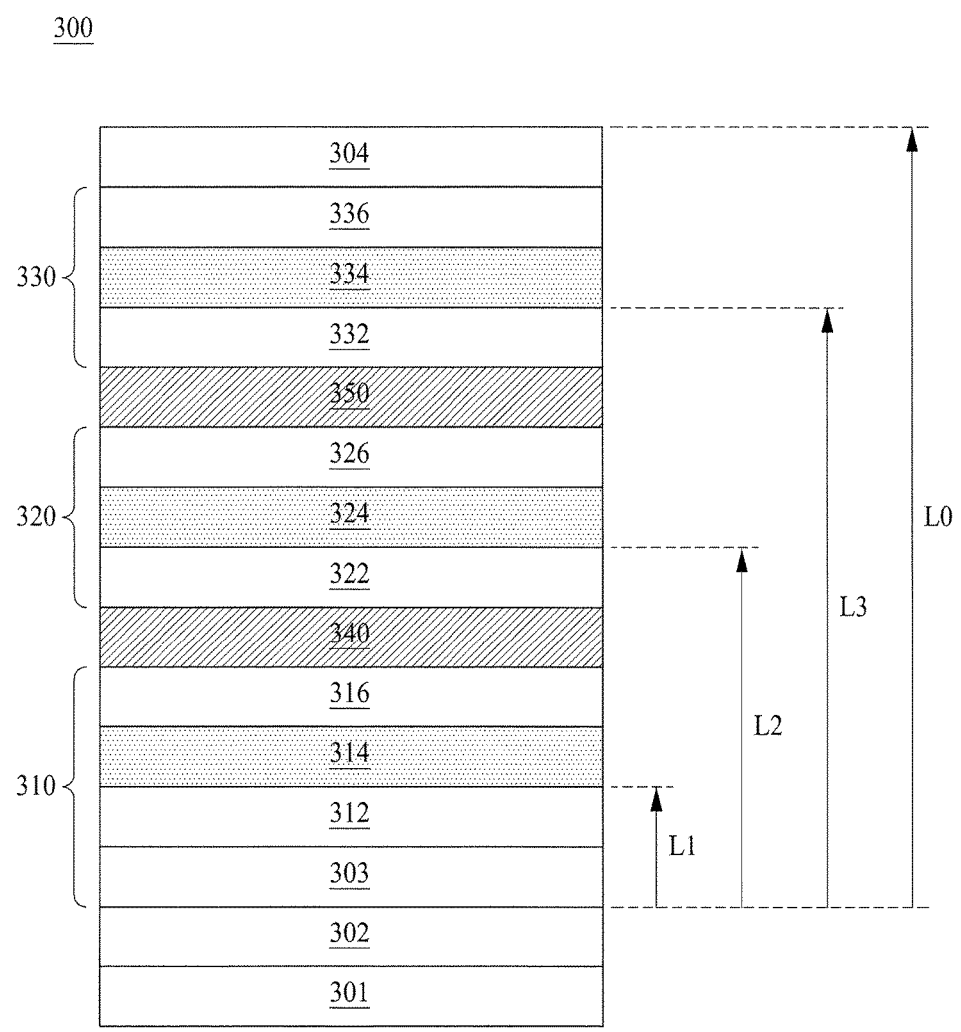
FIG. 27 is a diagram illustrating a white organic light emitting device according to the eighth embodiment of the present invention.

FIG. 27 is a diagram illustrating a white organic light emitting device 300 according to a eighth embodiment of the present invention. In describing the present embodiment, descriptions on elements which are the same as or correspond to the elements according to the preceding embodiment are not repeated.

The white organic light emitting device 300 illustrated in FIG. 27 includes first and second electrodes 302 and 304 and first to third emission parts 310, 320 and 330 between the first and second electrodes 302 and 304.

Referring to FIG. 27, a position L0 of the second electrode 304 is set to 4,700 Å to 5,400 Å from the first electrode 302. Since the position L0 of the second electrode 304 is set, the emission peaks of the emission layers configuring the first to third emission parts 310, 320 and 330 is located at a specific wavelength, and light having the specific wavelength is emitted, thereby improving emission efficiency. The first to third emission parts 310, 320 and 330 have the EPEL structure that has a maximum emission range in emission areas of the first to third emission layers. Also, at least two of the first to third emission layers emit light having the same color, and thus, provided is a white organic light emitting device where emission efficiency is enhanced. Emission layers that emit light having the same color may be referred to as an emission layer that includes one or more emission layers emitting light having the same color.

The first emission part 310 may include a first HTL 312, a first EML 314, and a first ETL 316 which are disposed on the first electrode 302.

An auxiliary electrode 303 may be formed on the first electrode 302. However, the auxiliary electrode 303 may not be provided depending on a characteristic or a structure of an organic light emitting device.

Although not shown, an HIL may be further formed on the auxiliary electrode 303.

An HBL may be further formed on the first EML 314.

An EBL may be further formed under the first EML 314.

The first EML 314 may be configured with a yellow-green emission layer. A peak wavelength of an emission area of the yellow-green emission layer may be within a range of 510 nm to 580 nm. Here, the peak wavelength may be an emission area.

The first EML 314 may be configured with one among a yellow-green emission layer, a yellow emission layer and a red emission layer, the red emission layer and a green emission layer, and the yellow-green emission layer and the red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the first EML 314. Also, the yellow emission layer and the red emission layer, the red emission layer and the green emission layer, or the yellow-green emission layer and the red emission layer may be identically or differently provided as the auxiliary emission layer on and under the first EML 314.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the first EML 314 is configured with two layers (for example, the yellow emission layer and the red emission layer), an emission efficiency of the red emission layer can increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the first EML 314 is configured with two layers (for example, the red emission layer and the green emission layer), a color reproduction rate can be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer of the first EML 314 may be within a range of 540 nm to 650 nm. Here, the peak wavelength may be an emission area. When the second EML 224 is configured with two layers (for example, the yellow emission layer and the red emission layer), an emission efficiency of the red emission layer can increase.

Moreover, the first EML 314 may be configured with two layers (for example, the red emission layer and the yellow-green emission layer) depending on a characteristic or a structure of a device. A peak wavelength of an emission area of the red emission layer may be within a range of 600 nm to 650 nm. A peak wavelength of an emission area of the yellow-green emission layer may be within a range of 510 nm to 580 nm. When the first EML 314 is configured with two layers (for example, the red emission layer and the yellow-green emission layer), an emission efficiency of the red emission layer can increase. In this case, a peak wavelength of an emission area of the first EML 314 may be within a range of 510 nm to 650 nm. Here, the peak wavelength may be an emission area.

When the first EML 314 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the second EML 224 may be within a range of 510 nm to 650 nm. Here, the peak wavelength may be an emission area.

All organic layers such as the first HTL 312, the EBL, and the HTL may be referred to as an organic layer. All organic layers between the first electrode 302 and the first EML 314, and the auxiliary electrode 303 may be referred to as an organic layer. Therefore, all organic layers between the first electrode 302 and the first EML 314 may be referred to as a first organic layer.

An emission position L1 of the first EML 314 may be within a range of 200 Å to 700 Å from the reflective surface of the first electrode 302 irrespective of at least one among the number or thickness of the second HTL 312, the number or thickness of the auxiliary electrode 303, the number or thickness of the EBL, the number or thickness of the HIL, or the number or thickness of the organic layers between the first electrode 302 and the first EML 314. Alternatively, the emission position L1 of the first EML 314 may be within a range of 200 Å to 700 Å from the reflective surface of the first electrode 302.

Therefore, the emission position L1 of the first EML 314 may be within a range of 200 Å to 700 Å from the first electrode 302 irrespective of at least one among the number of the first organic layers and a thickness of the first organic layer. Alternatively, the emission position L1 of the first EML 314 may be within a range of 200 Å to 700 Å from the reflective surface of the first electrode 302 irrespective of at least one the number of the first organic layers and a thickness of the first organic layer.

The second emission part 320 may include a second HTL 322, a second EML 324, and a second ETL 326.

An HIL may be further formed under the second HTL 322.

An HBL may be further formed on the second EML 324. The second ETL 326 and the HBL may be provided as one layer or single layer.

An EBL may be further formed under the second EML 324. The second HTL 322 and the EBL may be provided as one layer or single layer.

The second EML 324 may include a blue emission layer or a blue emission layer that includes an auxiliary emission layer emitting a different color. The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the second EML 324 is provided along with the auxiliary emission layer, the yellow-green emission layer, the red emission layer, or the green emission layer may be disposed on or under the second EML 324. Also, the yellow-green emission layer, the red emission layer, or the green emission layer may be identically or differently provided as the auxiliary emission layer on and under the second EML 324. The positions or number of emission layers may be selectively determined depending on a structure and a characteristic of an organic light emitting device, but the present embodiment is not limited thereto.

When the auxiliary emission layer is provided in the second EML 324, a peak wavelength of an emission area of the second EML 324 may be within a range of 440 nm to 650 nm. Here, the peak wavelength may be an emission area.

A first CGL 340 may be further formed between the first emission part 310 and the second emission part 320. The first CGL 340 may include an N-type CGL and a P-type CGL.

Each of the first EML 314, the first ETL 316, the first CGL 340, the second HTL 322, the HBL, the EBL, and the HTL may be referred to as an organic layer. All organic layers between the second EML 324 and the first EML 314, and the first EML 314 may be referred to as an organic layer. Therefore, all organic layers between the second EML 324 and the first EML 314 may be referred to as a second organic layer.

The emission position L2 of the second EML 324 may be within a range of 1,250 Å to 1,750 Å from the first electrode 302 irrespective of at least one among the number or thickness of the first ETL 316, the number or thickness of the second HTL 322, the number or thickness of the first CGL 340, the number or thickness of the HBL, the number or thickness of the EBL, the number or thickness of the HIL, the number or thickness of the first EML 314, the number or thickness of organic layers between the first electrode 302 and the first EML 314, or the number or thickness of organic layers between the first EML 314 and the second EML 324. Alternatively, the emission position L2 of the second EML 324 may be within a range of 1,250 Å to 1,750 Å from a reflective surface of the first electrode 302.

Therefore, the emission position L2 of the second EML 324 may be within a range of 1,250 Å to 1,750 Å from the first electrode 302 irrespective of at least one among the number of the first organic layers, a thickness of the first organic layer, the number of the second organic layers, a thickness of the second organic layer, the number of the first EMLs, and a thickness of the first EML. Alternatively, the emission position L2 of the second EML 324 may be within a range of 1,250 Å to 1,750 Å from the reflective surface of the first electrode 302 irrespective of at least one among the number of the first organic layers, a thickness of the first organic layer, the number of the second organic layers, a thickness of the second organic layer, the number of the first EMLs, and a thickness of the first EML.

The third emission part 330 may include a third ETL 336, a third EML 334, and a third HTL 332. Although not shown, an EIL may be further formed on the third ETL 336. An HIL may be further formed under the third HTL 332. A second CGL 350 may be further formed between the second emission part 320 and the third emission part 330. The second CGL 350 may include an N-type CGL and a P-type CGL.

An HBL may be further formed on the third EML 334. The third ETL 336 and the HBL may be provided as one layer or single layer.

An EBL may be further formed under the third EML 334. The third HTL 332 and the EBL may be provided as one layer or single layer.

The third EML 334 may include a blue emission layer or a blue emission layer that includes an auxiliary emission layer emitting a different color. The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved.

When the third EML 334 is provided along with the auxiliary emission layer, the yellow-green emission layer, the red emission layer, or the green emission layer may be disposed on or under the third EML 334. Also, the yellow-green emission layer, the red emission layer, or the green emission layer may be identically or differently provided as the auxiliary emission layer on and under the third EML 334. The positions or number of emission layers may be selectively determined depending on a structure and a characteristic of an organic light emitting device, but the present embodiment is not limited thereto.

When the auxiliary emission layer is provided in the third EML 334, a peak wavelength of an emission area of the third EML 334 may be within a range of 440 nm to 650 nm. Here, the peak wavelength may be an emission area.

Each of the second EML 324, the second ETL 326, the second CGL 350, the third HTL 332, the HBL, the EBL, and the HTL may be referred to as an organic layer. All organic layers between the third EML 334 and the second EML 324, and the second EML 324 may be referred to as an organic layer. Therefore, all organic layers between the third EML 334 and the second EML 324 may be referred to as a third organic layer.

The emission position L3 of the third EML 334 may be within a range of 2,500 Å to 3,000 Å from the first electrode 302 irrespective of at least one among the number or thickness of the second ETL 326, the number or thickness of the second CGL 350, the number or thickness of the third HTL 332, the number or thickness of the second EML 324, the number or thickness of the first EML 314, the number or thickness of organic layers disposed between the first electrode 302 and the first EML 314, the number or thickness of organic layers disposed between the first EML 314 and the second EML 324, or the number or thickness of organic layers disposed between the second EML 324 and the third EML 334. Alternatively, the emission position L3 of the third EML 334 may be within a range of 2,500 Å to 3,000 Å from the reflective surface of the first electrode 302.

Therefore, the emission position L3 of the third EML 334 may be within a range of 2,500 Å to 3,000 Å from the first electrode 302 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML. Alternatively, the emission position L3 of the third EML 334 may be within a range of 2,500 Å to 3,000 Å from the reflective surface of the first electrode 302 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML.

All layers such as the third ETL 336, the third EML 334, the EIL, and the HBL may be referred to as an organic layer. All organic layers between the second electrode 304 and the third EML 334, the second electrode 304, and the third EML 334 may be referred to as an organic layer. Therefore, all organic layers between the second electrode 304 and the third EML 334 may be referred to as a fourth organic layer.

A position L0 of the second electrode 304 may be within a range of 4,700 Å to 5,400 Å from the first electrode 302 irrespective of at least one among the number or thickness of the third ETL 336, the number or thickness of the EBL, the number or thickness of the HBL, the number or thickness of the second electrode 304, the number or thickness of the first EML 314, the number or thickness of the second EML 324, the number or thickness of the third EML 334, the number or thickness of organic layers disposed between the substrate 301 and the first EML 314, the number or thickness of organic layers disposed between the first EML 314 and the second EML 324, the number or thickness of organic layers disposed between the second EML 324 and the third EML 334, or the number or thickness of organic layers disposed between the second electrode 304 and the third EML 334. Alternatively, the position L0 of the second electrode 304 may be within a range of 4,700 Å to 5,400 Å from the reflective surface of the first electrode 302.

Therefore, the position L0 of the second electrode 304 may be within a range of 4,700 Å to 5,400 Å from the first electrode 302 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML. Alternatively, the position L0 of the second electrode 304 may be within a range of 4,700 Å to 5,400 Å from the reflective surface of the first electrode 302 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML.

The structure illustrated in FIG. 27 is an example of the present invention, and may be selectively changed depending on a structure or a characteristic of a white organic light emitting device. However, the present embodiment is not limited thereto.

Figure 28:
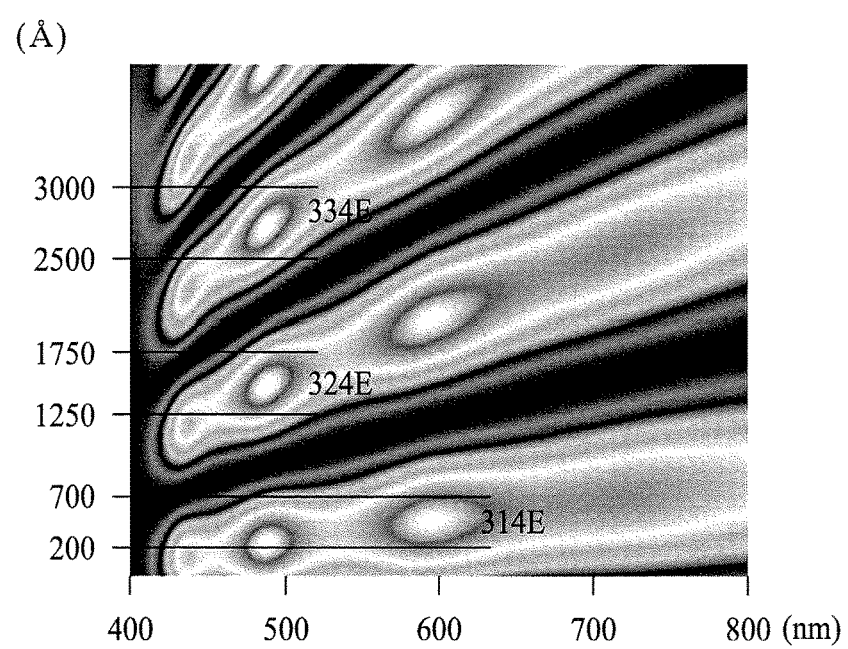
FIG. 28 is a diagram illustrating an emission position of an organic light emitting device according to the eighth embodiment of the present invention.

FIG. 28 is a diagram illustrating an emission position of an organic light emitting device according to the eighth embodiment of the present invention.

In FIG. 28, the abscissa axis indicates a wavelength range of light, and the ordinate axis indicates emission positions of emission layers configuring the emission part from the first electrode 302 and may be referred to as a contour map. Here, when the EPEL structure according to an embodiment of the present invention is applied except the first electrode 302 and the second electrode 304, FIG. 25 shows the emission positions of the emission layers at an emission peak. Also, FIG. 25 shows emission positions of emission layers having a maximum emission range in emission areas of the emission layers.

Since the first EML 314 configuring the first emission part 310 is the blue emission layer, a peak wavelength range of the emission area of the first EML 314 may be 510 nm to 580 nm. When light is emitted at 510 nm to 580 nm that is an emission area of the blue emission layer, maximum efficiency is obtained in a white color area of the contour map.

Therefore, an emission position of the first EML 314 is within a range of 200 Å to 800 Å, and thus, an emission peak 314E is located at 510 nm to 580 nm. Thus, the first EML 314 emits light at 510 nm to 580 nm, thereby obtaining maximum efficiency.

Moreover, the first EML 314 of the first emission part 310 may be configured with two layers (for example, a red emission layer and a green emission layer) depending on a characteristic or a structure of a device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the first EML 314, maximum efficiency is obtained in the white color area of the contour map.

Moreover, the first EML 314 of the first emission part 310 may be configured with two layers (for example, a red emission layer and a yellow-green emission layer) depending on a characteristic or a structure of a device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the first EML 314, maximum efficiency is obtained in the white color area of the contour map.

Moreover, the first EML 314 of the first emission part 310 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the first EML 314, maximum efficiency is obtained in the white color area of the contour map.

Moreover, the first EML 314 of the first emission part 310 may be configured with two layers (for example, a red emission layer and a green emission layer) depending on a characteristic or a structure of a device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the first EML 314, maximum efficiency is obtained in the white color area of the contour map.

Therefore, when the first EML 314 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the first EML 314 may be 510 nm to 650 nm. In this case, when light is emitted at 510 nm to 650 nm that is the emission area of the first EML 314, maximum efficiency is obtained in the white color area of the contour map.

In FIG. 28, for example, an emission position is shown in a case where the first EML 314 is the yellow-green emission layer without adding an auxiliary emission layer into the first EML 314. Therefore, a peak wavelength range of an emission area of the first EML 314 realizes maximum efficiency at 510 nm to 580 nm.

Since the second EML 324 configuring the second emission part 320 is the blue emission layer, a peak wavelength range of the emission area of the second EML 324 may be a range of 440 nm to 480 nm. When light is emitted at 440 nm to 480 nm that is an emission area of the blue emission layer, maximum efficiency is obtained in the white color area of the contour map.

Therefore, an emission position of the second EML 324 is within a range of 1,250 Å to 1,750 Å, and thus, an emission peak 324E of the second EML 324 is located at 440 nm to 480 nm. Thus, the second EML 324 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the second EML 324 configuring the second emission part 320, a peak wavelength range of the emission area of the second EML 324 may be a range of 440 nm to 650 nm. Therefore, when light is emitted at 440 nm to 650 nm that is an emission area of the second EML 324, maximum efficiency is obtained in the white color area of the contour map.

In FIG. 28, for example, an emission position is shown in a case where the second EML 324 is the blue emission layer without adding an auxiliary emission layer into the second EML 324. Therefore, a peak wavelength range of an emission area of the second EML 324 realizes maximum efficiency at 440 nm to 480 nm.

Since the third EML 334 configuring the third emission part 330 is the blue emission layer, a peak wavelength range of the emission area of the third EML 334 may be a range of 440 nm to 480 nm. When light is emitted at 440 nm to 480 nm that is an emission area of the blue emission layer, maximum efficiency is obtained in the white color area of the contour map.

Therefore, an emission position of the third EML 334 is within a range of 2,500 Å to 3,000 Å, and thus, an emission peak 334E of the third EML 334 is located at 440 nm to 480 nm. Thus, the third EML 334 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the third EML 334 configuring the third emission part 330, a peak wavelength range of the emission area of the third EML 334 may be a range of 440 nm to 650 nm. Therefore, when light is emitted at 440 nm to 650 nm that is an emission area of the third EML 334, maximum efficiency is obtained in the white color area of the contour map.

In FIG. 28, for example, an emission position is shown in a case where the third EML 334 is the blue emission layer without adding an auxiliary emission layer into the third EML 334. Therefore, a peak wavelength range of an emission area of the third EML 334 realizes maximum efficiency at 440 nm to 480 nm.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

Therefore, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. Therefore, a maximum emission range of the first EML may be 530 nm to 570 nm, a maximum emission range of the second EML may be 440 nm to 470 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 29:
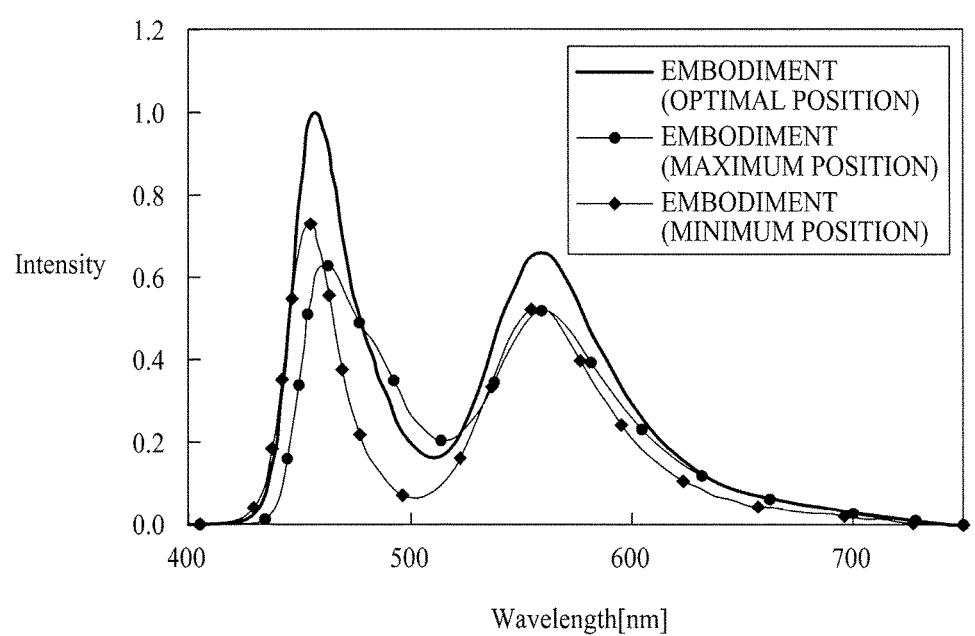
FIG. 29 is a diagram illustrating an EL spectrum according to the eighth embodiment of the present invention.

FIG. 29 is a diagram illustrating an EL spectrum according to the eighth embodiment of the present invention.

In FIG. 29, a minimum position according to an embodiment is a portion which is set as a minimum position when emission positions of emission layers are set. For example, when the emission position L1 of the first EML 314 is within a range of 200 Å to 700 Å from the first electrode 302, the minimum position is set to 200 Å.

A maximum position according to an embodiment is a portion which is set as a maximum position when emission positions of emission layers are set. For example, when the emission position L1 of the first EML 314 is within a range of 200 Å to 700 Å from the first electrode 302, the maximum position is set to 700 Å.

An optimal position according to an embodiment is a portion which is set as an emission position according to an eighth embodiment of the present invention. For example, when the emission position L1 of the first EML 314 is within a range of 200 Å to 700 Å from the first electrode 302, an emission position according to an embodiment is within a range of 200 Å to 700 Å.

As shown in FIG. 29, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light, and is out of a peak wavelength range of the blue light. Also, it can be seen that emission intensity is reduced at 510 nm to 580 nm that is a peak wavelength range of yellow-green light. Also, it can be seen that emission intensity is considerably reduced at 600 nm to 650 nm that is a peak wavelength range of red light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light, and is out of a peak wavelength range of the blue light. Also, it can be seen that emission intensity is reduced at 510 nm to 580 nm that is the peak wavelength range of the yellow-green light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 15. When it is assumed that efficiency of a comparative example is 100%, the following Table 15 shows efficiency of the eighth embodiment of the present invention.

The following Table 15 shows a result that is obtained by comparing an efficiency of the comparative example and an efficiency of an embodiment. In the following Table 15, the comparative example relates to the bottom emission type white light emitting device including the first to third emission parts, the first emission part being configured with the blue emission layer, the second emission part being configured with the yellow-green emission layer, and the third emission part being configured with the blue emission layer. Also, an embodiment relates to a top emission type white light emitting device when an optimal position of the EPEL structure according to an embodiment of the present invention is applied.

TABLE 15

| Division | Red (R) Efficiency | Green (G) Efficiency | Blue (B) Efficiency | White (W) Efficiency | Average |
|---|---|---|---|---|---|
| Comparative Example | 100% | 100% | 100% | 100% | 100% |
| Embodiment (Optimal Position) | 177% | 164% | 151% | 168% | 165% |

As shown in Table 15, in comparison with the comparative example, when it is assumed that efficiency of the comparative example is 100% in a case where the EPEL structure is applied, it can be seen that red efficiency increases by about 77%, and green efficiency increases by about 64%. Also, it can be seen that blue efficiency increases by about 51%, and white efficiency increases by about 68%.

A panel efficiency of a white light emitting device having the EPEL structure and a panel efficiency of a comparative example are as listed in the following Table 16.

When it is assumed that an efficiency of an optimal position according to an embodiment is 100%, the following Table 16 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 16

| Division | Red (R) Efficiency | Green (G) Efficiency | Blue (B) Efficiency | White (W) Efficiency | Average |
|---|---|---|---|---|---|
| Embodiment (Minimum Position) | 69% | 77% | 58% | 74% | 74% |
| Embodiment (Optimal Position) | 100% | 100% | 100% | 100% | 100% |
| Embodiment (Maximum Position) | 90% | 85% | 88% | 84% | 84% |

As shown in Table 16, it can be seen that efficiencies of red, green, blue, and white are all reduced in a boundary between the embodiment (the minimum position) and the embodiment (the maximum position). To provide a description on comparison of Table 14 according to the seventh embodiment of the present invention and Table 16 according to the eighth embodiment of the present invention, it can be seen that efficiencies of red, green, blue, and white are more enhanced in a boundary of the embodiment (the minimum position) and the embodiment (the maximum position). Therefore, according to the eighth embodiment of the present invention, an organic light emitting display apparatus with more enhanced efficiency is provided. Also, it can be seen that efficiencies of red, green, blue, and white are more reduced in the embodiment (the minimum position) than the embodiment (the maximum position).

Accordingly, when an emission position of the EPEL structure is out of an optimal position, it can be seen that panel efficiency is reduced.

As described above in the eighth embodiment of the present invention, the organic light emitting device may be a top emission type organic light emitting device.

The second emission layer and the third emission layer may respectively include emission layers that emit light having the same color.

A position of the second electrode may be within a range of 4,700 Å to 5,400 Å from the first electrode.

An emission position of the first EML may be within a range of 200 Å to 700 Å from the first electrode.

An emission position of the second EML may be within a range of 1,250 Å to 1,750 Å from the first electrode.

An emission position of the third EML may be within a range of 2,500 Å to 3,000 Å from the first electrode.

The first EML may be configured with one among a yellow-green emission layer, a yellow emission layer and a red emission layer, a red emission layer and a green emission layer, and a yellow-green emission layer and a red emission layer, or may be configured by a combination thereof.

Each of the second EML and the third EML may be configured with one among a blue emission layer, a blue emission layer and a yellow-green emission layer, a blue emission layer and a red emission layer, and a blue emission layer and a green emission layer, or may be configured by a combination thereof.

An emission area of the first EML may be a range of 510 nm to 650 nm, an emission area of the second EML may be a range of 440 nm to 650 nm, and an emission area of the third EML may be a range of 440 nm to 650 nm.

A maximum emission range of the first EML may be a range of 530 nm to 570 nm, a maximum emission range of the second EML may be a range of 440 nm to 470 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 30:
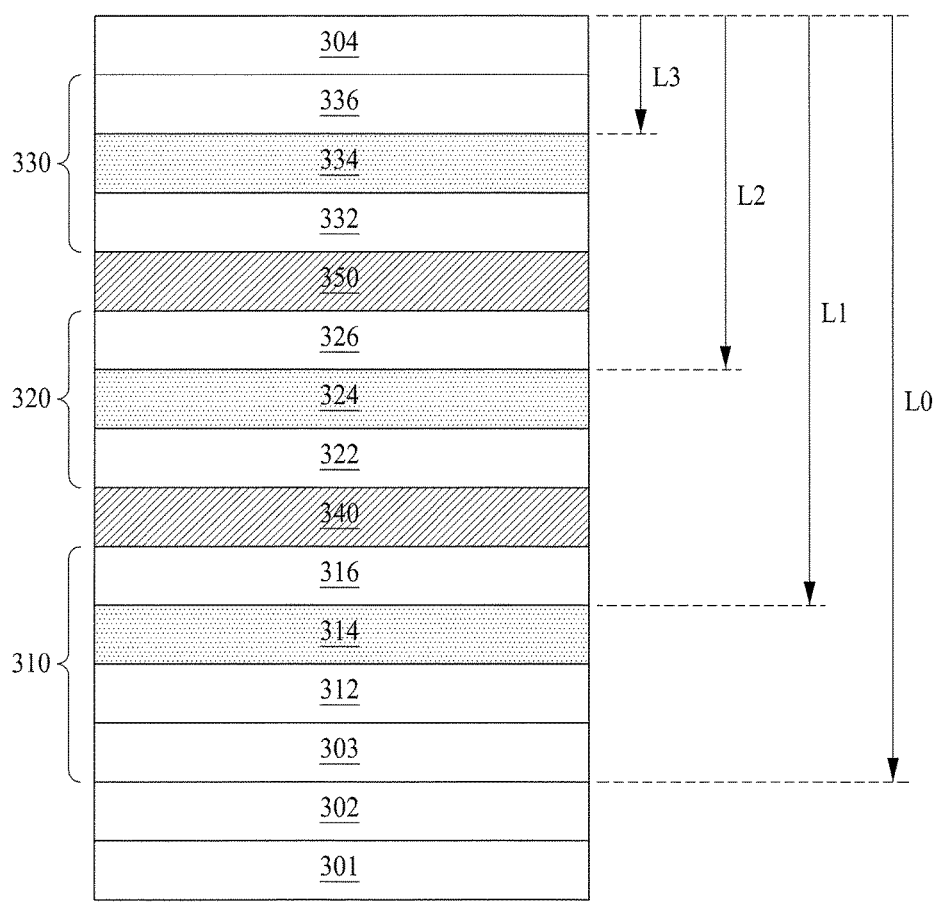
FIG. 30 is a diagram illustrating a white organic light emitting device according to a ninth embodiment of the present invention.

FIG. 30 is a diagram illustrating a white organic light emitting device 300 according to a ninth embodiment of the present invention. In describing the present embodiment, descriptions on elements which are the same as or correspond to the elements according to the preceding embodiment are not repeated. In the present embodiment, emission positions of emission layers are set from a second electrode, and may be set from the second electrode depending on a device design.

The white organic light emitting device 300 illustrated in FIG. 30 includes first and second electrodes 302 and 304 and first to third emission parts 310, 320 and 330 disposed between the first and second electrodes 302 and 304. A position L0 of the second electrode 304 is within a range of 4,700 Å to 5,400 Å from the first electrode 302. Since the position L0 of the second electrode 304 is set, the emission peaks of the emission layers configuring the first to third emission parts 310, 320 and 330 is located at a specific wavelength, and light having the specific wavelength is emitted, thereby improving emission efficiency. The first to third emission parts 310, 320 and 330 have the EPEL structure that has a maximum emission range in emission areas of the first to third emission layers. Also, at least two of the first to third emission layers emit light having the same color, and thus, provided is a white organic light emitting device where emission efficiency is enhanced. Emission layers that emit light having the same color may be referred to as an emission layer that includes one or more emission layers emitting light having the same color.

The third emission part 330 may include a third ETL 336, a third EML 334, and a third HTL 332. Although not shown, an EIL may be further formed on the third ETL 336. An HIL may be further formed under the third HTL 332. An HBL may be further formed on the third EML 334. The third ETL 336 and the HBL may be provided as one layer or single layer.

An EBL may be further formed under the third EML 334. The third HTL 332 and the EBL may be provided as one layer or single layer.

The third EML 334 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the third EML 334 is provided along with the auxiliary emission layer, the yellow-green emission layer, the red emission layer, or the green emission layer may be disposed on or under the third EML 334. Also, the yellow-green emission layer, the red emission layer, or the green emission layer may be identically or differently provided as the auxiliary emission layer on and under the third EML 334. The positions or number of emission layers may be selectively determined depending on a structure and a characteristic of an organic light emitting device, but the present embodiment is not limited thereto.

When the auxiliary emission layer is provided in the third EML 334, a peak wavelength of an emission area of the third EML 334 may be within a range of 440 nm to 650 nm. Here, the peak wavelength may be an emission area.

All layers such as the third ETL 336, the third EML 334, the EIL, and the HBL may be referred to as an organic layer. All organic layers d between the second electrode 304 and the third EML 334, the second electrode 304, and the third EML 334 may be referred to as an organic layer. Therefore, all organic layers between the second electrode 304 and the third EML 334 may be referred to as a fourth organic layer.

An emission position L3 of the third EML 334 may be within a range of 2,050 Å to 2,750 Å from the second electrode 304 irrespective of at least one among the number or thickness of the third ETL 336, the number or thickness of the third EML 334, the number or thickness of the EIL, the number or thickness of the HBL, the number or thickness of the second electrode 304, or the number or thickness of the organic layers between the second electrode 304 and the third EML 334. Therefore, the emission position L3 of the third EML 334 may be within a range of 2,050 Å to 2,750 Å from the second electrode 304 irrespective of at least one among the number of fourth organic layers, a thickness of the fourth organic layer, the number of third EMLs, and a thickness of the third EML.

The second emission part 320 may include a second HTL 322, a second EML 324, and a second ETL 326.

An HIL may be further formed under the second HTL 322. An HBL may be further formed on the second EML 324. The second ETL 326 and the HBL may be provided as one layer or single layer.

An EBL may be further formed under the second EML 324. The second HTL 322 and the EBL may be provided as one layer or single layer.

The second EML 324 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the second EML 324 is provided along with the auxiliary emission layer, the yellow-green emission layer, the red emission layer, or the green emission layer may be disposed on or under the second EML 324. Also, the yellow-green emission layer, the red emission layer, or the green emission layer may be identically or differently provided as the auxiliary emission layer on and under the second EML 324. The positions or number of emission layers may be selectively determined depending on a structure and a characteristic of an organic light emitting device, but the present embodiment is not limited thereto.

When the auxiliary emission layer is provided in the second EML 324, a peak wavelength of an emission area of the second EML 324 may be within a range of 440 nm to 650 nm. Here, the peak wavelength may be an emission area.

A second CGL 350 may be further formed between the second emission part 320 and the third emission part 330. The second CGL 350 may include an N-type CGL and a P-type CGL.

Each of the second EML 324, the second ETL 326, the second CGL 350, the third HTL 332, the HBL, the EBL, and the HTL may be referred to as an organic layer. All organic layers between the third EML 334 and the second EML 324, and the second EML 324 may be referred to as an organic layer. Therefore, all organic layers between the third EML 334 and the second EML 324 may be referred to as a third organic layer.

An emission position L2 of the second EML 324 may be within a range of 3,350 Å to 3,950 Å from the second electrode 304 irrespective of at least one among the number or thickness of the third HTL 332, the number or thickness of the second ETL 326, the number or thickness of the second CGL 350, the number or thickness of the HBL, the number or thickness of the EBL, the number or thickness of the HIL, the number or thickness of the third EML 334, the number or thickness of the second EML 324, the number or thickness of the organic layers disposed between the second electrode 304 and the third EML 334, or the number or thickness of the organic layers disposed between the third EML 334 and the second EML 324. Therefore, the emission position L2 of the second EML 324 may be within a range of 3,350 Å to 3,950 Å from the second electrode 304 irrespective of at least one among the number of the fourth organic layers, a thickness of the fourth organic layer, the number of the third organic layers, a thickness of the third organic layer, the number of the third EMLs, a thickness of the third EML, the number of the second EMLs, and a thickness of the second EML.

The first emission part 310 may include a first HTL 312, a first EML 314, and a first ETL 316 which are disposed on the first electrode 302.

An auxiliary electrode 303 may be formed on the first electrode 302. However, the auxiliary electrode 303 may not be provided depending on a characteristic or a structure of an organic light emitting device.

Although not shown, an HIL may be further formed on the first electrode 302.

An HBL may be further formed on the first EML 314. The first ETL 316 and the HBL may be provided as one layer or single layer.

An EBL may be further formed under the first EML 314. The first HTL 312 and the EBL may be provided as one layer or single layer.

The first EML 314 may be configured with a yellow-green emission layer. A peak wavelength of an emission area of the yellow-green emission layer may be within a range of 510 nm to 580 nm. Here, the peak wavelength may be an emission area.

Moreover, the first EML 314 of the first emission part 310 may be configured with two layers (for example, a red emission layer and a green emission layer) depending on a characteristic or a structure of a device. A peak wavelength range of an emission area of the red emission layer may be a range of 600 nm to 650 nm. A peak wavelength range of an emission area of the green emission layer may be a range of 510 nm to 560 nm. When the first EML 314 is configured with two layers (for example, the red emission layer and the green emission layer), a color reproduction rate can be enhanced. When the first EML 314 is configured with two layers (for example, the red emission layer and the green emission layer), a peak wavelength of an emission area may be 510 nm to 650 nm. Here, the peak wavelength may be an emission area.

The first EML 314 of the first emission part 310 may be configured with two layers (for example, a red emission layer and a yellow-green emission layer) depending on a characteristic or a structure of a device. A peak wavelength range of an emission area of the red emission layer may be a range of 600 nm to 650 nm. A peak wavelength range of an emission area of the yellow-green emission layer may be a range of 510 nm to 580 nm. When the first EML 314 is configured with two layers (for example, the red emission layer and the yellow-green emission layer), an emission efficiency of the red emission layer can be enhanced. Also, a peak wavelength of an emission layer where an auxiliary emission layer is added into the yellow-green emission layer and which includes red may be 510 nm to 650 nm. Here, the peak wavelength may be an emission area.

The first emission part 310 may be configured with two layers (for example, a yellow emission layer and a red emission layer) depending on a characteristic or a structure of an organic light emitting device. A peak wavelength of an emission layer of the yellow emission layer and the red emission layer may be 540 nm to 650 nm. Here, the peak wavelength may be an emission area. When the first emission part 310 is configured with two layers (for example, the yellow emission layer and the red emission layer), an emission efficiency of the red emission layer can be enhanced.

A first CGL 340 may be further formed between the first emission part 310 and the second emission part 320. The first CGL 340 may include an N-type CGL and a P-type CGL.

Each of the first EML 314, the first ETL 316, the first CGL 340, the second HTL 322, the HBL, the EBL, and the HTL may be referred to as an organic layer. All organic layers between the second EML 324 and the first EML 314, and the first EML 314 may be referred to as an organic layer. Therefore, all organic layers between the second EML 324 and the first EML 314 may be referred to as a second organic layer.

The emission position L1 of the first EML 314 may be within a range of 4,450 Å to 4,950 Å from the second electrode 304 irrespective of at least one among the number or thickness of the first ETL 316, the number or thickness of the second HTL 322, the number or thickness of the first CGL 340, the number or thickness of the HBL, the number or thickness of the EBL, the number or thickness of the HIL, the number or thickness of the third EML 334, the number or thickness of the second EML 324, the number or thickness of the first EML 314, the number or thickness of organic layers d between the second electrode 304 and the third EML 334, the number or thickness of organic layers between the second EML 324 and the third EML 334, or the number or thickness of organic layers between the first EML 314 and the second EML 324.

Therefore, the emission position L1 of the first EML 314 may be within a range of 4,450 Å to 4,950 Å from the second electrode 304 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, and a thickness of the first EML.

All organic layers such as the first HTL 312, the EBL, and the HTL may be referred to as an organic layer. All organic layers between the first electrode 302 and the first EML 314, and the auxiliary electrode 303 may be referred to as an organic layer. Therefore, all organic layers between the first electrode 302 and the first EML 314 may be referred to as a first organic layer.

The position L0 of the first electrode 302 may be within a range of 4,700 Å to 5,400 Å from the second electrode 304 irrespective of at least one among the number or thickness of the first HTL 312, the number or thickness of the auxiliary electrode 303, the number or thickness of the EBL, the number or thickness of the HIL, the number or thickness of the third EML 334, the number or thickness of the second EML 324, the number or thickness of the first EML 314, the number or thickness of the organic layers disposed between the second electrode 304 and the third EML 334, the number or thickness of the organic layers disposed between the third EML 334 and the second EML 324, the number or thickness of the organic layers disposed between the second EML 324 and the first EML 314, or the number or thickness of the organic layers disposed between the first EML 314 and the first electrode 302.

Therefore, the position L0 of the first electrode 302 may be within a range of 4,700 Å to 5,400 Å from the second electrode 304 irrespective of at least one among the number of the fourth organic layers, a thickness of the fourth organic layer, the number of the third organic layers, a thickness of the third organic layer, the number of the second organic layers, a thickness of the second organic layer, the number of the first organic layers, a thickness of the first organic layer, the number of the third EMLs, a thickness of the third EML, the number of the second EMLs, a thickness of the second EML, the number of the first EMLs, and a thickness of the first EML.

Here, the emission position L1 of the first EML 314 may be within a range of 4,450 Å to 4,950 Å from the second electrode 304. Also, the position L0 of the first electrode 302 is within a range of 4,700 Å to 5,400 Å from the second electrode 304. Also, when the emission position L1 of the first EML 314 is set to 4,950 Å from the second electrode 304, the position L0 of the first electrode 302 is within a range of 5,050 Å to 5,400 Å from the second electrode 304.

Therefore, the present invention may set the position of the first electrode 302 and positions of emission layers from the second electrode 304 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML.

The structure illustrated in FIG. 30 is an example of the present invention, and may be selectively changed depending on a structure or a characteristic of an organic light emitting device. However, the present embodiment is not limited thereto.

Figure 31:
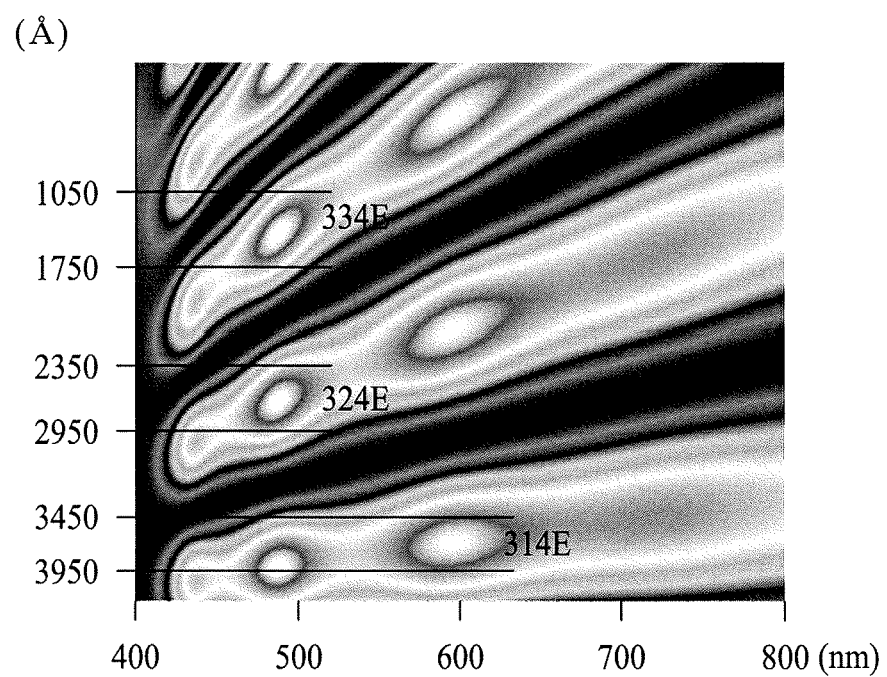
FIG. 31 is a diagram illustrating an emission position of an organic light emitting device according to the ninth embodiment of the present invention.

FIG. 31 is a diagram illustrating an emission position of an organic light emitting device according to the ninth embodiment of the present invention.

In FIG. 31, the abscissa axis indicates a wavelength range of light, and the ordinate axis indicates emission positions of emission layers configuring the emission part from the second electrode 304 and may be referred to as a contour map. Here, when the EPEL structure according to an embodiment of the present invention is applied except the first electrode 302 and the second electrode 304, FIG. 31 shows the emission positions of the emission layers at an emission peak. Also, FIG. 31 shows emission positions of emission layers having a maximum emission range in emission areas of the emission layers. FIG. 31 shows emission positions of the emission layers except 1,000 Å that is a thickness of the second electrode 304. And the thickness of the second electrode 304 does not limit details of the present invention.

Since the third EML 334 configuring the third emission part 330 is the blue emission layer, a peak wavelength range of the emission area of the third EML 334 may be a range of 440 nm to 480 nm. When light is emitted at 440 nm to 480 nm that is an emission area of the blue emission layer, maximum efficiency is obtained in a white color area of a contour map. As described above, in FIG. 31, the emission position of the third EML 334 is illustrated as 1,050 Å to 1,750 Å, which is a value that is obtained by subtracting 1,000 Å that is a thickness of the second electrode 304. Accordingly, the emission position of the third EML 334 may be a range of 2,050 Å to 2,750 Å. This may be identically applied to an emission position of the second EML 324 and an emission position of the first EML 314.

Therefore, an emission position of the third EML 334 is within a range of 2,050 Å to 2,750 Å, and thus, an emission peak 334E of the third EML 334 is located at 440 nm to 480 nm. Thus, the third EML 334 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the third EML 334 configuring the third emission part 330, a peak wavelength range of the emission area of the third EML 334 may be a range of 440 nm to 650 nm. Therefore, when light is emitted at 440 nm to 650 nm that is an emission area of the third EML 334, maximum efficiency is obtained in the white color area of the contour map.

In FIG. 31, for example, an emission position is shown in a case where the third EML 334 is the blue emission layer without adding an auxiliary emission layer into the third EML 334. Therefore, a peak wavelength range of an emission area of the third EML 334 realizes maximum efficiency at 440 nm to 480 nm.

Since the second EML 324 configuring the second emission part 320 is the blue emission layer, a peak wavelength range of the emission area of the second EML 324 may be a range of 440 nm to 480 nm. When light is emitted at 440 nm to 480 nm that is an emission area of the blue emission layer, maximum efficiency is obtained in the white color area of the contour map.

Therefore, an emission position of the second EML 324 is within a range of 3,350 Å to 3,950 Å, and thus, an emission peak 324E of the second EML 324 is located at 440 nm to 480 nm. Thus, the second EML 324 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the second EML 324 configuring the second emission part 320, a peak wavelength range of the emission area of the second EML 324 may be a range of 440 nm to 650 nm. Therefore, when light is emitted at 440 nm to 650 nm that is an emission area of the second EML 324, maximum efficiency is obtained in the white color area of the contour map.

In FIG. 31, for example, an emission position is shown in a case where the second EML 324 is the blue emission layer without adding an auxiliary emission layer into the second EML 324. Therefore, a peak wavelength range of an emission area of the second EML 324 realizes maximum efficiency at 440 nm to 480 nm.

Since the first EML 314 configuring the first emission part 310 is the blue emission layer, a peak wavelength range of the emission area of the first EML 314 may be 510 nm to 580 nm. When light is emitted at 510 nm to 580 nm that is an emission area of the blue emission layer, maximum efficiency is obtained in a white color area of the contour map.

Therefore, an emission position of the first EML 314 is a range of 200 Å to 700 Å, and thus, an emission peak 314E is located at 510 nm to 580 nm. Thus, the first EML 314 emits light at 510 nm to 580 nm, thereby obtaining maximum efficiency.

Moreover, the first EML 314 of the first emission part 310 may be configured with two layers (for example, a red emission layer and a green emission layer) depending on a characteristic or a structure of a device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the first EML 314, maximum efficiency is obtained in the white color area of the contour map.

Moreover, the first EML 314 of the first emission part 310 may be configured with two layers (for example, a red emission layer and a yellow-green emission layer) depending on a characteristic or a structure of a device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the first EML 314, maximum efficiency is obtained in the white color area of the contour map.

Moreover, the first EML 314 of the first emission part 310 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the first EML 314, maximum efficiency is obtained in the white color area of the contour map.

Therefore, when the first EML 314 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the first EML 314 may be 510 nm to 650 nm. In this case, when light is emitted at 510 nm to 650 nm that is the emission area of the first EML 314, maximum efficiency is obtained in the white color area of the contour map.

In FIG. 31, for example, an emission position is shown in a case where the first EML 314 is the yellow-green emission layer without adding an auxiliary emission layer into the first EML 314. Therefore, a peak wavelength range of an emission area of the first EML 314 realizes maximum efficiency at 510 nm to 580 nm.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

Therefore, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. Therefore, a maximum emission range of the first EML may be 530 nm to 570 nm, a maximum emission range of the second EML may be 440 nm to 470 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 32:
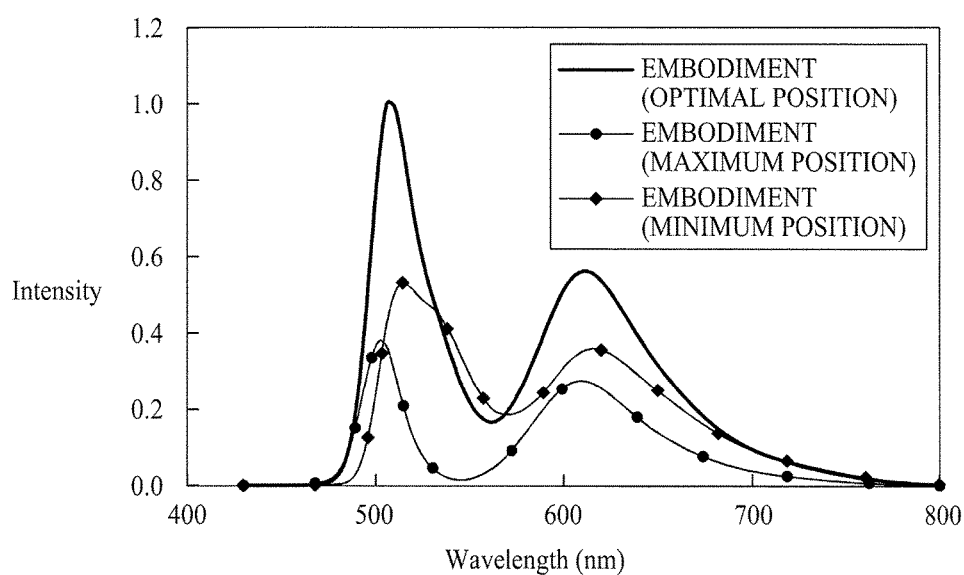
FIG. 32 is a diagram illustrating an EL spectrum according to the ninth embodiment of the present invention.

FIG. 32 is a diagram illustrating an EL spectrum according to the ninth embodiment of the present invention.

In FIG. 32, the abscissa axis indicates a wavelength range of light, and the ordinate axis indicates emission intensity. The emission intensity is a numerical value that is expressed as a relative value with respect to a maximum value of an EL spectrum.

In FIG. 32, a minimum position according to an embodiment is a portion which is set as a minimum position when emission positions of emission layers are set. For example, when the emission position L3 of the third EML 334 is within a range of 2,050 Å to 2,750 Å from the second electrode 304, the minimum position is set to 2,050 Å.

A maximum position according to an embodiment is a portion which is set as a maximum position when emission positions of emission layers are set. For example, when the emission position L3 of the third EML 334 is within a range of 2,050 Å to 2,750 Å from the second electrode 304, the maximum position is set to 2,050 Å.

An optimal position according to an embodiment is a portion which is set as an emission position according to an eighth embodiment of the present invention. For example, when the emission position L3 of the third EML 334 is within a range of 2,050 Å to 2,750 Å from the second electrode 304, an emission position according to an embodiment is set to 2,050 Å to 2,750 Å.

As shown in FIG. 32, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light, and is out of a peak wavelength range of the blue light. Also, it can be seen that emission intensity is reduced at 510 nm to 580 nm that is a peak wavelength range of yellow-green light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light. Also, it can be seen that emission intensity is reduced at 510 nm to 580 nm that is the peak wavelength range of the yellow-green light. Also, it can be seen that emission intensity is considerably reduced at 600 nm to 650 nm that is a peak wavelength range of red light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 17. When it is assumed that efficiency of a comparative example is 100%, the following Table 11 shows efficiency of a ninth embodiment of the present invention.

The following Table 17 shows a result that is obtained by comparing an efficiency of the comparative example and an efficiency of an embodiment. In the following Table 17, the comparative example relates to the bottom emission type white light emitting device including the first to third emission parts, the first emission part being configured with the blue emission layer, the second emission part being configured with the yellow-green emission layer, and the third emission part being configured with the blue emission layer. Also, an embodiment relates to a top emission type white light emitting device when an optimal position of the EPEL structure according to an embodiment of the present invention is applied.

TABLE 17

| Division | Red (R) Efficiency | Green (G) Efficiency | Blue (B) Efficiency | White (W) Efficiency | Average |
|---|---|---|---|---|---|
| Comparative Example | 100% | 100% | 100% | 100% | 100% |
| Embodiment (Optimal Position) | 177% | 164% | 151% | 168% | 165% |

As shown in Table 17, in comparison with the comparative example, when it is assumed that efficiency of the comparative example is 100% in a case where the EPEL structure is applied, it can be seen that red efficiency increases by about 77%, and green efficiency increases by about 64%. Also, it can be seen that blue efficiency increases by about 51%, and white efficiency increases by about 68%.

A panel efficiency of a white light emitting device having the EPEL structure and a panel efficiency of a comparative example are as listed in the following Table 18.

When it is assumed that an efficiency of an optimal position according to an embodiment is 100%, the following Table 18 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 18

| Division | Red (R) Efficiency | Green (G) Efficiency | Blue (B) Efficiency | White (W) Efficiency | Average |
|---|---|---|---|---|---|
| Embodiment (Minimum Position) | 84% | 72% | 76% | 73% | 76% |
| Embodiment (Optimal Position) | 100% | 100% | 100% | 100% | 100% |
| Embodiment (Maximum Position) | 43% | 46% | 23% | 44% | 39% |

As shown in Table 18, it can be seen that efficiencies of red, green, blue, and white are all reduced in a boundary between the embodiment (the minimum position) and the embodiment (the maximum position). Also, it can be seen that efficiencies of red, green, blue, and white are more reduced in the embodiment (the minimum position) than the embodiment (the maximum position).

Accordingly, when an emission position of the EPEL structure is out of an optimal position, it can be seen that panel efficiency is reduced.

As described above in the ninth embodiment of the present invention, the organic light emitting device may be a top emission type organic light emitting device.

The second emission layer and the third emission layer may respectively include emission layers that emit light having the same color.

A position of the first electrode may be within a range of 4,700 Å to 5,400 Å from the second electrode.

An emission position of the third EML may be within a range of 2,050 Å to 2,750 Å from the second electrode.

An emission position of the second EML may be within a range of 3,350 Å to 3,950 Å from the second electrode.

An emission position of the first EML may be within a range of 4,450 Å to 4,950 Å from the second electrode.

The first EML may be configured with one among a yellow-green emission layer, a yellow emission layer and a red emission layer, a red emission layer and a green emission layer, and a yellow-green emission layer and a red emission layer, or may be configured by a combination thereof.

Each of the second EML and the third EML may be configured with one among a blue emission layer, a blue emission layer and a yellow-green emission layer, a blue emission layer and a red emission layer, and a blue emission layer and a green emission layer, or may be configured by a combination thereof.

An emission area of the first EML may be a range of 510 nm to 650 nm, an emission area of the second EML may be a range of 440 nm to 650 nm, and an emission area of the third EML may be a range of 440 nm to 650 nm.

A maximum emission range of the first EML may be a range of 530 nm to 570 nm, a maximum emission range of the second EML may be a range of 440 nm to 470 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 33:
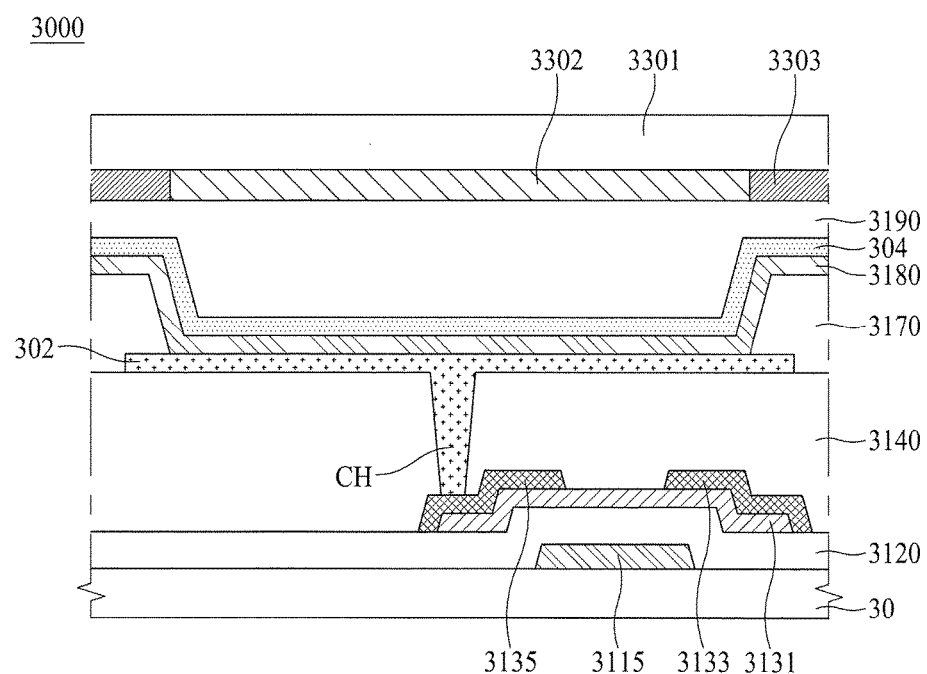
FIG. 33 is a diagram illustrating an organic light emitting device according to the seventh to ninth embodiments of the present invention.

FIG. 33 is a cross-sectional view illustrating an organic light emitting device 3000 according to an embodiment of the present invention, and uses the above-described organic light emitting device according to the seventh to ninth embodiments of the present invention. In describing the present embodiment, descriptions on elements which are the same as or correspond to the elements according to the preceding embodiment are not repeated.

As illustrated in FIG. 33, the organic light emitting device 3000 according to an embodiment of the present invention includes a substrate 30, a thin film transistor TFT, a first electrode 302, an emission part 3180, and a second electrode 304. The TFT includes a gate electrode 3115, a gate insulator 3120, a semiconductor layer 3131, a source electrode 3133, and a drain electrode 3135.

In FIG. 33, the thin film transistor TFT is illustrated as having an inverted staggered structure, but may be formed in a coplanar structure.

The substrate 30 may be formed of glass, metal, or plastic.

The gate electrode 3115 may be formed on the substrate 30.

The gate insulator 3120 may be formed on the gate electrode 3115.

The semiconductor layer 3131 may be formed on the gate insulator 3120.

The source electrode 3133 and the drain electrode 3135 may be formed on the semiconductor layer 3131.

A passivation layer 3140 may be formed on the source electrode 3133 and the drain electrode 3135.

The first electrode 302 may be formed on the passivation layer 3140.

A reflective electrode may be further formed under the first electrode 302, and may reflect light toward the second electrode 304. Also, an auxiliary electrode may be further formed on the first electrode 302.

The first electrode 302 may be electrically connected to the drain electrode 3135 through a contact hole CH which is formed in a certain area of the passivation layer 3140.

A bank layer 3170 may be formed on the first electrode 302 and may define a pixel area.

The emission part 3180 may be formed on the bank layer 3170. As illustrated in the seventh to ninth embodiments of the present invention, the emission part 3180 may include a first emission part, a second emission part, and a third emission part which are formed on the first electrode 302.

The second electrode 304 may be formed on the emission part 3180.

An encapsulation layer 3190 may be formed on the second electrode 304. An encapsulation substrate 3301 may be bonded to the first substrate 30 by the encapsulation layer 3190. The encapsulation substrate 3301 may be formed of glass, plastic, or metal. A color filter 3302 and a black matrix 3303 may be disposed on the encapsulation substrate 3301. Light emitted from the emission part 3180 may travel toward the encapsulation substrate 3301 and pass through the color filter 3302, thereby displaying an image.

The inventors have invented a bottom emission type white organic light emitting device having a new structure where panel efficiency and emission efficiency of an emission layer are enhanced and luminance and an aperture ratio are enhanced. The inventors have a white organic light emitting device where emission layers emitting light of the same color are disposed adjacent to each other, and thus, blue efficiency is further enhanced.

Figure 34:
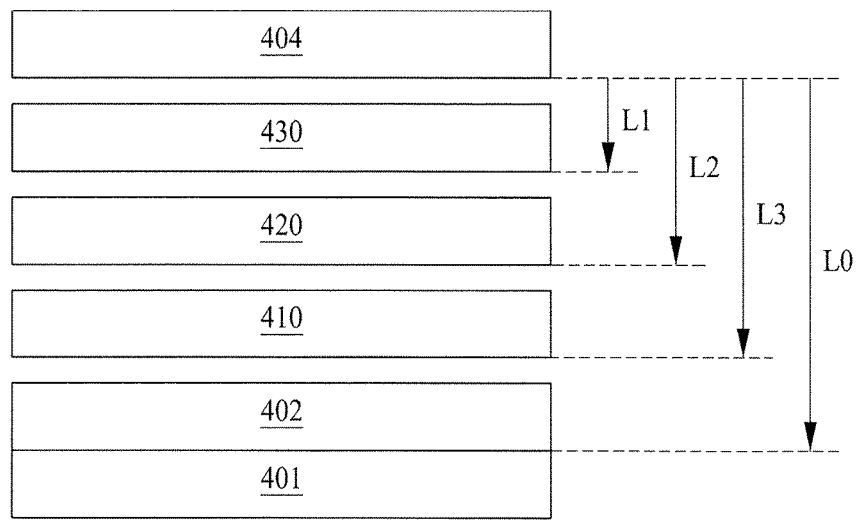
FIG. 34 is a schematic diagram illustrating a white organic light emitting device according to a tenth embodiment of the present invention.

FIG. 34 is a schematic diagram illustrating a white organic light emitting device 400 according to a tenth embodiment of the present invention.

The white organic light emitting device 400 illustrated in FIG. 34 includes first and second electrodes 402 and 404 and first to third emission parts 410, 420 and 430 between the first and second electrodes 402 and 404.

The first electrode 402 is an anode that supplies a hole. The second electrode 404 is a cathode that supplies an electron. Each of the first electrode 402 and the second electrode 404 may be referred to as an anode or a cathode. The first electrode 402 may be formed of a transmissive electrode, and the second electrode 404 may be formed of a reflective electrode.

The present invention sets a position of the first electrode 404 from the second electrode 402 and sets an emission position of a first emission layer, an emission position of a second emission layer, and an emission position of a third emission layer, thereby improving emission efficiency and panel efficiency. That is, an emission position of emitting layers (EPEL) structure may be applied to the first to third emission layers. Also, at least two of the first to third emission layers emit light having the same color, and thus, provided is a white organic light emitting device where emission efficiency is enhanced. Emission layers that emit light having the same color may be referred to as an emission layer that includes one or more emission layers emitting light having the same color.

A position L0 of the first electrode 402 is within a range of 3,500 Å to 4,500 Å from the second electrode 404. Alternatively, the position L0 of the first electrode 402 may be within a range of 3,500 Å to 4,500 Å from a reflective surface of the second electrode 404. Also, emission peaks of emission layers configuring first to third emission parts 410, 420 and 430 are located at a specific wavelength, and light having the specific wavelength is emitted, thereby improving emission efficiency. The emission peak may be referred to as an emission peak of an organic layer configuring the emission parts.

A position L0 of the first electrode 402 may be set from the second electrode 404, and an emission position L1 of the third emission part 430 closest to the second electrode 104 may be within a range of 250 Å to 800 Å. Alternatively, the emission position L1 of the third emission part 430 may be within a range of 250 Å to 800 Å from the reflective surface of the second electrode 404. The third emission part 430 may be configured with a blue emission layer, the blue emission layer and a yellow-green emission layer, the blue emission layer and a red emission layer, or the blue emission layer and a green emission layer, or may be configured by a combination thereof. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The emission position L1 of the third emission part 430 may be within a range of 250 Å to 800 Å from the second electrode 404 irrespective of at least one among a thickness of the emission layer, the number of emission layers, a thickness of the organic layer, and the number of organic layers. Alternatively, the emission position L1 of the third emission part 430 may be within a range of 250 Å to 800 Å from the reflective surface of the second electrode 404. Therefore, the emission peak is located in a blue emission area, a blue and yellow-green emission area, a blue and red emission area, or a blue and green emission layer, and light having a wavelength corresponding to the emission peak is emitted, thereby enabling the third emission part 130 to realize the maximum luminance. A peak wavelength range of the blue emission layer may be 440 nm to 480 nm. Also, a peak wavelength range of the blue emission layer and the yellow-green emission layer may be 440 nm to 580 nm. Also, a peak wavelength range of the blue emission layer and the red emission layer may be 440 nm to 650 nm. Also, a peak wavelength range of the blue emission layer and the green emission layer may be 440 nm to 560 nm. Here, a peak wavelength may be an emission area.

An emission position L2 of the second emission part 420 may be within a range of 1,450 Å to 1,950 Å from the second electrode 404. Alternatively, the emission position L2 of the second emission part 420 may be within a range of 1,450 Å to 1,950 Å from the reflective surface of the second electrode 404. The second emission part 420 may be configured with a yellow-green emission layer, a red emission layer and a green emission layer, a yellow emission layer and the red emission layer, or the yellow-green emission layer and a red emission layer, or may be configured by a combination thereof. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The emission position L2 of the second emission part 420 may be within a range of 1,450 Å to 1,950 Å from the second electrode 404 irrespective of at least one among a thickness of the emission layer, the number of emission layers, a thickness of the organic layer, and the number of organic layers. Alternatively, the emission position L2 of the second emission part 420 may be within a range of 1,450 Å to 1,950 Å from the reflective surface of the second electrode 404.

Therefore, the emission peak is located in a yellow-green emission area, a yellow and red emission area, a red and green emission area, or a yellow-green and red emission area, and light having a wavelength corresponding to the emission peak is emitted, thereby enabling the second emission part 420 to realize the maximum luminance. A peak wavelength range of the blue emission layer may be 440 nm to 480 nm. Also, a peak wavelength range of the blue emission layer and the yellow-green emission layer may be 440 nm to 580 nm. Also, a peak wavelength range of the blue emission layer and the red emission layer may be 440 nm to 650 nm. Also, a peak wavelength range of the blue emission layer and the green emission layer may be 440 nm to 560 nm. Here, a peak wavelength may be an emission area.

An emission position L3 of the first emission part 410 may be within a range of 2,050 Å to 2,600 Å from the second electrode 404. Alternatively, the emission position L3 of the first emission part 410 may be within a range of 2,050 Å to 2,600 Å from the reflective surface of the second electrode 404. The first emission part 410 may be configured with a yellow-green emission layer, a red emission layer and a green emission layer, a yellow emission layer and the red emission layer, or the yellow-green emission layer and a red emission layer, or may be configured by a combination thereof.

The emission position L3 of the first emission part 410 may be within a range of 2,050 Å to 2,600 Å from the second electrode 404 irrespective of at least one among a thickness of the emission layer, the number of emission layers, a thickness of the organic layer, and the number of organic layers. Alternatively, the emission position L3 of the first emission part 410 may be within a range of 2,050 Å to 2,600 Å from the reflective surface of the second electrode 404.

Therefore, the emission peak is located in a yellow-green emission area, a yellow and red emission area, a red and green emission area, or a yellow-green and red emission area, and light having a wavelength corresponding to the emission peak is emitted, thereby enabling the first emission part 410 to realize the maximum luminance. A peak wavelength range of the yellow-green emission layer may be 510 nm to 580 nm. Also, a peak wavelength range of the yellow emission layer and the red emission layer may be 540 nm to 650 nm. Also, a peak wavelength range of the red emission layer and the green emission layer may be 510 nm to 650 nm. Also, a peak wavelength range of the yellow-green emission layer and the red emission layer may be 510 nm to 650 nm. Here, a peak wavelength may be an emission area.

The present invention sets a position of the first electrode 402 from the second electrode 404 irrespective of at least one among a thickness of the emission layer, the number of emission layers, a thickness of the organic layer, and the number of organic layers, and applies the EPEL structure where emission positions of the emission layers are set from the second electrode 404. Also, the first to third emission parts 410, 420 and 430 have the EPEL structure that has a maximum emission range in emission areas of the first to third emission layers.

Figure 35:
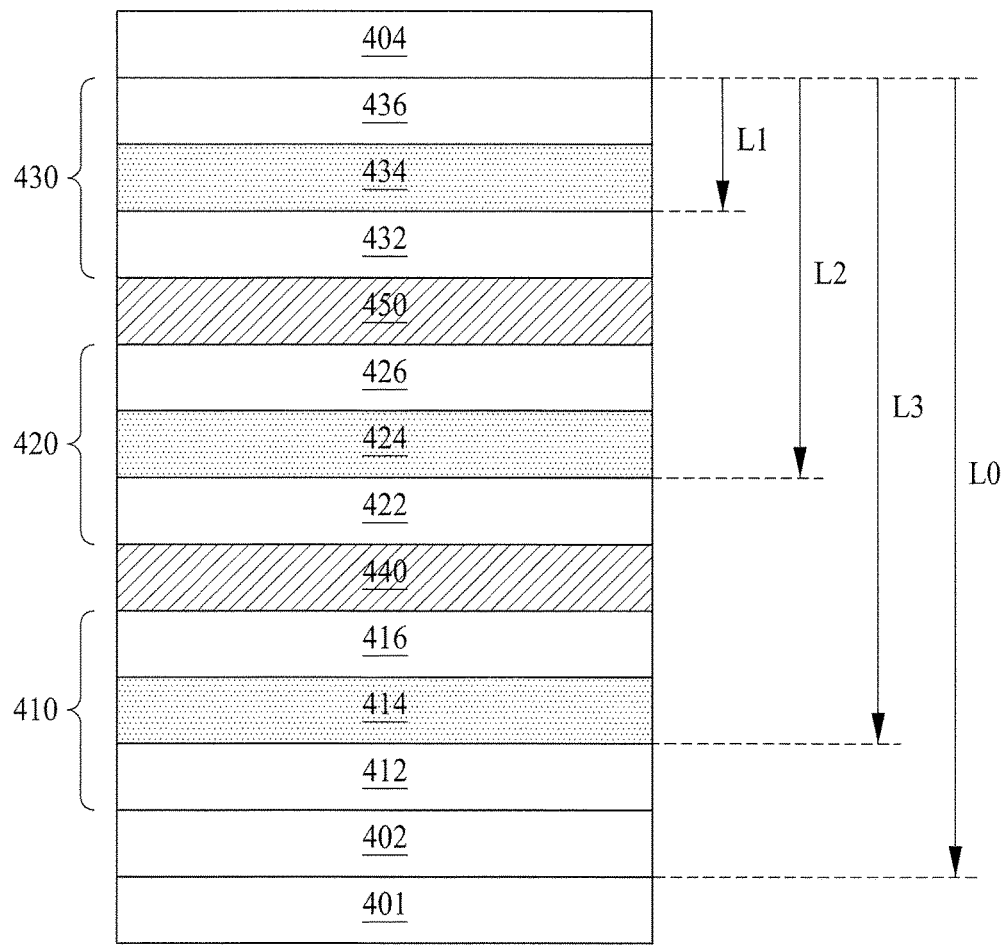
FIG. 35 is a diagram illustrating a white organic light emitting device according to the tenth embodiment of the present invention.

FIG. 35 is a diagram illustrating a white organic light emitting device 400 according to a tenth embodiment of the present invention.

The white organic light emitting device 400 illustrated in FIG. 35 includes first and second electrodes 402 and 404 and first to third emission parts 410, 420 and 430 disposed between the first and second electrodes 402 and 404.

Each of the first electrode 402 and the second electrode 404 may be referred to as an anode or a cathode.

The first electrode 402 may be formed of a transmissive electrode, and the second electrode 404 may be formed of a reflective electrode.

A position L0 of the first electrode 402 is within a range of 3,500 Å to 4,500 Å from the second electrode 404. Since the position L0 of the first electrode 402 is set, emission peaks of emission layers configuring the first to third emission parts 410, 420 and 430 are located at a specific wavelength, and light having the specific wavelength is emitted, thereby improving an emission efficiency of the emission layers.

The third emission part 430 may include an ETL 436, an EML 434, and an HTL 432 which are disposed under the second electrode 104. Although not shown, an EIL may be further formed on the third ETL 436.

An HIL may be further formed under the third HTL 432.

An HBL may be further formed on the third EML 434. The third ETL 436 and the HBL may be provided as one layer or single layer.

An EBL may be further formed under the third EML 434. The third HTL 432 and the EBL may be provided as one layer or single layer.

The third EML 134 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the third EML 434 is provided along with the auxiliary emission layer, the yellow-green emission layer, the red emission layer, or the green emission layer may be disposed on or under the third EML 434. Also, the yellow-green emission layer, the red emission layer, or the green emission layer may be identically or differently provided as the auxiliary emission layer on and under the third EML 434. The positions or number of emission layers may be selectively determined depending on a structure and a characteristic of an organic light emitting device, but the present embodiment is not limited thereto.

When the auxiliary emission layer is provided in the third EML 434, a peak wavelength of an emission area of the third EML 434 may be within a range of 440 nm to 650 nm. Here, the peak wavelength may be an emission area.

All layers such as the third ETL 436, the third EML 434, the EIL, and the HBL may be referred to as an organic layer. All organic layers between the second electrode 404 and the third EML 434, the second electrode 404, and the third EML 434 may be referred to as an organic layer. Therefore, all organic layers between the second electrode 404 and the third EML 434 may be referred to as a fourth organic layer.

An emission position L1 of the third EML 434 may be within a range of 250 Å to 800 Å from the second electrode 404 irrespective of at least one among the number or thickness of the third ETL 436, the number or thickness of the third EML 434, the number or thickness of the EIL, the number or thickness of the HBL, or the number or thickness of the organic layers disposed between the second electrode 404 and the third EML 434. Alternatively, the emission position L1 of the third EML 434 may be within a range of 250 Å to 800 Å from the reflective surface of the second electrode 404.

Therefore, the emission position L1 of the third EML 434 may be within a range of 250 Å to 800 Å from the second electrode 404 irrespective of at least one among the number of fourth organic layers, a thickness of the fourth organic layer, the number of third EMLs, and a thickness of the third EML. Alternatively, the emission position L1 of the third EML 434 may be within a range of 250 Å to 800 Å from the reflective surface of the second electrode 404 irrespective of at least one among the number of the fourth organic layers, a thickness of the fourth organic layer, the number of the third EMLs, and a thickness of the third EML.

The second emission part 420 may include a second HTL 422, a second EML 424, and a second ETL 426.

An HIL may be further formed under the second HTL 422.

An HBL may be further formed on the second EML 424. The second ETL 426 and the HBL may be provided as one layer or single layer.

An EBL may be further formed under the second EML 424. The second HTL 422 and the EBL may be provided as one layer or single layer.

The second EML 424 may include a blue emission layer or a blue emission layer that includes an auxiliary emission layer emitting a different color. The blue emission layer may include one among a blue emission layer, a deep blue emission layer, and a sky blue emission layer. The deep blue emission layer may be disposed in a short-wavelength range unlike the blue emission layer, and thus can enhance a color reproduction rate and luminance.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the second EML 424 is provided along with the auxiliary emission layer, the yellow-green emission layer, the red emission layer, or the green emission layer may be disposed on or under the second EML 424. Also, the yellow-green emission layer, the red emission layer, or the green emission layer may be identically or differently provided as the auxiliary emission layer on and under the second EML 424. The positions or number of emission layers may be selectively determined depending on a structure and a characteristic of an organic light emitting device, but the present embodiment is not limited thereto.

When the auxiliary emission layer is provided in the second EML 424, a peak wavelength of an emission area of the second EML 424 may be within a range of 440 nm to 650 nm. Here, the peak wavelength may be an emission area.

A second CGL 450 may be further formed between the second emission part 420 and the third emission part 430. The second CGL 450 may include an N-type CGL and a P-type CGL.

Each of the second EML 424, the second ETL 426, the second CGL 450, the third HTL 432, the HBL, the EBL, and the HTL may be referred to as an organic layer. All organic layers between the third EML 434 and the second EML 424, and the second EML 424 may be referred to as an organic layer. Therefore, all organic layers between the third EML 434 and the second EML 424 may be referred to as a third organic layer.

An emission position L2 of the second EML 424 may be within a range of 1,450 □ to 1,950 □ from the second electrode 404 irrespective of at least one among the number or thickness of the third HTL 432, the number or thickness of the second ETL 426, the number or thickness of the second CGL 450, the number or thickness of the HBL, the number or thickness of the EBL, the number or thickness of the HIL, the number or thickness of the third EML 434, the number or thickness of the second EML 424, the number or thickness of the organic layers between the second electrode 404 and the third EML 434, or the number or thickness of the organic layers between the third EML 434 and the second EML 424. Alternatively, the emission position L2 of the second EML 424 may be within a range of 1,450 □ to 1,950 □ from a reflective surface of the second electrode 404.

Therefore, the emission position L2 of the second EML 424 may be within a range of 1,450 □ to 1,950 □ from the second electrode 404 irrespective of at least one among the number of the fourth organic layers, a thickness of the fourth organic layer, the number of the third organic layers, a thickness of the third organic layer, the number of the third EMLs, a thickness of the third EML, the number of the second EMLs, and a thickness of the second EML. Alternatively, the emission position L2 of the second EML 424 may be within a range of 1,450 □ to 1,950 □ from the reflective surface of the second electrode 404 irrespective of at least one among the number of the fourth organic layers, a thickness of the fourth organic layer, the number of the third organic layers, a thickness of the third organic layer, the number of the third EMLs, a thickness of the third EML, the number of the second EMLs, and a thickness of the second EML.

The first emission part 410 may include a first HTL 412, a first EML 414, and a first ETL 416 which are disposed on the first electrode 402.

Although not shown, an HIL may be further formed on the first electrode 402.

An HBL may be further formed on the first EML 414. The first ETL 416 and the HBL may be provided as one layer or single layer.

An EBL may be further formed under the first EML 414. The first HTL 412 and the EBL may be provided as one layer or single layer.

The first EML 414 may be configured with a yellow-green emission layer. A peak wavelength of an emission area of the yellow-green emission layer may be within a range of 510 nm to 580 nm. Here, the peak wavelength may be an emission area.

The first EML 414 may be configured with one among a yellow-green emission layer, a yellow emission layer and a red emission layer, the red emission layer and a green emission layer, and the yellow-green emission layer and the red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the first EML 414. Also, the yellow emission layer and the red emission layer, the red emission layer and the green emission layer, or the yellow-green emission layer and the red emission layer may be identically or differently provided as the auxiliary emission layer on and under the first EML 414.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the first EML 414 is configured with two layers (for example, the yellow emission layer and the red emission layer), an emission efficiency of the red emission layer can increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the first EML 414 is configured with two layers (for example, the red emission layer and the green emission layer), a color reproduction rate can be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer of the first EML 414 may be within a range of 540 nm to 650 nm. Here, the peak wavelength may be an emission area. When the first EML 414 is configured with two layers (for example, the yellow emission layer and the red emission layer), an emission efficiency of the red emission layer can increase.

Moreover, the first EML 414 may be configured with two layers (for example, the red emission layer and the yellow-green emission layer) depending on a characteristic or a structure of a device. A peak wavelength of an emission area of the red emission layer may be within a range of 600 nm to 650 nm. A peak wavelength of an emission area of the yellow-green emission layer may be within a range of 510 nm to 580 nm. When the first EML 414 is configured with two layers (for example, the red emission layer and the yellow-green emission layer), an emission efficiency of the red emission layer can increase. In this case, a peak wavelength of an emission area of the first EML 414 may be within a range of 510 nm to 650 nm. Here, the peak wavelength may be an emission area.

When the first EML 414 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the second EML 414 may be within a range of 510 nm to 650 nm. Here, the peak wavelength may be an emission area.

A first CGL 440 may be further formed between the first emission part 410 and the second emission part 420. The first CGL 440 may include an N-type CGL and a P-type CGL.

Each of the first EML 414, the first ETL 416, the first CGL 440, the second HTL 422, the HBL, the EBL, and the HTL may be referred to as an organic layer. All organic layers between the second EML 424 and the first EML 414, and the first EML 414 may be referred to as an organic layer. Therefore, all organic layers between the second EML 424 and the first EML 414 may be referred to as a second organic layer.

An emission position L3 of the first EML 414 may be within a range of 2,050 □ to 2,600 □ from the second electrode 404 irrespective of at least one among the number or thickness of the first ETL 416, the number or thickness of the second HTL 422, the number or thickness of the first CGL 440, the number or thickness of the HBL, the number or thickness of the EBL, the number or thickness of the HIL, the number or thickness of the third EML 434, the number or thickness of the second EML 424, the number or thickness of the first EML 414, the number or thickness of organic layers between the second electrode 404 and the third EML 434, the number or thickness of organic layers between the second EML 424 and the third EML 434, or the number or thickness of organic layers between the first EML 414 and the second EML 424. Alternatively, emission position L3 of the first EML 414 may be s within a range of 2,050 □, to 2,600 □ from a reflective surface of the second electrode 404.

Therefore, the emission position L3 of the first EML 414 may be within a range of 2,050 □ to 2,600 □ from the second electrode 404 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, and a thickness of the first EML. Alternatively, emission position L3 of the first EML 414 may be within a range of 2,050 □ to 2,600 □ from the reflective surface of the second electrode 404 irrespective of at least one among the number of the fourth organic layers, a thickness of the fourth organic layer, the number of the third organic layers, a thickness of the third organic layer, the number of the second organic layers, a thickness of the second organic layer, the number of the third EMLs, a thickness of the third EML, the number of the second EMLs, a thickness of the second EML, the number of the first EMLs, and a thickness of the first EML.

All organic layers such as the first HTL 412, the EBL, and the HTL may be referred to as an organic layer. All organic layers between the substrate 401 and the first EML 414, and the first electrode 402 may be referred to as an organic layer. Therefore, all organic layers between the substrate 301 and the first EML 414 may be referred to as a first organic layer.

The position L0 of the first electrode 402 may be within a range of 3,500 Å to 4,500 Å from the second electrode 404 irrespective of at least one among the number or thickness of the first HTL 412, the number or thickness of the auxiliary electrode 403, the number or thickness of the EBL, the number or thickness of the HIL, the number or thickness of the third EML 434, the number or thickness of the second EML 424, the number or thickness of the first EML 414, the number or thickness of the organic layers between the second electrode 404 and the third EML 434, the number or thickness of the organic layers between the third EML 434 and the second EML 424, the number or thickness of the organic layers between the second EML 424 and the first EML 414, or the number or thickness of the organic layers d between the first EML 414 and the substrate 401. Alternatively, the position L0 of the first electrode 402 may be within a range of 3,500 Å to 4,500 Å from a reflective surface of the second electrode 404.

Therefore, the position L0 of the first electrode 402 may be within a range of 3,500 Å to 4,500 Å from the second electrode 404 irrespective of at least one among the number of the fourth organic layers, a thickness of the fourth organic layer, the number of the third organic layers, a thickness of the third organic layer, the number of the second organic layers, a thickness of the second organic layer, the number of the first organic layers, a thickness of the first organic layer, the number of the third EMLs, a thickness of the third EML, the number of the second EMLs, a thickness of the second EML, the number of the first EMLs, and a thickness of the first EML. Alternatively, the position L0 of the first electrode 402 may be within a range of 3,500 Å to 4,500 Å from the reflective surface of the second electrode 404 irrespective of at least one among the number of the fourth organic layers, a thickness of the fourth organic layer, the number of the third organic layers, a thickness of the third organic layer, the number of the second organic layers, a thickness of the second organic layer, the number of the first organic layers, a thickness of the first organic layer, the number of the third EMLs, a thickness of the third EML, the number of the second EMLs, a thickness of the second EML, the number of the first EMLs, and a thickness of the first EML.

The structure illustrated in FIG. 35 is an example of the present invention, and may be selectively changed depending on a structure or a characteristic of a white organic light emitting device. However, the present embodiment is not limited thereto.

Figure 36:
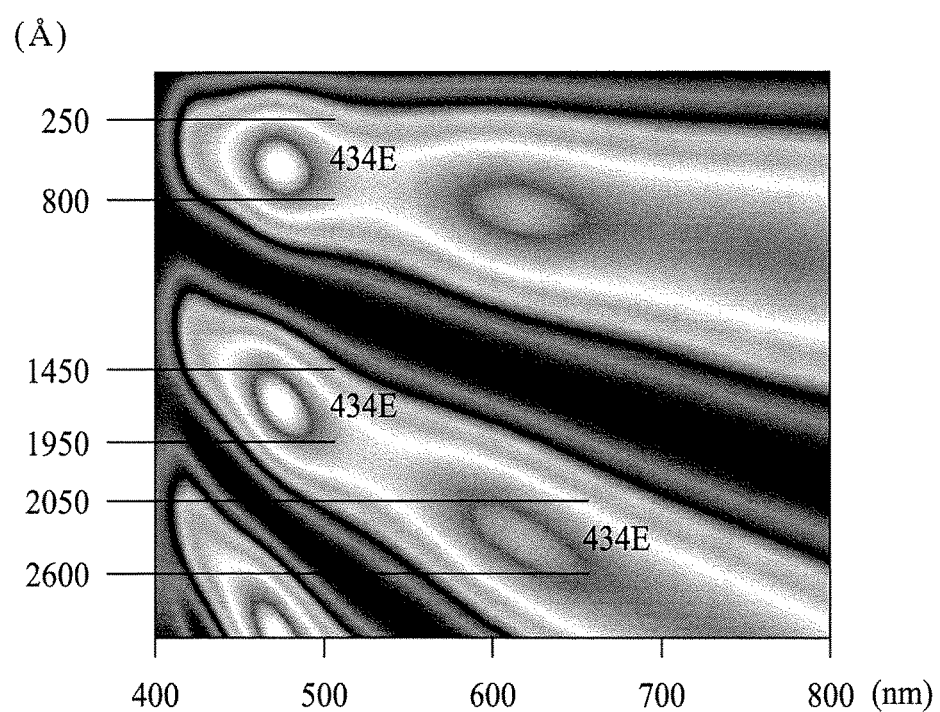
FIG. 36 is a diagram illustrating an emission position of an organic light emitting device according to the tenth embodiment of the present invention.

FIG. 36 is a diagram illustrating an emission position of an organic light emitting device according to the tenth embodiment of the present invention.

In FIG. 36, the abscissa axis indicates a wavelength range of light, and the ordinate axis indicates emission positions of emission layers configuring the emission part from the second electrode 404 and may be referred to as a contour map. Here, when the EPEL structure according to an embodiment of the present invention is applied except the first electrode 402 and the second electrode 404, FIG. 36 shows the emission positions of the emission layers at an emission peak. Also, FIG. 36 shows emission positions of emission layers having a maximum emission range in emission areas of the emission layers.

Since the third EML 434 configuring the third emission part 430 is the blue emission layer, a peak wavelength range of the emission area of the third EML 434 may be 440 nm to 480 nm. When light is emitted at 440 nm to 480 nm that is a maximum wavelength of the blue emission layer, maximum efficiency is obtained in a white color area of the contour map.

Therefore, an emission position of the third EML 334 is within a range of 250 Å to 800 Å, and thus, an emission peak 434E of the third EML 134 is located at 440 nm to 480 nm that is the maximum wavelength. Thus, the third EML 434 emits light at 440 nm to 480 nm that is the maximum wavelength, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the third EML 434 configuring the third emission part 430, a peak wavelength range of the emission area of the third EML 434 may be a range of 440 nm to 650 nm. Therefore, when light is emitted at 440 nm to 650 nm that is an emission area of the third EML 434, maximum efficiency is obtained in the white color area of the contour map.

In FIG. 36, for example, an emission position is shown in a case where the third EML 434 is the blue emission layer without adding an auxiliary emission layer into the third EML 434. Therefore, a peak wavelength range of an emission area of the third EML 434 realizes maximum efficiency at 440 nm to 480 nm.

Since the second EML 424 configuring the second emission part 420 is the blue emission layer, a peak wavelength range of the emission area of the second EML 424 may be a range of 440 nm to 480 nm. When light is emitted at 440 nm to 480 nm that is an emission area of the blue emission layer, maximum efficiency is obtained in the white color area of the contour map.

Therefore, an emission position of the second EML 424 is within a range of 1,450 Å to 1,950 Å, and thus, an emission peak 424E of the second EML 424 is located at 440 nm to 480 nm. Thus, the second EML 424 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the second EML 424 configuring the second emission part 420, a peak wavelength range of the emission area of the second EML 424 may be a range of 440 nm to 650 nm. Therefore, when light is emitted at 440 nm to 650 nm that is an emission area of the second EML 424, maximum efficiency is obtained in the white color area of the contour map.

In FIG. 36, for example, an emission position is shown in a case where the second EML 424 is the blue emission layer without adding an auxiliary emission layer into the second EML 424. Therefore, a peak wavelength range of an emission area of the second EML 424 realizes maximum efficiency at 440 nm to 480 nm.

Since the first EML 414 configuring the first emission part 410 is the blue emission layer, a peak wavelength range of the emission area of the first EML 414 may be 510 nm to 580 nm. When light is emitted at 510 nm to 580 nm that is an emission area of the blue emission layer, maximum efficiency is obtained in a white color area of the contour map.

Therefore, an emission position of the first EML 414 is within a range of 2,050 Å to 2,600 Å, and thus, an emission peak 414E is located at 510 nm to 580 nm. Thus, the first EML 414 emits light at 510 nm to 580 nm, thereby obtaining maximum efficiency.

Moreover, the first EML 414 of the first emission part 410 may be configured with two layers (for example, a red emission layer and a green emission layer) depending on a characteristic or a structure of a device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the first EML 414, maximum efficiency is obtained in the white color area of the contour map.

Moreover, the first EML 414 of the first emission part 410 may be configured with two layers (for example, a red emission layer and a yellow-green emission layer) depending on a characteristic or a structure of a device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the first EML 414, maximum efficiency is obtained in the white color area of the contour map.

Moreover, the first EML 414 of the first emission part 410 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the first EML 414, maximum efficiency is obtained in the white color area of the contour map.

Therefore, when the first EML 414 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the first EML 414 may be 510 nm to 650 nm. In this case, when light is emitted at 510 nm to 650 nm that is the emission area of the first EML 414, maximum efficiency is obtained in the white color area of the contour map.

In FIG. 36, for example, an emission position is shown in a case where the first EML 414 is the yellow-green emission layer without adding an auxiliary emission layer into the first EML 414. Therefore, a peak wavelength range of an emission area of the first EML 414 realizes maximum efficiency at 510 nm to 580 nm.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

Therefore, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. Therefore, a maximum emission range of the first EML may be 530 nm to 570 nm, a maximum emission range of the second EML may be 440 nm to 470 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 37:
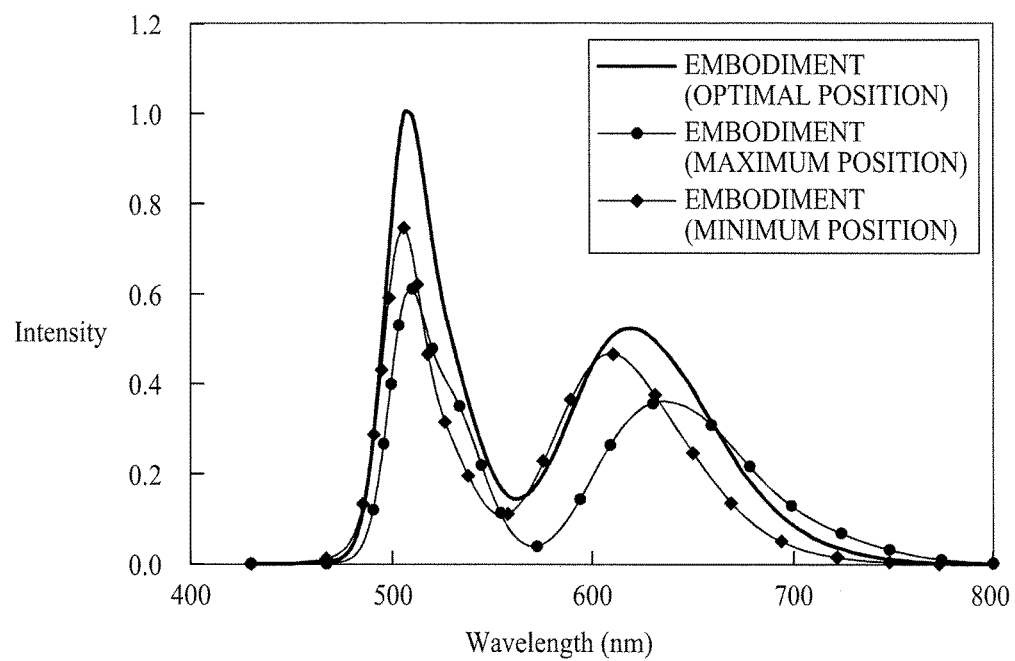
FIG. 37 is a diagram illustrating an EL spectrum according to the tenth embodiment of the present invention.

FIG. 37 is a diagram illustrating an EL spectrum according to the tenth embodiment of the present invention.

In FIG. 37, the abscissa axis indicates a wavelength range of light, and the ordinate axis indicates emission intensity. The emission intensity is a numerical value that is expressed as a relative value with respect to a maximum value of an EL spectrum.

In FIG. 37, a minimum position according to an embodiment is a portion which is set as a minimum position when emission positions of emission layers are set. For example, when the emission position L1 of the third EML 434 is within a range of 250 Å to 800 Å from the second electrode 404, the minimum position is set to 250 Å.

A maximum position according to an embodiment is a portion which is set as a maximum position when emission positions of emission layers are set. For example, when the emission position L1 of the third EML 434 is within a range of 250 Å to 800 Å from the second electrode 404, the maximum position is set to 800 Å.

An optimal position according to an embodiment is a portion which is set as an emission position according to an eighth embodiment of the present invention. For example, when the emission position L1 of the third EML 434 is within a range of 250 Å to 800 Å from the second electrode 404, an emission position according to an embodiment is within a range of 250 Å to 800 Å.

As shown in FIG. 37, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light, and is out of a peak wavelength range of the blue light. Also, it can be seen that emission intensity is reduced at 510 nm to 580 nm that is a peak wavelength range of yellow-green light. Also, it can be seen that emission intensity is considerably reduced at 600 nm to 650 nm that is a peak wavelength range of red light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light. Also, it can be seen that emission intensity is considerably reduced at 510 nm to 580 nm that is the peak wavelength range of the yellow-green light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 19. When it is assumed that efficiency of a comparative example is 100%, the following Table 11 shows efficiency of a tenth embodiment of the present invention.

The following Table 19 shows a result that is obtained by comparing an efficiency of the comparative example and an efficiency of an embodiment. In the following Table 19, the comparative example relates to the bottom emission type white light emitting device including the first to third emission parts, the first emission part being configured with the blue emission layer, the second emission part being configured with the yellow-green emission layer, and the third emission part being configured with the blue emission layer. Also, an embodiment relates to a top emission type white light emitting device when an optimal position of the EPEL structure according to an embodiment of the present invention is applied.

TABLE 19

| Division | Red (R) Efficiency | Green (G) Efficiency | Blue (B) Efficiency | White (W) Efficiency | Average |
|---|---|---|---|---|---|
| Comparative Example | 100% | 100% | 100% | 100% | 100% |
| Embodiment (Optimal Position) | 122% | 86% | 89% | 95% | 95% |

As shown in Table 19, in comparison with the comparative example, when it is assumed that efficiency of the comparative example is 100% in a case where the EPEL structure is applied, it can be seen that red efficiency increases by about 22%, and green, blue, and white efficiencies are almost similar to the comparative example.

A panel efficiency of a white light emitting device having the EPEL structure and a panel efficiency of a comparative example are as listed in the following Table 20.

When it is assumed that an efficiency of an optimal position according to an embodiment is 100%, the following Table 20 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 20

| Division | Red (R) Efficiency | Green (G) Efficiency | Blue (B) Efficiency | White (W) Efficiency | Average |
|---|---|---|---|---|---|
| Embodiment (Minimum Position) | 60% | 96% | 67% | 84% | 77% |
| Embodiment (Optimal Position) | 100% | 100% | 100% | 100% | 100% |
| Embodiment (Maximum Position) | 104% | 50% | 67% | 65% | 71% |

As shown in Table 20, it can be seen that efficiencies of red, green, blue, and white are all reduced in a boundary between the embodiment (the minimum position) and the embodiment (the maximum position). Also, it can be seen that efficiencies of red, green, blue, and white are more reduced in the embodiment (the minimum position) than the embodiment (the maximum position).

Accordingly, when an emission position of the EPEL structure is out of an optimal position, it can be seen that panel efficiency is reduced.

As described above in the tenth embodiment of the present invention, the organic light emitting device may be a bottom emission type organic light emitting device.

The second emission layer and the third emission layer may respectively include emission layers that emit light having the same color.

A position of the first electrode may be within a range of 3,500 Å to 4,500 Å from the second electrode.

An emission position of the third EML may be within a range of 250 Å to 800 Å from the second electrode.

An emission position of the second EML may be within a range of 1,450 Å to 1,950 Å from the second electrode.

An emission position of the first EML may be within a range of 2,050 Å to 2,600 Å from the second electrode.

The first EML may be configured with one among a yellow-green emission layer, a yellow emission layer and a red emission layer, a red emission layer and a green emission layer, and a yellow-green emission layer and a red emission layer, or may be configured by a combination thereof.

Each of the second EML and the third EML may be configured with one among a blue emission layer, a blue emission layer and a yellow-green emission layer, a blue emission layer and a red emission layer, and a blue emission layer and a green emission layer, or may be configured by a combination thereof.

An emission area of the first EML may be a range of 510 nm to 650 nm, an emission area of the second EML may be a range of 440 nm to 650 nm, and an emission area of the third EML may be a range of 440 nm to 650 nm.

A maximum emission range of the first EML may be a range of 530 nm to 570 nm, a maximum emission range of the second EML may be a range of 440 nm to 470 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 38:
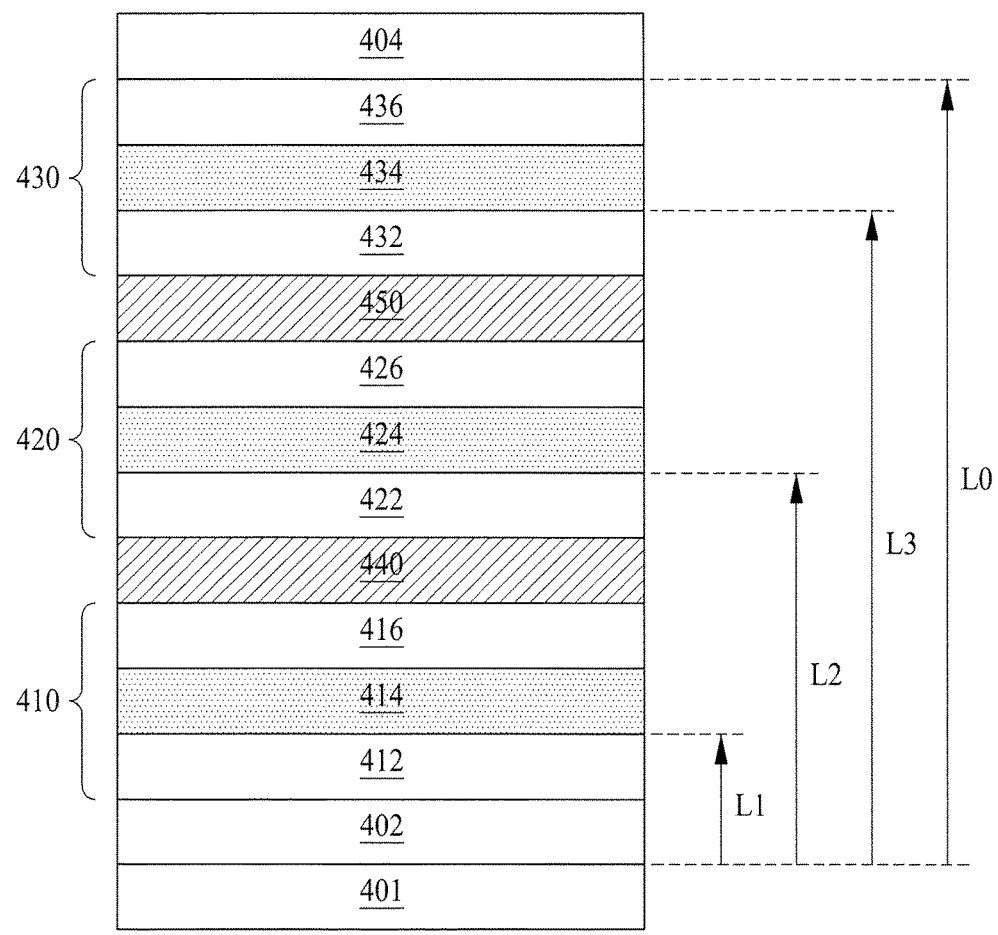
FIG. 38 is a diagram illustrating a white organic light emitting device according to an eleventh embodiment of the present invention.

FIG. 38 is a diagram illustrating a white organic light emitting device 400 according to an eleventh embodiment of the present invention.

The white organic light emitting device 400 illustrated in FIG. 38 includes first and second electrodes 402 and 404 and first to third emission parts 410, 420 and 430 disposed between the first and second electrodes 402 and 404. In describing the present embodiment, descriptions on elements which are the same as or correspond to the elements according to the preceding embodiment are not repeated. In the present embodiment, emission positions of emission layers are set from a second electrode, and may be set from the first electrode depending on a device design.

A position L0 of the second electrode 404 is within a range of 3,500 Å to 4,500 Å from the first electrode 402. Since the position L0 of the second electrode 404 is set, the emission peaks of the emission layers configuring the first to third emission parts 410, 420 and 430 is located at a specific wavelength, and light having the specific wavelength is emitted, thereby improving emission efficiency. The first to third emission parts 410, 420 and 430 have the EPEL structure that has a maximum emission range in emission areas of the first to third emission layers. Also, at least two of the first to third emission layers emit light having the same color, and thus, provided is a white organic light emitting device where emission efficiency is enhanced. Emission layers that emit light having the same color may be referred to as an emission layer that includes one or more emission layers emitting light having the same color.

The first emission part 410 may include a first HTL 412, a first EML 414, and a first ETL 416 which are disposed on the first electrode 402.

Although not shown, an HIL may be further formed on the first electrode 402.

An HBL may be further formed on the first EML 414. The first ETL 416 and the HBL may be provided as one layer or single layer.

An EBL may be further formed under the first EML 414. The first HTL 412 and the EBL may be provided as one layer or single layer.

The first EML 414 may be configured with a yellow-green emission layer. A peak wavelength of an emission area of the yellow-green emission layer may be within a range of 510 nm to 580 nm. Here, the peak wavelength may be an emission area.

The first EML 414 may be configured with one among a yellow-green emission layer, a yellow emission layer and a red emission layer, the red emission layer and a green emission layer, and the yellow-green emission layer and the red emission layer, or may be configured by a combination thereof. When the red emission layer is further provided along with the yellow-green emission layer, an emission efficiency of the red emission layer can be further improved. The red emission layer may be disposed on or under the yellow-green emission layer.

Moreover, the yellow emission layer and the red emission layer, the red emission layer and the green emission layer, or the yellow-green emission layer and the red emission layer may be disposed on or under the first EML 414. Also, the yellow emission layer and the red emission layer, the red emission layer and the green emission layer, or the yellow-green emission layer and the red emission layer may be identically or differently provided as the auxiliary emission layer on and under the first EML 414.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer may be within a range of 540 nm to 650 nm. Here, the peak wavelength may be an emission area. When the first EML 414 is configured with two layers (for example, the yellow emission layer and the red emission layer), an emission efficiency of the red emission layer can increase.

Moreover, a peak wavelength of an emission area of the red emission layer may be within a range of 600 nm to 650 nm. A peak wavelength of an emission area of the green emission layer may be within a range of 510 nm to 560 nm. Therefore, a peak wavelength of an emission area of the red emission layer and the green emission layer may be within a range of 510 nm to 650 nm. Here, the peak wavelength may be an emission area. When the first EML 414 is configured with two layers (for example, the red emission layer and the green emission layer), a color reproduction rate can be enhanced.

Moreover, a peak wavelength of an emission area of the yellow emission layer may be within a range of 540 nm to 580 nm. A peak wavelength of an emission area of the red emission layer may be within a range of 600 nm to 650 nm. Therefore, a peak wavelength of an emission area of the yellow emission layer and the red emission layer of the first EML 414 may be within a range of 540 nm to 650 nm. Here, the peak wavelength may be an emission area. When the first EML 414 is configured with two layers (for example, the yellow emission layer and the red emission layer), an emission efficiency of the red emission layer can increase.

Moreover, the first EML 414 may be configured with two layers (for example, the red emission layer and the yellow-green emission layer) depending on a characteristic or a structure of a device. A peak wavelength of an emission area of the red emission layer may be within a range of 600 nm to 650 nm. A peak wavelength of an emission area of the yellow-green emission layer may be within a range of 510 nm to 580 nm. When the first EML 414 is configured with two layers (for example, the red emission layer and the yellow-green emission layer), an emission efficiency of the red emission layer can increase. In this case, a peak wavelength of an emission area of the first EML 414 may be within a range of 510 nm to 650 nm. Here, the peak wavelength may be an emission area.

When the first EML 414 is configured with one among the yellow-green emission layer, the yellow emission layer and the red emission layer, the red emission layer and the green emission layer, and the yellow-green emission layer and the red emission layer, or is configured by a combination thereof, a peak wavelength of an emission area of the second EML 414 may be within a range of 510 nm to 650 nm. Here, the peak wavelength may be an emission area.

All organic layers such as the first HTL 412, the EBL, and the HTL may be referred to as an organic layer. All organic layers between the substrate 401 and the first EML 414, and the first electrode 402 may be referred to as an organic layer. Therefore, all organic layers between the substrate 301 and the first EML 414 may be referred to as a first organic layer.

An emission position L1 of the first EML 414 may be within a range of 1,500 Å to 2,050 Å from the second electrode 404 irrespective of at least one among the number or thickness of the first HTL 412, the number or thickness of the first electrode 402, the number or thickness of the EBL, the number or thickness of the HIL, or the number or thickness of the organic layers disposed between the substrate 401 and the first EML 414. Alternatively, the emission position L1 of the first EML 414 may be within a range of 1,500 Å to 2,050 Å from an interface of the first electrode 402. Therefore, the emission position L1 of the first EML 414 may be within a range of 1,500 Å to 2,050 Å from the second electrode 404 irrespective of at least one the number of the first organic layers and a thickness of the fourth organic layer. Alternatively, the emission position L1 of the first EML 414 may be within a range of 1,500 Å to 2,050 Å from the interface of the first electrode 402 irrespective of at least one the number of the first organic layers and a thickness of the first organic layer.

The second emission part 420 may include a second HTL 422, a second EML 424, and a second ETL 426. An HIL may be further formed under the second HTL 422. An HBL may be further formed on the second EML 424. An EBL may be further formed under the second EML 424.

The second EML 424 may include a blue emission layer or a blue emission layer that includes an auxiliary emission layer emitting a different color. The blue emission layer may include one among a blue emission layer, a deep blue emission layer, and a sky blue emission layer.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the second EML 424 is provided along with the auxiliary emission layer, the yellow-green emission layer, the red emission layer, or the green emission layer may be disposed on or under the second EML 424. Also, the yellow-green emission layer, the red emission layer, or the green emission layer may be identically or differently provided as the auxiliary emission layer on and under the second EML 424. The positions or number of emission layers may be selectively determined depending on a structure and a characteristic of an organic light emitting device, but the present embodiment is not limited thereto.

When the auxiliary emission layer is provided in the second EML 424, a peak wavelength of an emission area of the second EML 424 may be within a range of 440 nm to 650 nm. Here, the peak wavelength may be an emission area.

A first CGL 440 may be further formed between the first emission part 410 and the second emission part 420. The first CGL 440 may include an N-type CGL and a P-type CGL.

Each of the first EML 414, the first ETL 416, the first CGL 440, the second HTL 422, the HBL, the EBL, and the HTL may be referred to as an organic layer. All organic layers between the second EML 424 and the first EML 414, and the first EML 414 may be referred to as an organic layer. Therefore, all organic layers between the second EML 424 and the first EML 414 may be referred to as a second organic layer.

The emission position L2 of the second EML 424 may be within a range of 2,150 Å to 2,600 Å from the first electrode 402 irrespective of at least one among the number or thickness of the first ETL 416, the number or thickness of the second HTL 422, the number or thickness of the first CGL 440, the number or thickness of the HBL, the number or thickness of the EBL, the number or thickness of the HIL, the number or thickness of the first EML 414, the number or thickness of organic layers between the substrate 401 and the first EML 414, or the number or thickness of organic layers between the first EML 414 and the second EML 424. Alternatively, the emission position L2 of the second EML 424 may be within a range of 2,150 Å to 2,600 Å from an interface of the substrate 401 and the first electrode 402.

Therefore, the emission position L2 of the second EML 424 may be within a range of 2,150 Å to 2,600 Å from the first electrode 402 irrespective of at least one among the number of the first organic layers, a thickness of the first organic layer, the number of the second organic layers, a thickness of the second organic layer, the number of the first EMLs, and a thickness of the first EML. Alternatively, the emission position L2 of the second EML 424 may be within a range of 2,150 Å to 2,600 Å from the interface of the substrate 401 and the first electrode 402 irrespective of at least one among the number of the first organic layers, a thickness of the first organic layer, the number of the second organic layers, a thickness of the second organic layer, the number of the first EMLs, and a thickness of the first EML.

The third emission part 430 may include a third ETL 436, a third EML 434, and a third HTL 432 which are disposed under the second electrode 404.

Although not shown, an EIL may be further formed on the third ETL 436.

An HIL may be further formed under the third HTL 432.

An HBL may be further formed on the third EML 434. The third ETL 436 and the HBL may be provided as one layer or single layer.

An EBL may be further formed under the third EML 434. The third EML 432 and the EBL may be provided as one layer or single layer.

The third EML 434 may include a blue emission layer or a blue emission layer that includes an auxiliary emission layer emitting a different color. The blue emission layer may include one among a blue emission layer, a deep blue emission layer, and a sky blue emission layer.

The auxiliary emission layer may be configured with one among a yellow-green emission layer, a red emission layer, and a green emission layer, or may be configured by a combination thereof. When the auxiliary emission layer is further provided, an emission efficiency of the green emission layer or the red emission layer can be further improved. When the third EML 434 is provided along with the auxiliary emission layer, the yellow-green emission layer, the red emission layer, or the green emission layer may be disposed on or under the third EML 434. Also, the yellow-green emission layer, the red emission layer, or the green emission layer may be identically or differently provided as the auxiliary emission layer on and under the third EML 434. The positions or number of emission layers may be selectively determined depending on a structure and a characteristic of an organic light emitting device, but the present embodiment is not limited thereto.

When the auxiliary emission layer is provided in the third EML 434, a peak wavelength of an emission area of the third EML 434 may be within a range of 440 nm to 650 nm. Here, the peak wavelength may be an emission area.

A second CGL 450 may be further formed between the second emission part 420 and the third emission part 430. The second CGL 450 may include an N-type CGL and a P-type CGL.

Each of the second EML 424, the second ETL 426, the third HTL 432, the second CGL 450, the HIL, the EBL, and the HBL may be referred to as an organic layer. All organic layers between the second EML 424 and the third EML 434, and the second EML 424 may be referred to as an organic layer. Therefore, all organic layers between the second EML 424 and the third EML 434 may be referred to as a third organic layer.

An emission position L3 of the third EML 434 may be within a range of 3,300 Å to 3,850 Å from the first electrode 402 irrespective of at least one among the number or thickness of the second EML 424, the number or thickness of the second ETL 426, the number or thickness of the third HTL 432, the number or thickness of the second CGL 450, the number or thickness of the HIL, the number or thickness of the EBL, the number or thickness of the HBL, the number or thickness of the first EML 414, the number or thickness of organic layers disposed between the substrate 401 and the first EML 414, the number or thickness of organic layers disposed between the first EML 414 and the second EML 424, or the number or thickness of the organic layers disposed between the second EML 424 and the third EML 434. Alternatively, the emission position L3 of the third EML 434 may be within a range of 3,300 Å to 3,850 Å from the interface of the substrate 401 and the first electrode 402.

Therefore, the emission position L3 of the third EML 434 may be within a range of 3,300 Å to 3,850 from the first electrode 402 irrespective of at least one among the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML. Alternatively, the emission position L3 of the third EML 434 may be within a range of 3,300 Å to 3,850 from the interface of the substrate 401 and the first electrode 402 irrespective of at least one among the number of the fourth organic layers, a thickness of the number of the first organic layers, a thickness of the first organic layer, the number of the second organic layers, a thickness of the second organic layer, the number of the third organic layers, a thickness of the third organic layer, the number of the first EMLs, a thickness of the first EML, the number of the second EMLs, and a thickness of the second EML.

Moreover, the third HTL 434, the third ETL 436, the HBL, and the EIL may be referred to as an organic layer. Therefore, all layers between the third EML 434 and the second electrode 404 may be referred to as an organic layer. All layers between the third EML 434 and the second electrode 404 may be referred to as a first organic layer.

A position L0 of the second electrode 404 may be within a range of 3,500 Å to 4,500 Å from the first electrode 402 irrespective of at least one among the number or thickness of the third ETL 436, the number or thickness of the EIL, the number or thickness of the HBL, the number or thickness of the third EML 434, the number or thickness of the second EML 424, the number or thickness of the first EML 414, the number or thickness of organic layers between the substrate 401 and the first EML 414, the number or thickness of organic layers between the first EML 414 and the second EML 424, and the number or thickness of organic layers between the third EML 434 and the second electrode 404. Alternatively, the position L0 of the second electrode 404 may be within a range of 3,500 Å to 4,500 Å from the interface of the substrate 401 and the first electrode 402.

Therefore, the position L0 of the second electrode 404 may be within a range of 3,500 Å to 4,500 Å from the first electrode 402 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML. Alternatively, the position L0 of the second electrode 404 may be within a range of 3,500 Å to 4,500 Å from the interface of the substrate 401 and the first electrode 402 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML.

Here, the emission position L3 of the third EML 434 may be within a range of 4,500 Å to 5,100 Å from the first electrode 402. Also, the position L0 of the second electrode 404 is within a range of 4,500 Å to 6,000 Å from the first electrode 402. Also, when the emission position L3 of the third EML 434 is set to 5,000 Å from the first electrode 402, the position L0 of the second electrode 404 is within a range of 4,550 Å to 6,000 Å from the first electrode 402. Also, when the emission position L3 of the third EML 434 is set to 5,100 Å from the first electrode 402, the position L0 of the second electrode 404 is within a range of 5,150 Å to 6,000 Å from the first electrode 402.

Therefore, the present invention may set the position of the second electrode 404 and positions of emission layers from the first electrode 402 irrespective of at least one among the number of the first organic layers, a thickness of the first organic layer, the number of the second organic layers, a thickness of the second organic layer, the number of the third organic layers, a thickness of the third organic layer, the number of the fourth organic layers, a thickness of the fourth organic layer, the number of the first EMLs, a thickness of the first EML, the number of the second organic layers, a thickness of the second organic layer, the number of the third EMLs, and a thickness of the third EML.

The structure illustrated in FIG. 38 is an example of the present invention, and may be selectively changed depending on a structure or a characteristic of an organic light emitting device. However, the present embodiment is not limited thereto.

Figure 39:
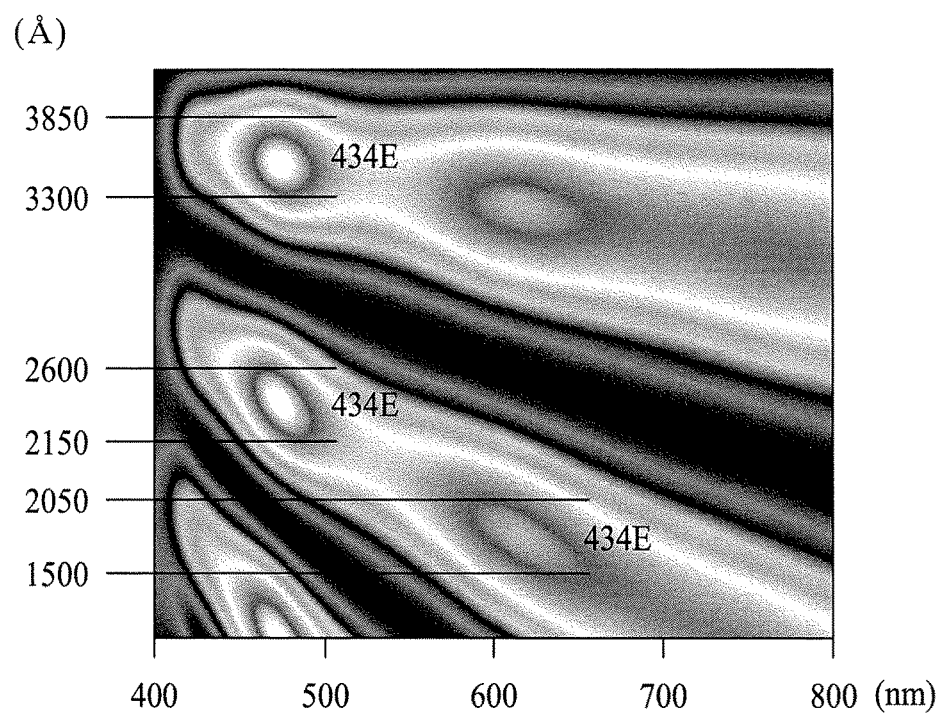
FIG. 39 is a diagram illustrating an emission position of an organic light emitting device according to the eleventh embodiment of the present invention.

FIG. 39 is a diagram illustrating an emission position of an organic light emitting device according to the eleventh embodiment of the present invention.

In FIG. 39, the abscissa axis indicates a wavelength range of light, and the ordinate axis indicates emission positions of emission layers configuring the emission part from the first electrode 402 and may be referred to as a contour map. Here, when the EPEL structure according to an embodiment of the present invention is applied except the second electrode 404, FIG. 39 shows the emission positions of the emission layers at an emission peak. Also, FIG. 39 shows emission positions of emission layers having a maximum emission range in emission areas of the emission layers.

Since the first EML 414 configuring the first emission part 410 is the blue emission layer, a peak wavelength range of the emission area of the first EML 414 may be 510 nm to 580 nm. When light is emitted at 510 nm to 580 nm that is an emission area of the blue emission layer, maximum efficiency is obtained in a white color area of the contour map.

Therefore, an emission position of the first EML 414 is within a range of 1,500 Å to 2,050 Å, and thus, an emission peak 414E is located at 510 nm to 580 nm. Thus, the first EML 414 emits light at 510 nm to 580 nm, thereby obtaining maximum efficiency.

Moreover, the first EML 414 of the first emission part 410 may be configured with two layers (for example, a red emission layer and a green emission layer) depending on a characteristic or a structure of a device. A peak wavelength range of an emission area of the red emission layer may be a range of 600 nm to 650 nm. A peak wavelength range of an emission area of the green emission layer may be a range of 510 nm to 560 nm. In this case, therefore, when light is emitted at 510 nm to 650 nm that is the emission area of the first EML 414, maximum efficiency is obtained in the white color area of the contour map.

Moreover, the first EML 414 of the first emission part 410 may be configured with two layers (for example, a red emission layer and a yellow-green emission layer) depending on a characteristic or a structure of an organic light emitting device. A peak wavelength range of an emission area of the red emission layer may be a range of 600 nm to 650 nm. A peak wavelength range of an emission area of the yellow-green emission layer may be a range of 510 nm to 580 nm. In this case, therefore, when light is emitted at 510 nm to 650 nm that is the emission area of the first EML 414, maximum efficiency is obtained in the white color area of the contour map.

Moreover, the first EML 414 of the first emission part 410 may be configured with two layers (for example, a yellow emission layer and a red emission layer) depending on a characteristic or a structure of a device. A peak wavelength range of an emission area of the yellow emission layer may be a range of 540 nm to 580 nm. A peak wavelength range of an emission area of the red emission layer may be a range of 600 nm to 650 nm. In this case, therefore, when light is emitted at 540 nm to 650 nm that is the emission area of the first EML 414, maximum efficiency is obtained in the white color area of the contour map.

Therefore, when the first EML 414 is configured with one among the yellow-green emission layer, the yellow emission layer and the red emission layer, the red emission layer and the green emission layer, and the yellow-green emission layer and the red emission layer, or is configured by a combination thereof, a peak wavelength range of the emission area of the first EML 414 may be 510 nm to 650 nm. In this case, when light is emitted at 510 nm to 650 nm that is the emission area of the first EML 414, maximum efficiency is obtained in the white color area of the contour map.

In FIG. 39, for example, an emission position is shown in a case where the first EML 414 is the yellow-green emission layer without adding an auxiliary emission layer into the first EML 414. Therefore, a peak wavelength range of an emission area of the first EML 414 realizes maximum efficiency at 510 nm to 580 nm.

Since the second EML 424 configuring the second emission part 420 is the blue emission layer, a peak wavelength range of the emission area of the second EML 424 may be a range of 440 nm to 480 nm. When light is emitted at 440 nm to 480 nm that is an emission area of the blue emission layer, maximum efficiency is obtained in the white color area of the contour map.

Therefore, an emission position of the second EML 424 is within a range of 2,150 Å to 2,600 Å, and thus, an emission peak 424E of the second EML 424 is located at 440 nm to 480 nm. Thus, the second EML 424 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the second EML 424 configuring the second emission part 420, a peak wavelength range of the emission area of the second EML 424 may be a range of 440 nm to 650 nm. Therefore, when light is emitted at 440 nm to 650 nm that is an emission area of the second EML 424, maximum efficiency is obtained in the white color area of the contour map.

In FIG. 39, for example, an emission position is shown in a case where the second EML 424 is the blue emission layer without adding an auxiliary emission layer into the second EML 424. Therefore, a peak wavelength range of an emission area of the second EML 424 realizes maximum efficiency at 440 nm to 480 nm.

Since the third EML 434 configuring the third emission part 430 is the blue emission layer, a peak wavelength range of the emission area of the third EML 434 may be a range of 440 nm to 480 nm. When light is emitted at 440 nm to 480 nm that is an emission area of the blue emission layer, maximum efficiency is obtained in a white color area of a contour map.

Therefore, an emission position of the third EML 434 is within a range of 3,300 Å to 3,850 Å, and thus, an emission peak 434E of the third EML 434 is located at 440 nm to 480 nm. Thus, the third EML 434 emits light at 440 nm to 480 nm, thereby obtaining maximum efficiency.

The blue emission layer may include one among a blue emission layer, a deep blue emission layer, and a sky blue emission layer.

Moreover, when a yellow-green emission layer, a red emission layer, or a green emission layer is provided as an auxiliary emission layer in the third EML 434 configuring the third emission part 430, a peak wavelength range of the emission area of the third EML 434 may be a range of 440 nm to 650 nm. Therefore, when light is emitted at 440 nm to 650 nm that is an emission area of the third EML 434, maximum efficiency is obtained in the white color area of the contour map.

In FIG. 39, for example, an emission position is shown in a case where the third EML 434 is the blue emission layer without adding an auxiliary emission layer into the third EML 434. Therefore, a peak wavelength range of an emission area of the third EML 434 realizes maximum efficiency at 440 nm to 480 nm.

As described above, a position of an emission peak is changed depending on an emission position of an emission layer. Therefore, the present invention sets an emission position of an emission layer configuring an emission part, and thus applies the EPEL structure where the emission peak of the emission layer has a maximum emission range in a desired emission area.

Therefore, by applying the EPEL structure to an emission layer, an emission peak is located at a specific wavelength, and thus, emission layers have maximum efficiency in light corresponding to the specific wavelength.

An emission range, which enables the emission layers to have maximum efficiency in an emission area that is the specific wavelength, may be referred to as a maximum emission range. Therefore, a maximum emission range of the first EML may be 530 nm to 570 nm, a maximum emission range of the second EML may be 440 nm to 470 nm, and a maximum emission range of the third EML may be 440 nm to 470 nm.

When light is emitted at 440 nm to 470 nm that is a maximum emission range of the blue emission layer and at 530 nm to 570 nm that is a maximum emission range of the yellow-green emission layer, maximum efficiency is obtained in the white color area of the contour map. It can be seen that an emission position of an emission layer according to an embodiment of the present invention is set to correspond to the emission area, and thus, maximum efficiency is obtained. Also, it can be seen that the EPEL structure according to an embodiment of the present invention is provided in order for the first to third EMLs to have a maximum emission range irrespective of the specific number of layers within at least one among the first organic layers, the second organic layers, the third organic layers, and the fourth organic layers, or the specific thickness of at least one among the first organic layer, the second organic layer, the third organic layer, and the fourth organic layer, or the specific number of layers within at least one among the first EMLs, the second EMLs, and the third EMLs, or the specific thickness of at least one among the first EML, the second EML, and the third EML.

Figure 40:
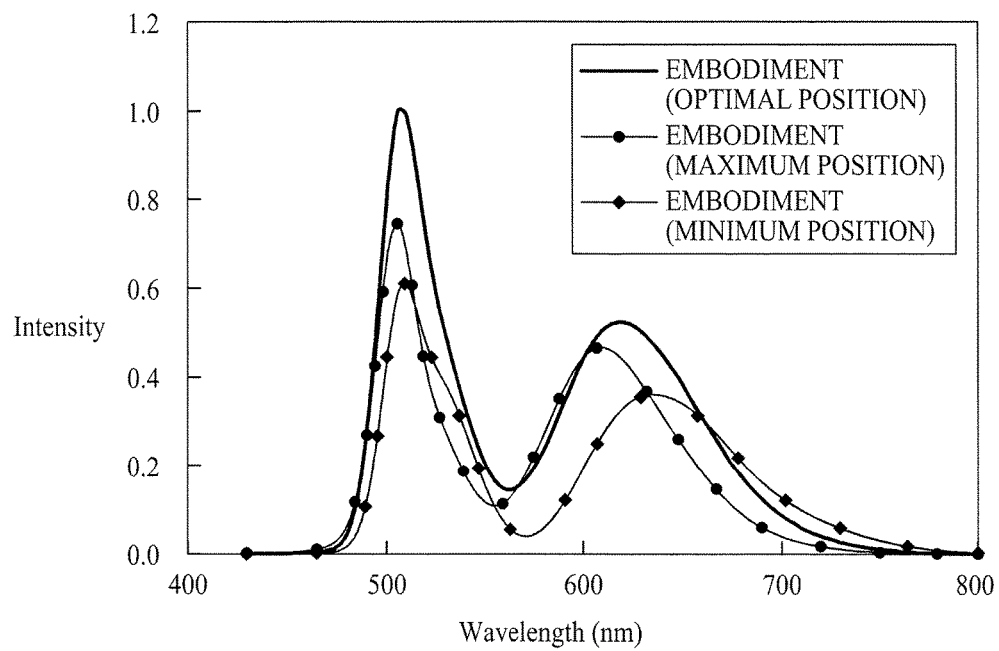
FIG. 40 is a diagram illustrating an EL spectrum according to the eleventh embodiment of the present invention.

FIG. 40 is a diagram illustrating an EL spectrum according to the eleventh embodiment of the present invention.

In FIG. 40, the abscissa axis indicates a wavelength range of light, and the ordinate axis indicates emission intensity. The emission intensity is a numerical value that is expressed as a relative value with respect to a maximum value of an EL spectrum.

In FIG. 40, a minimum position according to an embodiment is a portion which is set as a minimum position when emission positions of emission layers are set. For example, when the emission position L1 of the first EML 414 is within a range of 1,500 Å to 2,050 Å from the first electrode 402, the minimum position is set to 1,500 Å.

A maximum position according to an embodiment is a portion which is set as a maximum position when emission positions of emission layers are set. For example, when the emission position L1 of the first EML 414 is within a range of 1,500 Å to 2,050 Å from the first electrode 402, the maximum position is set to 2,050 Å.

An optimal position according to an embodiment is a portion which is set as an emission position according to the eleventh embodiment of the present invention. For example, when the emission position L1 of the first EML 414 is within a range of 1,500 Å to 2,050 Å from the first electrode 402, an emission position according to an embodiment is within a range of 1,500 Å to 2,050 Å.

As shown in FIG. 40, a comparison result which is obtained by comparing an optimal position and a case which is out of a minimum position of an emission position in the EPEL structure according to an embodiment of the present invention is as follows. It can be seen that emission intensity is reduced at 440 nm to 480 nm that is a peak wavelength range of blue light, and is out of a peak wavelength range of the blue light. Also, it can be seen that emission intensity is reduced at 510 nm to 580 nm that is a peak wavelength range of yellow-green light, and is out of the peak wavelength range of the yellow-green light. Also, it can be seen that emission intensity is considerably reduced at 600 nm to 650 nm that is a peak wavelength range of red light.

Moreover, a comparison result which is obtained by comparing an optimal position and a case which is out of a maximum position of an emission position in the EPEL structure according to an embodiment of the present invention is as follows. It can be seen that emission intensity is reduced at 440 nm to 480 nm that is the peak wavelength range of the blue light. Also, it can be seen that emission intensity is considerably reduced at 510 nm to 580 nm that is the peak wavelength range of the yellow-green light.

Therefore, it can be seen that emission intensity more increases in the peak wavelength range of the blue light in a case, where an emission position is set as the optimal position according to an embodiment, than a case where the emission position is set as the minimum position or the maximum position according to an embodiment. Also, it can be seen that emission intensity more increases in the peak wavelength range of the yellow-green light in the case, where the emission position is set as the optimal position according to an embodiment, than the case where the emission position is set as the minimum position or the maximum position according to an embodiment. Also, it can be seen that emission intensity more increases in the peak wavelength range of the red light in the case, where the emission position is set as the optimal position according to an embodiment, than the case where the emission position is set as the minimum position or the maximum position according to an embodiment.

An efficiency of a white organic light emitting device, where the EPEL structure according to an embodiment of the present invention is applied, is as shown in the following Table 21. When it is assumed that efficiency of a comparative example is 100%, the following Table 21 shows efficiency of the eleventh embodiment of the present invention.

The following Table 21 shows a result that is obtained by comparing an efficiency of the comparative example and an efficiency of an embodiment. In the following Table 21, the comparative example relates to the bottom emission type white light emitting device including the first to third emission parts, the first emission part being configured with the blue emission layer, the second emission part being configured with the yellow-green emission layer, and the third emission part being configured with the blue emission layer. Also, an embodiment relates to a top emission type white light emitting device when an optimal position of the EPEL structure according to an embodiment of the present invention is applied.

TABLE 21

| Division | Red (R) Efficiency | Green (G) Efficiency | Blue (B) Efficiency | White (W) Efficiency | Average |
|---|---|---|---|---|---|
| Comparative Example | 100% | 100% | 100% | 100% | 100% |
| Embodiment (Optimal Position) | 122% | 86% | 89% | 95% | 95% |

As shown in Table 21, in comparison with the comparative example, when it is assumed that efficiency of the comparative example is 100% in a case where the EPEL structure is applied, it can be seen that red efficiency increases by about 22%, and green, blue, and white efficiencies are almost similar to the comparative example.

A panel efficiency of a white light emitting device having the EPEL structure and a panel efficiency of a comparative example are as listed in the following Table 22.

When it is assumed that an efficiency of an optimal position according to an embodiment is 100%, the following Table 22 shows an efficiency of an embodiment (a minimum position) and an efficiency of an embodiment (a maximum position).

Panel efficiency has been measured when a driving current density is 10 mA/cm2. Also, when a panel efficiency of an embodiment is 100%, a panel efficiency of the embodiment (the minimum position) and a panel efficiency of the embodiment (the maximum position) have been measured.

TABLE 22

| Division | Red (R) Efficiency | Green (G) Efficiency | Blue (B) Efficiency | White (W) Efficiency | Average |
|---|---|---|---|---|---|
| Embodiment (Minimum Position) | 104% | 50% | 67% | 65% | 71% |
| Embodiment (Optimal Position) | 100% | 100% | 100% | 100% | 100% |
| Embodiment (Maximum Position) | 60% | 96% | 67% | 84% | 77% |

As shown in Table 22, it can be seen that efficiencies of red, green, blue, and white are all reduced in a boundary between the embodiment (the minimum position) and the embodiment (the maximum position). Also, it can be seen that efficiencies of red, green, blue, and white are more reduced in the embodiment (the minimum position) than the embodiment (the maximum position).

Accordingly, when an emission position of the EPEL structure is out of an optimal position, it can be seen that panel efficiency is reduced.

As described above in the eleventh embodiment of the present invention, the organic light emitting device may be a bottom emission type organic light emitting device.

A position of the second electrode may be within a range of 3,500 Å to 4,500 Å from the first electrode.

An emission position of the first EML may be within a range of 1,500 Å to 2,050 Å from the first electrode.

An emission position of the second EML may be within a range of 2,150 Å to 2,600 Å from the first electrode.

An emission position of the third EML may be within a range of 3,300 Å to 3,850 Å from the first electrode.

The first EML may be configured with one among a yellow-green emission layer, a yellow emission layer and a red emission layer, a red emission layer and a green emission layer, and a yellow-green emission layer and a red emission layer, or may be configured by a combination thereof.

Each of the second EML and the third EML may be configured with one among a blue emission layer, a blue emission layer and a yellow-green emission layer, a blue emission layer and a red emission layer, and a blue emission layer and a green emission layer, or may be configured by a combination thereof.

An emission area of the first EML may be a range of 510 nm to 650 nm, an emission area of the second EML may be a range of 440 nm to 650 nm, and an emission area of the third EML may be a range of 440 nm to 650 nm.

A maximum emission range of the first EML may be a range of 530 nm to 570 nm, a maximum emission range of the second EML may be a range of 440 nm to 470 nm, and a maximum emission range of the third EML may be a range of 440 nm to 470 nm.

As described above, when the EPEL structure according to an embodiment of the present invention is applied, it can be seen that an emission intensity of an emission layer increases. Also, it can be seen that since emission intensity increases, panel efficiency is enhanced.

Figure 41:
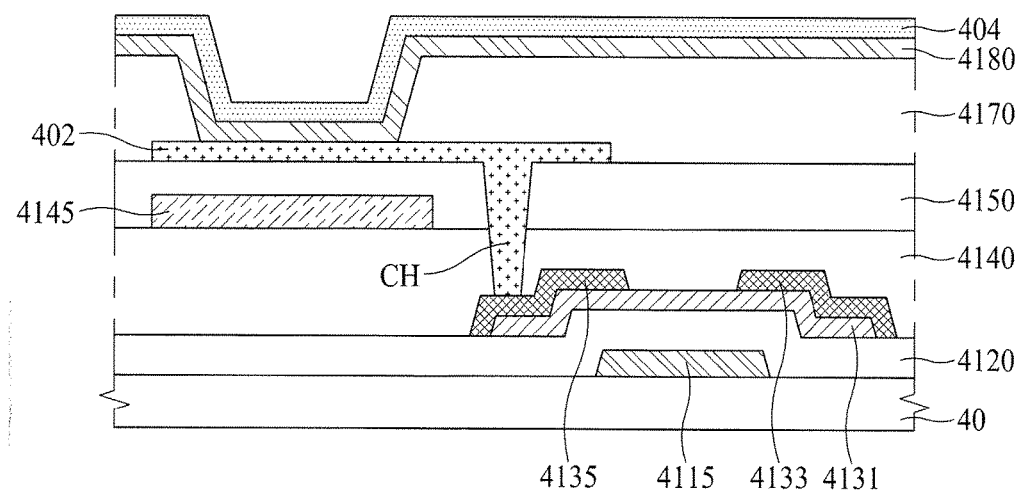
FIG. 41 is a diagram illustrating an organic light emitting device according to the tenth and eleventh embodiments of the present invention.

FIG. 41 is a cross-sectional view illustrating an organic light emitting device 4000 according to an embodiment of the present invention, and uses the above-described organic light emitting device according to the tenth and eleventh embodiments of the present invention. In describing the present embodiment, descriptions on elements which are the same as or correspond to the elements according to the preceding embodiment are not repeated.

As illustrated in FIG. 41, the organic light emitting device 4000 according to an embodiment of the present invention includes a substrate 40, a thin film transistor TFT, an overcoating layer 4150, a first electrode 402, an emission part 4180, and a second electrode 404. The TFT includes a gate electrode 4115, a gate insulator 4120, a semiconductor layer 4131, a source electrode 4133, and a drain electrode 4135.

In FIG. 41, the thin film transistor TFT is illustrated as having an inverted staggered structure, but may be formed in a coplanar structure.

The substrate 40 may be formed of glass, metal, or plastic.

The gate electrode 4115 may be formed on the substrate 40. The gate insulator 4120 may be formed on the gate electrode 4115.

The semiconductor layer 4131 may be formed on the gate insulator 4120.

The source electrode 4133 and the drain electrode 4135 may be formed on the semiconductor layer 4131.

A passivation layer 4140 may be formed on the source electrode 4133 and the drain electrode 4135.

A color filter 4145 may be formed on the passivation layer 4140.

The overcoating layer 4150 may be formed on the color filter 4145.

The first electrode 402 may be formed on the overcoating layer 4150. The first electrode 402 may be electrically connected to the drain electrode 4135 through a contact hole CH which is formed in a certain area of the passivation layer 4140 and the overcoating layer 4150. In FIG. 41, the drain electrode 4135 is illustrated as being electrically connected to the first electrode 402, but the present embodiment is not limited thereto. As another example, the source electrode 4133 may be electrically connected to the first electrode 402 through the contact hole CH which is formed in the certain area of the passivation layer 4140 and the overcoating layer 4150.

A bank layer 4170 may be formed on the first electrode 402 and may define a pixel area.

The emission part 4180 may be formed on the bank layer 4170. As illustrated in the tenth and eleventh embodiments of the present invention, the emission part 4180 may include a first emission part 410, a second emission part 420, and a third emission part 430 which are formed on the first electrode 402.

The second electrode 404 may be the emission part 4180.

Although not shown in FIG. 41, an encapsulation part may be formed on the second electrode 404. The encapsulation part prevents moisture from penetrating into the emission part 4180. Also, an encapsulation substrate may be formed of glass, plastic, or metal.

According to the embodiments of the present invention, an emission efficiency of an emission layer is enhanced by applying the EPEL structure where an emission position of the emission layer corresponding to an emission area of the emission layer is set.

Moreover, according to the embodiments of the present invention, an emission intensity of an emission layer increases, and thus, panel efficiency and a lifetime of a device are enhanced.

Moreover, according to the embodiments of the present invention, an organic light emitting device suitable for a structure or a characteristic of a device is manufactured by applying the EPEL structure irrespective of at least one among the number of organic layers, thicknesses of the organic layers, the number of emission layers, and thicknesses of the emission layers, and thus, device efficiency is optimized.

Moreover, according to the embodiments of the present invention, since a polarizer may not be used, provided is an organic light emitting display device in which an aperture ratio and luminance are enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A white organic light emitting device, comprising:
a first emission part between a first electrode and a second electrode, and configured to include a first emission layer, the first electrode being formed of a transparent conductive material;
a second emission part on the first emission part, and configured to include a second emission layer; and
a third emission part on the second emission part, and configured to include a third emission layer,
wherein two emission layers among the first emission layer, the second emission layer and the third emission layer include one among:
a blue emission layer,
a blue emission layer and a yellow-green emission layer,
a blue emission layer and a red emission layer, and
a blue emission layer and a green emission layer, and
wherein a remaining one emission layer among the first emission layer, the second emission layer, and the third emission layer includes one among:
a yellow-green emission layer,
a yellow emission layer and a red emission layer,
a red emission layer and a green emission layer, and
a yellow-green emission layer and a red emission layer.
2. The white organic light emitting device of claim 1, wherein the first electrode is located within a range of 4,500 Å to 6,000 Å from the second electrode.
3. The white organic light emitting device of claim 1, wherein the third emission layer is located within a range of 200 Å to 800 Å from the second electrode.
4. The white organic light emitting device of claim 1, wherein the second emission layer is located within a range of 1,800 Å to 2,550 Å from the second electrode.
5. The white organic light emitting device of claim 1, wherein the first emission layer is located within a range of 2,650 Å to 3,300 Å from the second electrode.
6. The white organic light emitting device of claim 1, wherein the first emission layer is configured with one among:
the blue emission layer,
the blue emission layer and the yellow-green emission layer,
the blue emission layer and the red emission layer, and
the blue emission layer and the green emission layer, and
is configured by a combination thereof.
7. The white organic light emitting device of claim 1, wherein the second emission layer is configured with one among:
the yellow-green emission layer,
the yellow emission layer and the red emission layer,
the red emission layer and the green emission layer, and the yellow-green emission layer and the red emission layer, and is configured by a combination thereof.

8. The white organic light emitting device of claim 1, wherein the third emission layer is configured with one among:

the blue emission layer, the blue emission layer and the yellow-green emission layer, the blue emission layer and the red emission layer, and the blue emission layer and the green emission layer, and is configured by a combination thereof.

9. The white organic light emitting device of claim 1, wherein, a peak wavelength of an emission area of the first emission layer is in a range of 440 nm to 650 nm, a peak wavelength of an emission area of the second emission layer is in a range of 510 nm to 650 nm, and a peak wavelength of an emission area of the third emission layer is in a range of 440 nm to 650 nm.

10. The white organic light emitting device of claim 1, wherein, a maximum emission range of the first emission layer is 440 nm to 470 nm, a maximum emission range of the second emission layer is 530 nm to 570 nm, and a maximum emission range of the third emission layer is 440 nm to 470 nm.

11. The white organic light emitting device of claim 1, wherein the first emission layer, the second emission layer, and the third emission layer have a maximum emission range irrespective of a specific thickness of at least one of the first emission layer, the second emission layer, and the third emission layer, or irrespective of a specific number of layers within at least one of the first emission layer, the second emission layer, and the third emission layer.

12. The white organic light emitting device of claim 1, further comprising:

a first organic layer between the first electrode and the first emission layer;

a second organic layer between the first emission layer and the second emission layer;

a third organic layer between the second emission layer and the third emission layer; and a fourth organic layer between the third emission layer and the second electrode.

13. The white organic light emitting device of claim 12, wherein the first emission layer, the second emission layer, and the third emission layer have a maximum emission range irrespective of a specific thickness of at least one of the first organic layer, the second organic layer, the third organic layer, and the fourth organic layer, or irrespective of a specific number of layers within at least one of the first organic layer, the second organic layer, the third organic layer, and the fourth organic layer.

14. A white organic light emitting device, comprising:

a first emission part between a first electrode and a second electrode, and configured to include a first emission layer, the first electrode being formed of a transparent conductive material;

a second emission part on the first emission part, and configured to include a second emission layer; and a third emission part on the second emission part, and configured to include a third emission layer, wherein two emission layers among the first emission layer, the second emission layer and the third emission layer include one among:

a blue emission layer, a blue emission layer and a yellow-green emission layer, a blue emission layer and a red emission layer, and a blue emission layer and a green emission layer, wherein a remaining one emission layer among the first emission layer, the second emission layer, and the third emission layer includes one among:

a yellow-green emission layer, a yellow emission layer and a red emission layer, a red emission layer and a green emission layer, and a yellow-green emission layer and a red emission layer, and wherein the second emission layer and the third emission layer include emission layers that emit light having a same color.

15. The white organic light emitting device of claim 14, wherein the first electrode is located within a range of 3,500 Å to 4,500 Å from the second electrode.

16. The white organic light emitting device of claim 14, wherein the third emission layer is located within a range of 250 Å to 800 Å from the second electrode.

17. The white organic light emitting device of claim 14, wherein the second emission layer is located within a range of 1,450 Å to 1,950 Å from the second electrode.

18. The white organic light emitting device of claim 14, wherein the first emission layer is located within a range of 2,050 Å to 2,600 Å from the second electrode.

19. The white organic light emitting device of claim 14, wherein the first emission layer is configured with one among:

the yellow-green emission layer, the yellow emission layer and the red emission layer, the red emission layer and the green emission layer, and the yellow-green emission layer and the red emission layer, and is configured by a combination thereof.

20. The white organic light emitting device of claim 14, wherein each of the second emission layer and the third emission layer is configured with one among:

the blue emission layer, the blue emission layer and the yellow-green emission layer, the blue emission layer and the red emission layer, and the blue emission layer and the green emission layer, and is configured by a combination thereof.

21. The white organic light emitting device of claim 14, wherein, a peak wavelength of an emission area of the first emission layer is in a range of 510 nm to 650 nm, a peak wavelength of an emission area of the second emission layer is in a range of 440 nm to 650 nm, and a peak wavelength of an emission area of the third emission layer is in a range of 440 nm to 650 nm.

22. The white organic light emitting device of claim 14, wherein, a maximum emission range of the first emission layer is 530 nm to 570 nm, a maximum emission range of the second emission layer is 440 nm to 470 nm, and a maximum emission range of the third emission layer is 440 nm to 470 nm.

23. The white organic light emitting device of claim 14, wherein the first emission layer, the second emission layer, and the third emission layer have a maximum emission range irrespective of a specific thickness of at least one of the first emission layer, the second emission layer, and the third emission layer, or irrespective of a specific number of layers within at least one of the first emission layer, the second emission layer, and the third emission layer.

24. The white organic light emitting device of claim 14, further comprising:
   a first organic layer between the first electrode and the first emission layer;
   a second organic layer between the first emission layer and the second emission layer;
   a third organic layer between the second emission layer and the third emission layer; and
   a fourth organic layer between the third emission layer and the second electrode.

25. The white organic light emitting device of claim 24, wherein the first emission layer, the second emission layer, and the third emission layer have a maximum emission range irrespective of a specific thickness of at least one of the first organic layer, the second organic layer, the third organic layer, and the fourth organic layer, or irrespective of a specific number of layers within at least one of the first organic layer, the second organic layer, the third organic layer, and the fourth organic layer.

* * * * *